US012804904B2

(12) United States Patent
Funayama et al.

(10) Patent No.: US 12,804,904 B2
(45) Date of Patent: Nov. 17, 2026

(54) THREE-DIMENSIONAL MEMORY DEVICE INCLUDING CRACK-RESISTANT BACKSIDE PASSIVATION STRUCTURE AND METHODS OF FORMING THE SAME

(71) Applicant: WESTERN DIGITAL TECHNOLOGIES, INC., San Jose, CA (US)

(72) Inventors: Kota Funayama, Yokkaichi (JP); Masayuki Hiroi, Yokkaichi (JP)

(73) Assignee: Sandisk Technologies, Inc., Milpitas, CA (US)

(*) Notice: Subject to any disclaimer, the term of this patent is extended or adjusted under 35 U.S.C. 154(b) by 303 days.

(21) Appl. No.: 18/516,170

(22) Filed: Nov. 21, 2023

(65) Prior Publication Data

US 2025/0169070 A1 May 22, 2025

(51) Int. Cl.

| | |
|---|---|
| ***H10B 43/27*** | (2023.01) |
| ***H10B 80/00*** | (2023.01) |
| ***H10W 74/10*** | (2026.01) |
| ***H10W 90/00*** | (2026.01) |
| *H10W 80/00* | (2026.01) |

(52) U.S. Cl.

CPC ............. *H10B 43/27* (2023.02); *H10B 80/00* (2023.02); *H10W 74/137* (2026.01); *H10W 74/147* (2026.01); *H10W 90/00* (2026.01); *H10W 80/211* (2026.01); *H10W 80/312* (2026.01); *H10W 80/327* (2026.01); *H10W 90/792* (2026.01)

(58) Field of Classification Search

None

See application file for complete search history.

(56) References Cited

U.S. PATENT DOCUMENTS

| | | | |
|---|---|---|---|
| 10,453,798 | B2 | 10/2019 | Tsutsumi et al. |
| 10,453,854 | B2 | 10/2019 | Kanno et al. |
| 10,461,163 | B2 | 10/2019 | Kanakamedala et al. |

(Continued)

OTHER PUBLICATIONS

Funayama, K. et al., "Three-Dimensional Memory Device Including Crack-Resistant Backside Passivation Structure and Methods of Forming the Same," U.S. Appl. No. 18/516,064, filed Nov. 21, 2023.

(Continued)

*Primary Examiner* — Hung K Vu

(74) *Attorney, Agent, or Firm* — THE MARBURY LAW GROUP PLLC

(57) ABSTRACT

A three-dimensional memory device includes an alternating stack of insulating layers and electrically conductive layers, a three-dimensional array of memory elements embedded in the alternating stack, a dielectric material portion located adjacent to the alternating stack, connection via structures vertically extending through the dielectric material portion, a backside connection pad cavity vertically extending through the source layer, a backside isolation layer, and a backside connection pad structure including a proximal portion contacting end surfaces of the connection via structures. The backside connection pad structure includes a tapered connecting portion overlying a stepped connecting portion of the backside isolation layer, or dummy regions which do not contact the end surfaces of the connection via structures.

14 Claims, 67 Drawing Sheets

(56) References Cited

U.S. PATENT DOCUMENTS

| | | | | |
|---|---|---|---|---|
| 10,580,783 | B2 | 3/2020 | Cui et al. | |
| 10,608,010 | B2 | 3/2020 | Terasawa et al. | |
| 10,700,089 | B1 | 6/2020 | Hojo et al. | |
| 10,930,605 | B2 | 2/2021 | Huang et al. | |
| 11,778,818 | B2 | 10/2023 | Mochizuki et al. | |
| 2017/0373078 | A1* | 12/2017 | Chu | H10B 43/35 |
| 2017/0373087 | A1* | 12/2017 | Ito | H10B 43/10 |
| 2019/0096808 | A1 | 3/2019 | Tsutsumi et al. | |
| 2019/0148392 | A1 | 5/2019 | Kanno et al. | |
| 2019/0148506 | A1 | 5/2019 | Kanakamedala et al. | |
| 2019/0273088 | A1 | 9/2019 | Cui et al. | |
| 2019/0280001 | A1 | 9/2019 | Terasawa et al. | |
| 2021/0035965 | A1 | 2/2021 | Mizutani et al. | |
| 2021/0066274 | A1 | 3/2021 | Chen et al. | |
| 2022/0028879 | A1 | 1/2022 | Mochizuki et al. | |
| 2022/0059481 | A1 | 2/2022 | Shibata | |
| 2022/0415907 | A1 | 12/2022 | Watanabe | |
| 2023/0064713 | A1 | 3/2023 | Shimomura | |
| 2023/0069307 | A1 | 3/2023 | Shimomura | |
| 2023/0157013 | A1 | 5/2023 | Rajashekhar et al. | |
| 2023/0275026 | A1 | 8/2023 | Matsuno et al. | |
| 2023/0276625 | A1 | 8/2023 | Watanabe et al. | |
| 2023/0361069 | A1* | 11/2023 | Ishikawa | H10W 72/019 |
| 2024/0096821 | A1 | 3/2024 | Sasaki | |
| 2024/0387374 | A1 | 11/2024 | Noguchi et al. | |

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 17/662,926, filed May 11, 2022, SanDisk Technologies LLC.

U.S. Appl. No. 17/857,335, filed Jul. 5, 2022, SanDisk Technologies LLC.

U.S. Appl. No. 17/857,375, filed Jul. 5, 2022, SanDisk Technologies LLC.

U.S. Appl. No. 18/229,489, filed Aug. 2, 2023, Western Digital Technologies, Inc.

U.S. Appl. No. 18/233,697, filed Aug. 14, 2023, Western Digital Technologies, Inc.

U.S. Appl. No. 18/484,156, filed Oct. 10, 2023, SanDisk Technologies LLC.

ISR-WO—Notification of Transmittal of the International Search Report and Written Opinion of the International Searching Authority for International Patent Application No. PCT/US2024/030572, mailed Oct. 1, 2024, 15 pages.

USPTO Office Communication, Notice of Allowance and Fee(s) Due for U.S. Appl. No. 18/516,064, mailed Feb. 10, 2026, 21 pages.

IPRP-WO—Notification Concerning Transmittal of Copy of International Preliminary Report on Patentability and Written Opinion of the International Searching Authority for International Patent Application No. PCT/US2024/030572, mailed. Jun. 4, 2026, 8 pages.

* cited by examiner

THREE-DIMENSIONAL MEMORY DEVICE INCLUDING CRACK-RESISTANT BACKSIDE PASSIVATION STRUCTURE AND METHODS OF FORMING THE SAME

FIELD

The present disclosure relates generally to the field of semiconductor devices, and particularly to a three-dimensional memory device including a crack-resistant backside passivation structure and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers located over a first side of a source layer; a three-dimensional array of memory elements embedded in the alternating stack; a dielectric material portion located over the first side of the source layer adjacent to the alternating stack; connection via structures vertically extending through the dielectric material portion; a backside connection pad cavity vertically extending through the source layer; a backside isolation layer comprising a first horizontally-extending portion located within the backside connection pad cavity and comprising a first inner sidewall having a first proximal edge that is in contact with a horizontal surface of the dielectric material portion and having a first distal edge that is spaced from the dielectric material portion by a vertical thickness of the first horizontally-extending portion, a second horizontally-extending portion that is located over a second side of the source layer, and a connecting portion that connects the first horizontally-extending portion and the second horizontally-extending portion and comprises a second inner sidewall having a second distal edge that is adjoined to a distal horizontal surface of the second horizontally-extending portion; and a backside connection pad structure comprising a proximal portion contacting end surfaces of the connection via structures, a distal portion located over the second horizontally-extending portion of the backside isolation layer, and a connecting portion that connects the proximal portion and the distal portion, wherein a lateral distance between an inner sidewall and an outer sidewall of the connecting portion of the backside connection pad structure within a first horizontal plane containing the second distal edge is greater than a lateral distance between the first distal edge and the second distal edge of the backside isolation layer.

According to another aspect of the present disclosure, a method of forming a device structure comprises: forming a combination of a three-dimensional memory array and a dielectric material portion over a first side of a source layer that overlies a carrier substrate, wherein the three-dimensional memory array comprises a three-dimensional array of memory elements embedded in an alternating stack of insulating layers and electrically conductive layers, and the dielectric material portion is located adjacent to the alternating stack; forming connection via structures through the dielectric material portion; removing the carrier substrate; forming a backside connection pad cavity through at least the source layer after removing the carrier substrate; depositing and patterning a backside isolation layer, wherein the backside isolation layer comprises a first horizontally-extending portion located within the backside connection pad cavity and comprising a first inner sidewall having a first proximal edge that is in contact with a horizontal surface of the dielectric material portion and having a first distal edge that is spaced from the dielectric material portion by a vertical thickness of the first horizontally-extending portion, a second horizontally-extending portion that is located over a second side of the source layer, and a connecting portion that connects the first horizontally-extending portion and the second horizontally-extending portion and that comprises a second inner sidewall having a second distal edge that is adjoined to a distal horizontal surface of the second horizontally-extending portion; and forming a backside connection pad structure, wherein the backside connection pad structure comprises a proximal portion contacting end surfaces of the connection via structures, a distal portion located over the second horizontally-extending portion of the backside isolation layer, and a connecting portion that connects the proximal portion and the distal portion, wherein a lateral distance between an inner sidewall and an outer sidewall of the connecting portion of the backside connection pad structure within a first horizontal plane containing the second distal edge is greater than a lateral distance between the first distal edge and the second distal edge of the backside isolation layer.

According to still another aspect of the present disclosure, a memory device comprises an alternating stack of insulating layers and electrically conductive layers located over a first side of a source layer; a three-dimensional array of memory elements embedded in the alternating stack; a dielectric material portion located over the first side of the source layer adjacent to the alternating stack; connection via structures vertically extending through the dielectric material portion; a backside connection pad cavity vertically extending through the source layer; a backside isolation layer comprising a first horizontally-extending portion located within the backside connection pad cavity, a second horizontally-extending portion, and a connecting portion that connects the first horizontally-extending portion and the second horizontally-extending portion; and a backside connection pad structure comprising first regions which are located in a first opening in the backside isolation layer and which contact the end surfaces of the connection via structures, and dummy second regions which only contact the dielectric material portion and which do not contact the end surfaces of the connection via structures.

According to still another aspect of the present disclosure, a method of forming a device structure comprise: forming a combination of a three-dimensional memory array and a dielectric material portion over a first side of a source layer that overlies a carrier substrate, wherein the three-dimensional memory array comprises a three-dimensional array of memory elements embedded in an alternating stack of insulating layers and electrically conductive layers, and the dielectric material portion is located adjacent to the alternating stack; forming connection via structures through the dielectric material portion; removing the carrier substrate; forming a backside connection pad cavity through at least the source layer after removing the carrier substrate; depositing and patterning a backside isolation layer, wherein the backside isolation layer comprises a first horizontally-extending portion located within the backside connection pad cavity, a second horizontally-extending portion that is located over a second side of the source layer, and a connecting portion that connects the first horizontally-extending portion and the second horizontally-extending portion; and forming a backside connection pad structure, wherein the backside connection pad structure comprises first regions which are located in a first opening in the backside isolation layer and which contact the end surfaces of the connection via structures, and dummy second regions which only contact the dielectric material portion and which do not contact the end surfaces of the connection via structures.

DETAILED DESCRIPTION

Figure 1:
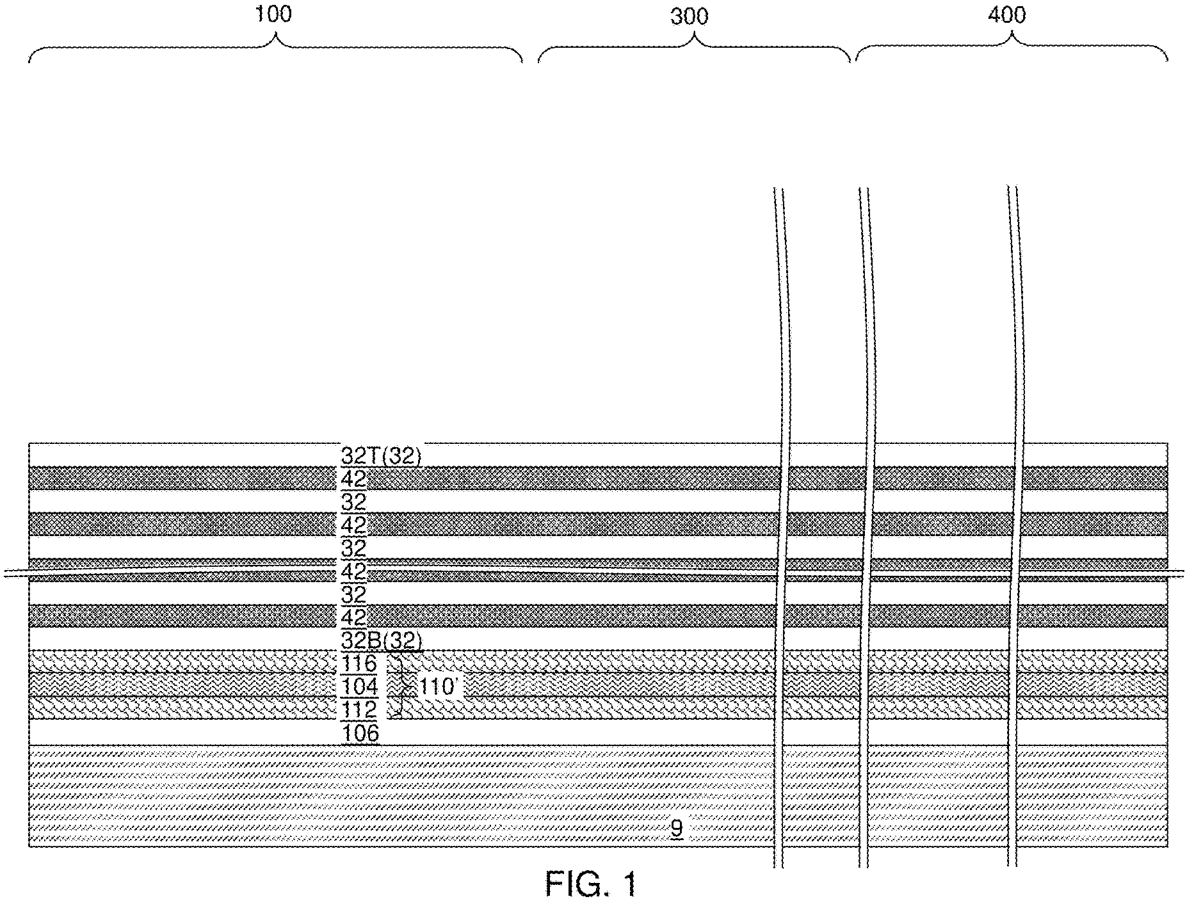
FIG. 1 is a schematic vertical cross-sectional view of a first exemplary structure for forming a memory die after formation of a stopper insulating layer, in-process source-level material layers, and an alternating stack of insulating layers and sacrificial material layers over a carrier substrate according to an embodiment of the present disclosure.

As discussed above, the embodiments of the present disclosure are directed to a three-dimensional memory device including a crack-resistant backside passivation structure and methods for manufacturing the same, the various aspects of which are described below. Embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are employed merely to identify similar elements, and different ordinals may be employed across the specification and the claims of the instant disclosure. The term “at least one” element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to an embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An insulating material layer can be formed on a top surface of the carrier substrate 9. The insulating material layer can be subsequently employed as a stopping material layer for a process that removes the carrier substrate 9, and is herein referred to as a stopper insulating layer 106, or as a backside pad dielectric layer. If a polishing process such as a chemical mechanical polishing process is employed to subsequently remove the carrier substrate 9, the stopper insulating layer 106 may be subsequently employed as a polishing stopper material layer. If an etch process such as a wet etch process is employed to subsequently remove the carrier substrate 9, the stopper insulating layer 106 may be subsequently employed as an etch stop material layer. In one embodiment, the stopper insulating layer 106 comprises a dielectric material such as undoped silicate glass, a doped silicate glass, or silicon nitride. The thickness of the stopper insulating layer 106 may be in a range from 100 nm to 1,000 nm, such as from 200 nm to 600 nm, although lesser and greater thicknesses may also be employed.

In-process source-level material layers 110' can be formed over the stopper insulating layer 106. The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner (not shown), a source-level sacrificial layer 104, an optional upper sacrificial liner (not shown), and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner (or selective to the lower source-level semiconductor layer 112) and the upper sacrificial liner (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner (if present) and the upper sacrificial liner (if present) include materials that may function as an etch stop material during removal of the source-level sacrificial layer 104. For example, the lower sacrificial liner and the upper sacrificial liner may include silicon oxide, silicon nitride, and/or a dielectric metal oxide. In one embodiment, each of the lower sacrificial liner and the upper sacrificial liner may include a silicon oxide layer having a thickness in a range from 2 nm to 30 nm, although lesser and greater thicknesses may also be used.

An alternating stack of first material layers and second material layers can be formed over the in-process source-level material layers 110'. In an alternative embodiment, the in-process source-level material layers 110' and the stopper insulating layer 106 may be omitted, and the alternating stack is formed directly on a surface of the carrier substrate 9. In another alternative embodiment described below with respect to FIG. 20, a peripheral circuit is formed on the same substrate as the alternating stack. For example, the peripheral circuit may comprise word line driver regions, bit line driver regions, sense amplifier regions, input/output buffer regions, etc. In this alternative embodiment, a separate logic die containing the peripheral circuit described below with respect to FIG. 16 may be omitted. In this alternative embodiment, the alternating stack may be deposited on the in-process source-level material layers 110' or the in-process source-level material layers 110' may be omitted, and the alternating stack may be deposited on the stopper insulating layer 106.

In the alternating stack, the first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the in-process source-level material layers 110'. The insulating layers 32 comprise an insulating material such as undoped silicate glass or a doped silicate glass, and the sacrificial material layers 42 comprise a sacrificial material, such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

The first exemplary structure comprises a memory array region 100 in which a three-dimensional array of memory elements is to be subsequently formed, a contact region 300 in which layer contact via structures contacting word lines are to be subsequently formed, and a peripheral region 400 (which is also referred to as a connection region) in which connection via structures for providing vertically-extending electrical signal paths are to be subsequently formed.

Figure 2:
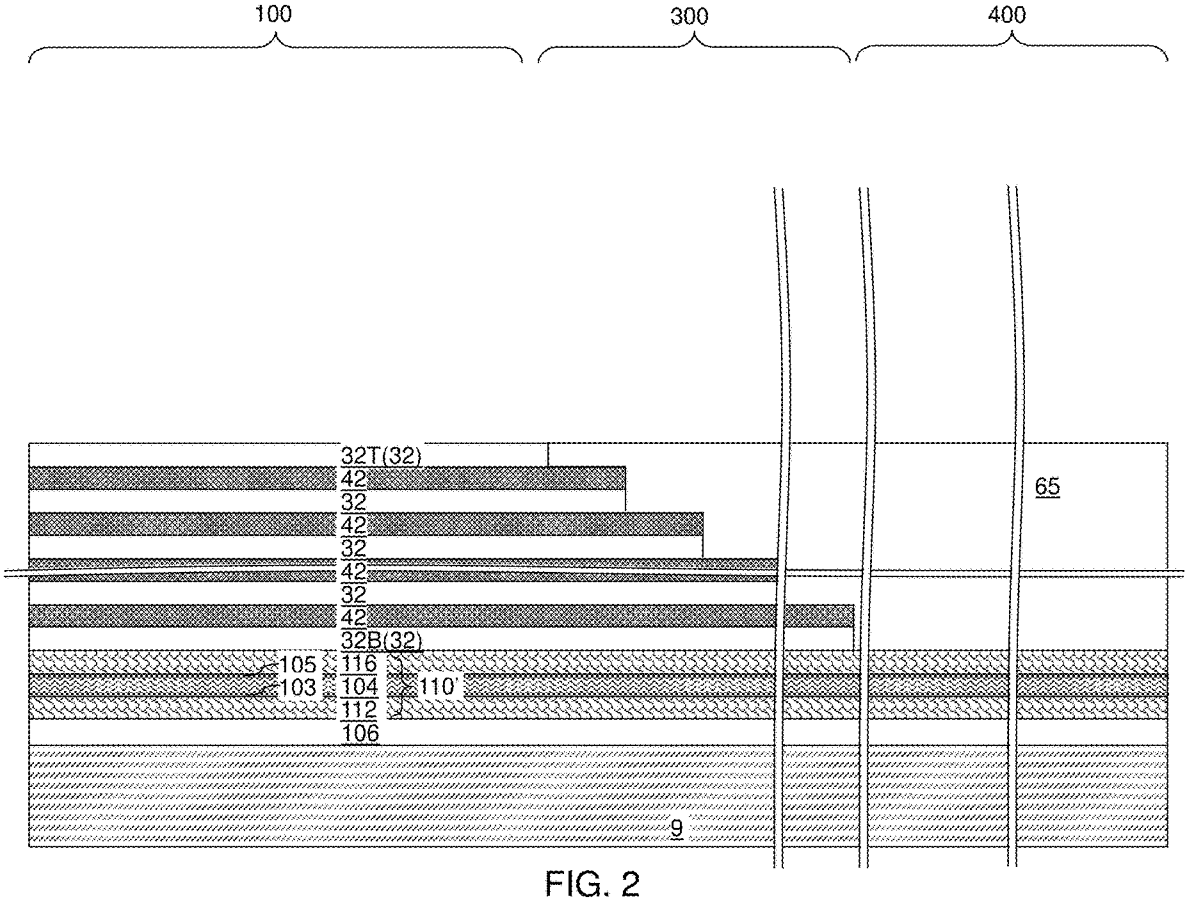
FIG. 2 is a schematic vertical cross-sectional view of the first exemplary structure after formation of stepped surfaces and a stepped dielectric material portion according to an embodiment of the present disclosure.

Referring to FIG. 2, stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the in-process source-level material layers 110'. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65, which may be a retro-stepped dielectric material portion. As used herein, a "retro-stepped" element refers to an element that has stepped surfaces and a horizontal cross-sectional area that increases monotonically as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B. P. and/or F. The stepped dielectric material portion 65 may comprise a first region located in the contact region 300 and overlying and contacting the stepped surfaces of the alternating stack (32, 42) and having a stepwise-changing variable thickness, and a second region located within the peripheral region 400 and having a uniform thickness throughout.

Optionally, drain-select-level isolation structures (not shown) can be formed through the topmost insulating layer 32T and a subset of the sacrificial material layers 42 located at drain-select-levels. The drain-select-level isolation structures can be formed, for example, by forming drain-select-level lateral isolation trenches and filling the drain-select-level lateral isolation trenches with a dielectric material such as silicon oxide. Excess portions of the dielectric material can be removed from above the top surface of the topmost insulating layer 32T.

Figure 3A:
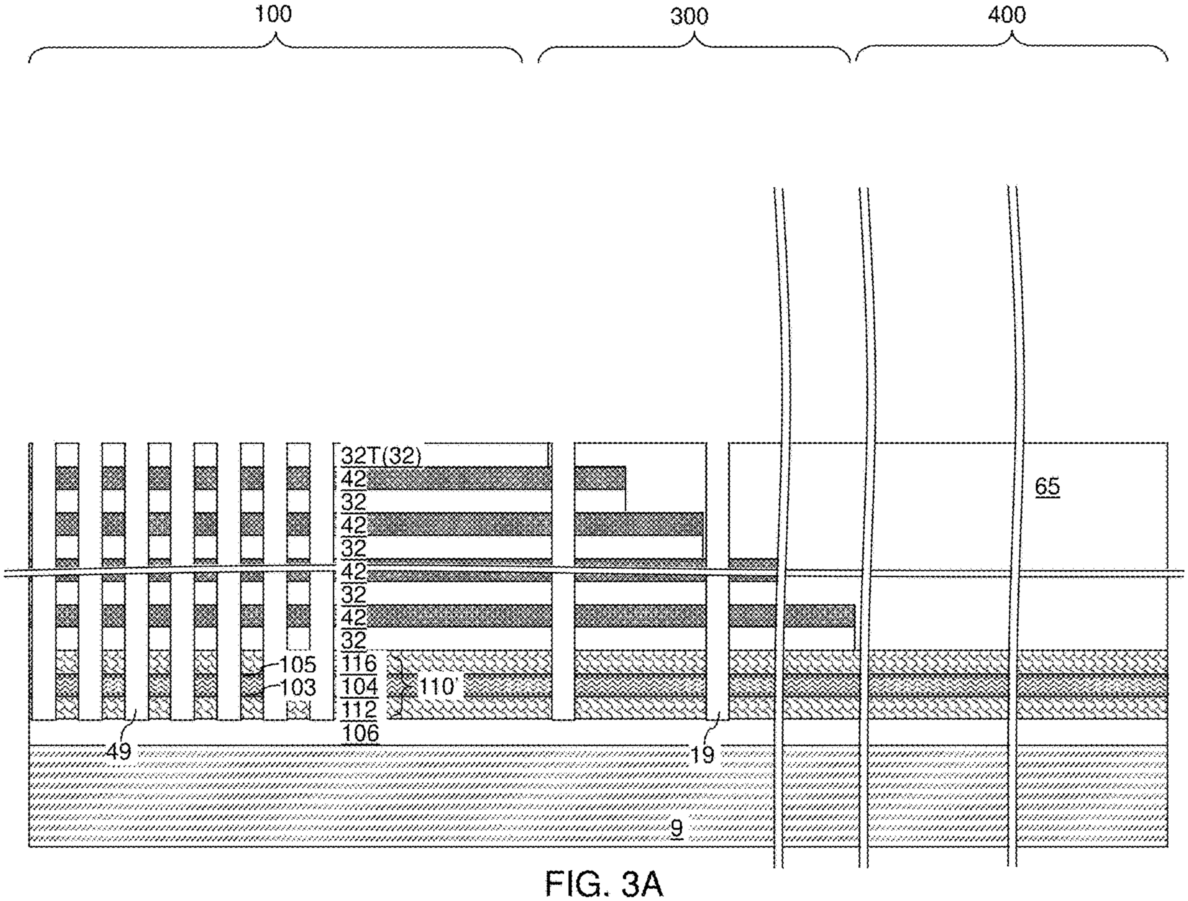
FIG. 3A is a schematic vertical cross-sectional view of the first exemplary structure after forming memory openings and support openings according to an embodiment of the present disclosure.
Figure 3B:
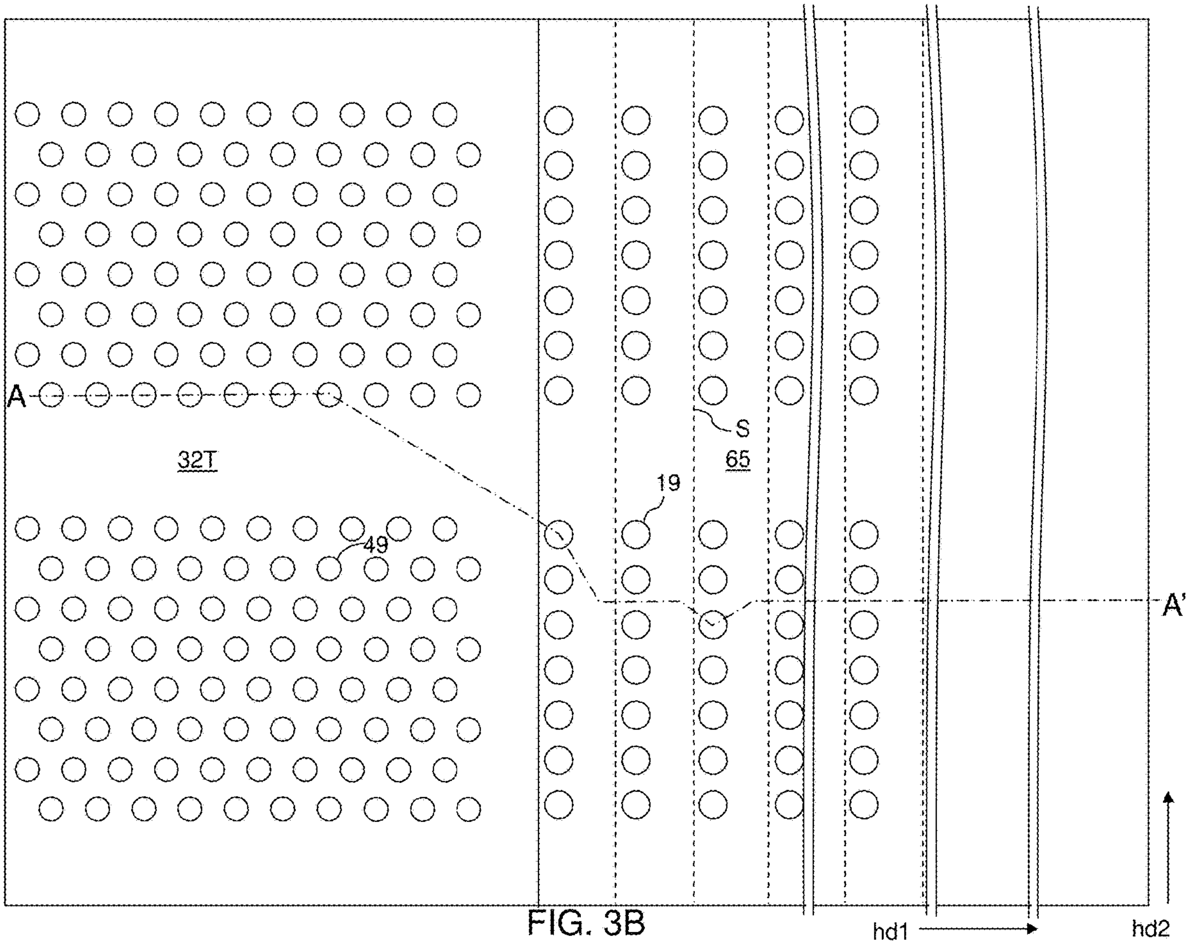
FIG. 3B is a top-down view of the first exemplary structure of FIG. 3A. The vertical plane A-A' is the cut plane of the vertical cross-sectional view of FIG. 3A.

Referring to FIGS. 3A-3C, an etch mask layer (not shown) can be formed over the alternating stack (32, 42), and can be lithographically patterned to form various openings therein. An anisotropic etch process can be performed to transfer the pattern of the openings in the etch mask layer through the alternating stack (32, 42). Various openings can be formed through the alternating stack (32, 42). The various openings may comprise memory openings 49 that are formed in the memory array region 100 and support openings 19 that are formed in the contact region 300. Each of the memory openings 49 and the support openings 19 can vertically extend through the alternating stack (32, 42) and into the in-process source-level material layers 110' In one embodiment, bottom surfaces of the memory openings 49 and the support openings 19 may be formed within the lower source-level semiconductor layer 112 or at an interface between the lower source-level semiconductor layer and the stopper insulating layer 106.

The support openings 19 may have a diameter in a range from 60 nm to 400 nm, such as from 120 nm to 300 nm, although lesser and greater thicknesses may be employed. The memory openings 49 may have a diameter in a range from 60 nm to 400 nm, such as from 120 nm to 300 nm, although lesser and greater thicknesses may be employed.

In one embodiment, the memory array region 100 may be laterally spaced apart from the contact region 300 along a first horizontal direction hd1. The memory openings 49 may comprise rows of memory openings 49 that are arranged along the first horizontal direction hd1 and laterally spaced apart along a second horizontal direction hd2 that is perpendicular to the first horizontal direction hd2. Multiple clusters of memory openings 49, each containing a respective two-dimensional periodic array of memory openings 49, may be formed in the memory array region 100. The clusters of memory openings 49 may be laterally spaced apart along the second horizontal direction hd2.

Figure 4:
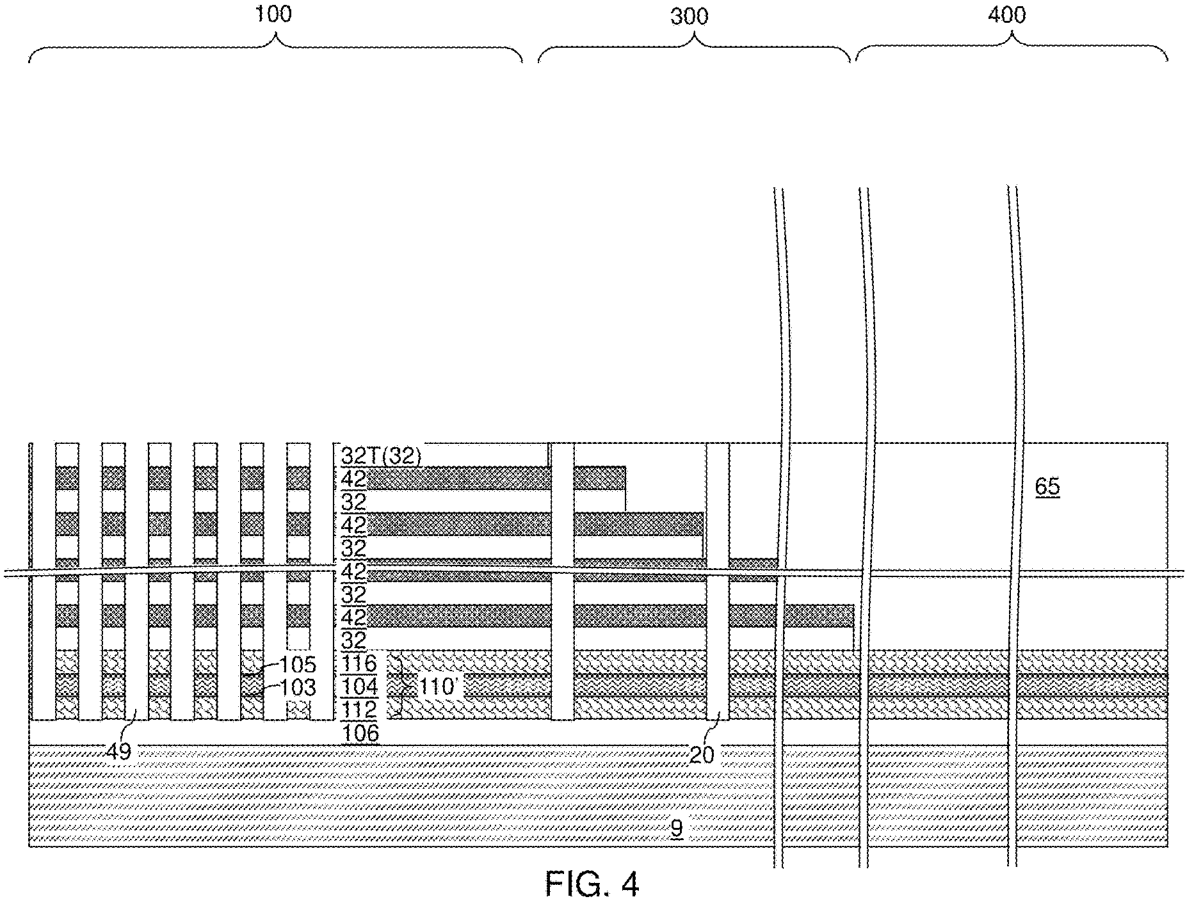
FIG. 4 is a schematic vertical cross-sectional view of the first exemplary structure after formation of support pillar structures according to an embodiment of the present disclosure.

Referring to FIG. 4, an optional etch stop liner (not shown) and a sacrificial fill material (not shown) can be deposited in the memory openings 49 and the support openings. The optional etch stop liner (if present) comprises a thin dielectric material layer comprising silicon oxide, silicon nitride, or a dielectric metal oxide and having a thickness in a range from 1 nm to 6 nm. The sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material. Excess portions of the sacrificial fill material can be removed from above the horizontal plane including the topmost layer of the alternating stack (32, 42) by a planarization process such as an etch back process. Remaining portions of the sacrificial fill material that fill the memory openings 49 and the support openings 19 constitute sacrificial memory opening fill structures (not shown) and sacrificial support opening fill structures (not shown).

A photoresist layer (not shown) can be applied over the alternating stack (32, 42) and the stepped dielectric material portion 65, and can be lithographically patterned to cover the memory array region 100 without covering the contact region 300. The sacrificial support opening fill structures and portions of the optional etch stop liner in the contact region 300 can be removed selective to the materials of the stepped dielectric material portion 65 and the alternating stack (32, 42). For example, an etch process or an ashing process may be employed to remove the sacrificial support opening fill structures and portions of the optional etch stop liner in the contact region 300. The photoresist layer can be subsequently removed.

A dielectric fill material such as silicon oxide can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the stepped dielectric material portion 65 during replacement of the sacrificial material layers 42 with electrically conductive layers.

Subsequently, the sacrificial memory opening fill structures and portions of the optional etch stop liner in the memory array region 100 can be removed selective to the materials of the stepped dielectric material portion 65 and the alternating stack (32, 42). For example, an etch process or an ashing process may be employed to remove the sacrificial memory opening fill structures and portions of the optional etch stop liner in the memory array region 100. Voids are formed in the volumes of the memory openings 49.

FIGS. 5A-5D are sequential vertical cross-sectional views of a memory opening 49 during formation of a NAND string (e.g., a dummy NAND string or a data storage NAND string) which is referred to below as a "memory opening fill structure" 58 according to an embodiment of the present disclosure.

Figure 5A:
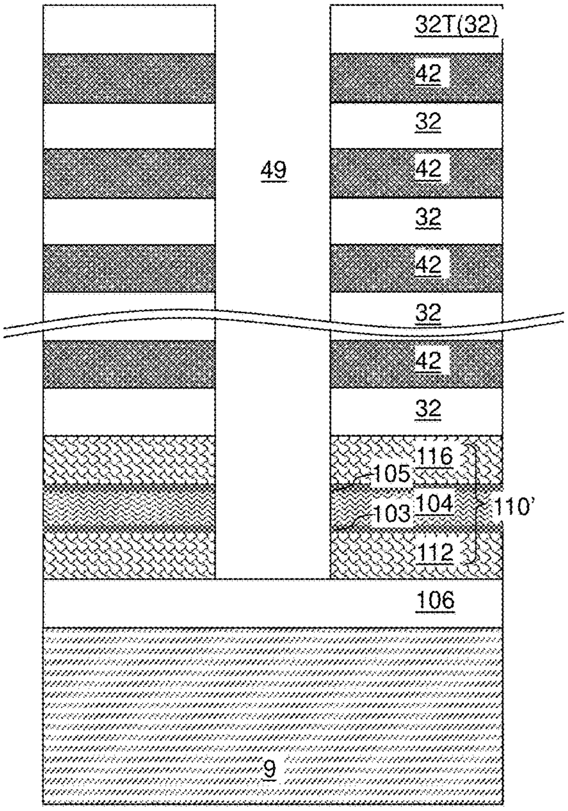
FIGS. 5A-5D are sequential vertical cross-sectional views of a memory opening during formation of a memory opening fill structure according to an embodiments of the present disclosure.

Referring to FIG. 5A, a memory opening 49 is illustrated after the processing steps of FIG. 4.

Figure 5B:
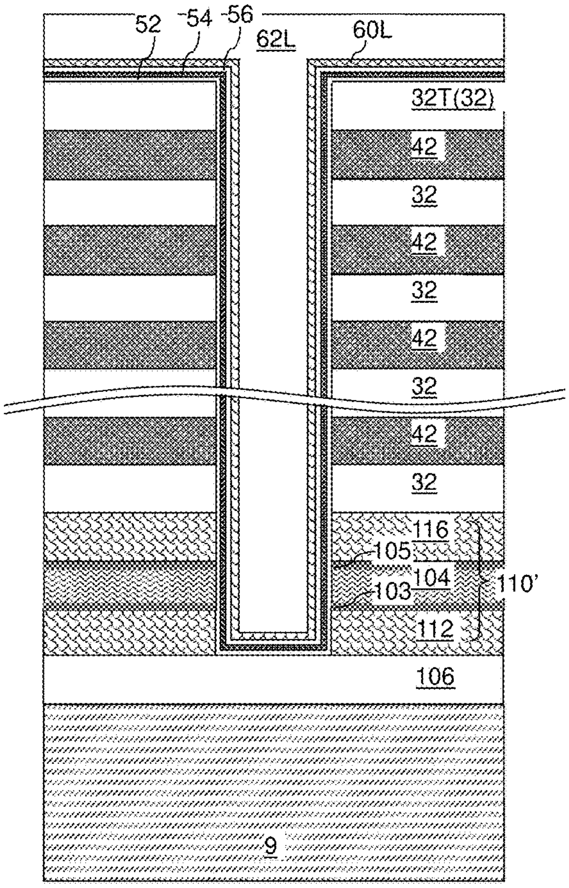

Referring to FIG. 5B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride). In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0\times10^{13}/cm^3$ to $3.0\times10^{17}/cm^3$, such as $1.0\times10^{14}/cm^3$ to $3.0\times10^{16}/cm^3$, although lesser and greater atomic concentrations may also be employed. A dielectric core layer 62L comprising a dielectric fill material can be deposited in remaining volumes of the memory openings 49 and over the alternating stack (32, 42).

Figure 5C:
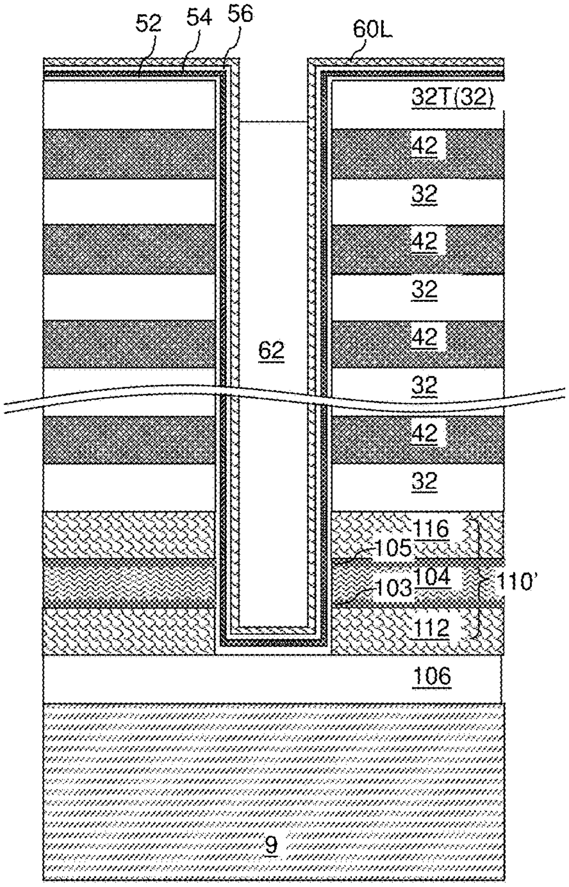

Referring to FIG. 5C, the dielectric core layer 62L can be vertically recessed such that each remaining portion of the dielectric core layer 62L has a top surface at, or about, the horizontal plane including the bottom surface of the topmost insulating layers 32T. Each remaining portion of the dielectric core layer 62L constitutes a dielectric core 62.

Figure 5D:
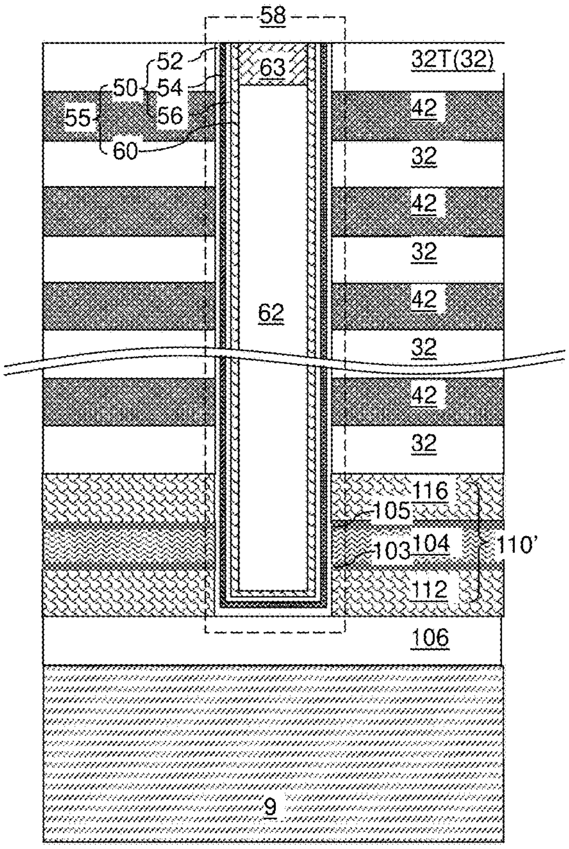

Referring to FIG. 5D, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42.

Figure 6A:
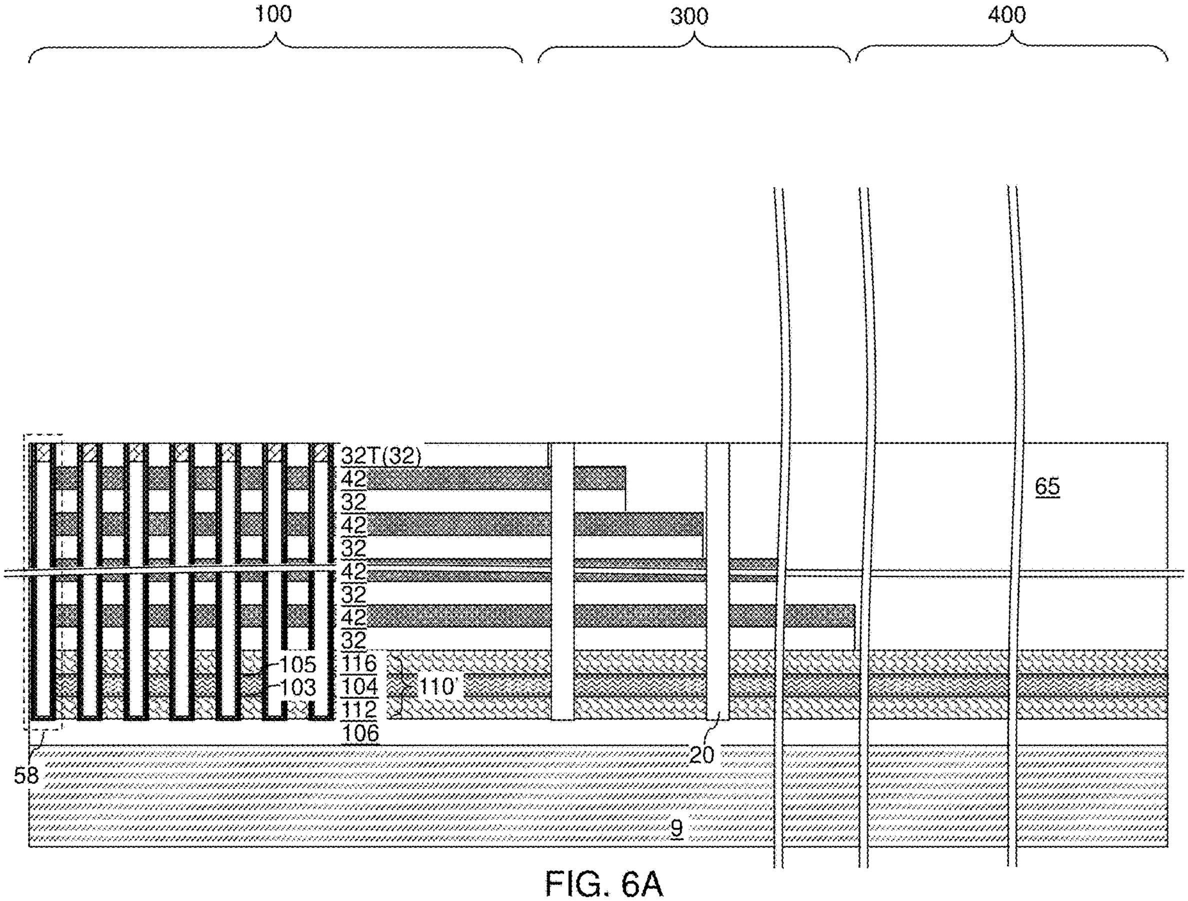
FIG. 6A is a vertical cross-sectional view of the first exemplary structure after formation of memory opening fill structures according to an embodiment of the present disclosure.
Figure 6B:
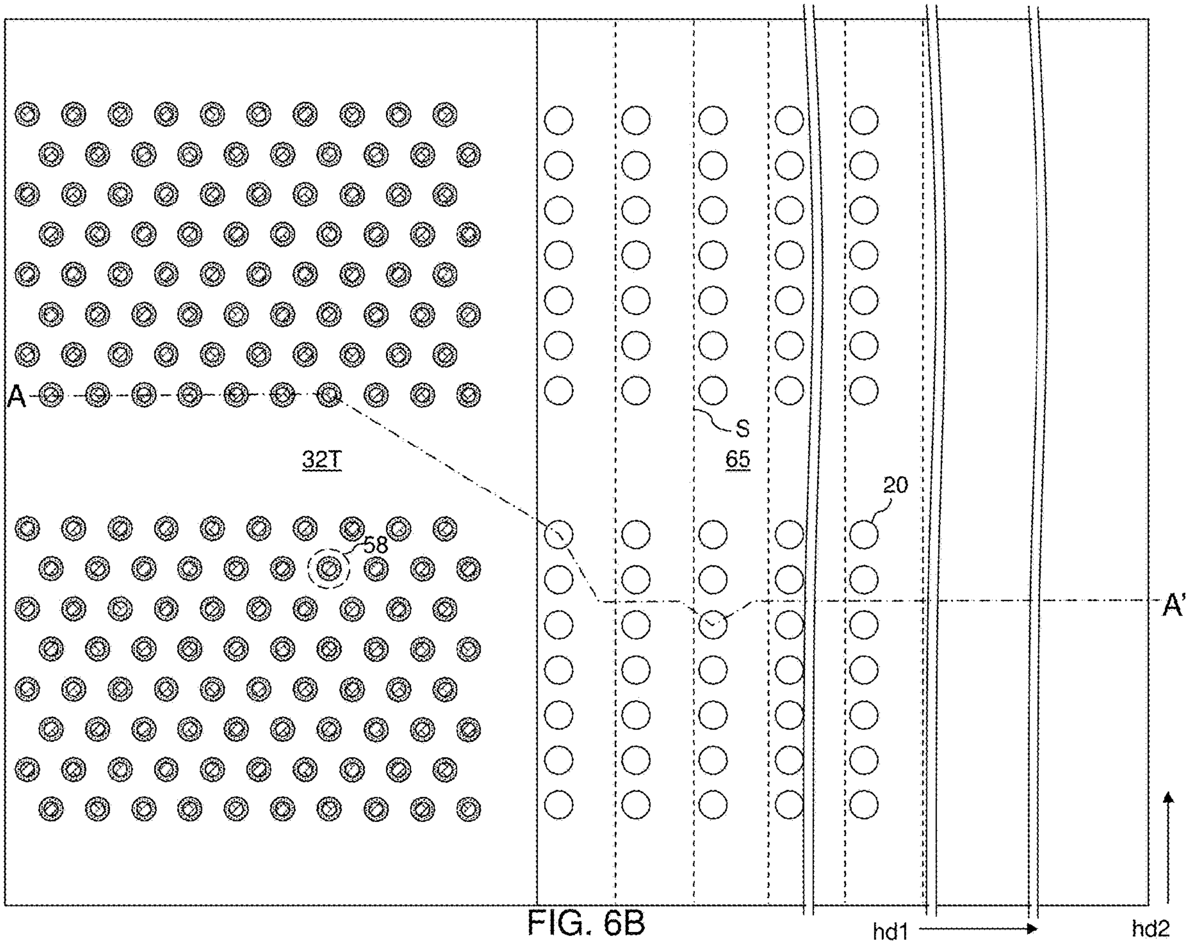
FIG. 6B is a top-down view of the first exemplary structure of FIG. 6A. The vertical plane A-A' is the cut plane of the vertical cross-sectional view of FIG. 6A.

Referring to FIGS. 6A and 6B, the first exemplary structure is illustrated after formation of memory opening fill structures 58 within the memory openings 49. Each of the memory opening fill structures 58 may comprise a memory film 50 and a vertical semiconductor channel 60. In summary, a combination of an alternating stack (32, 42) of insulating layers 32 and sacrificial material layers 42, memory openings 49 vertically extending through the alternating stack (32, 42), and memory opening fill structures 58 located in the memory openings 49 can be formed. Each of the memory opening fill structures 58 comprises a respective vertical stack of memory elements, such as portions of a memory material layer 54 located at levels of the sacrificial material layers 42.

Figure 7A:
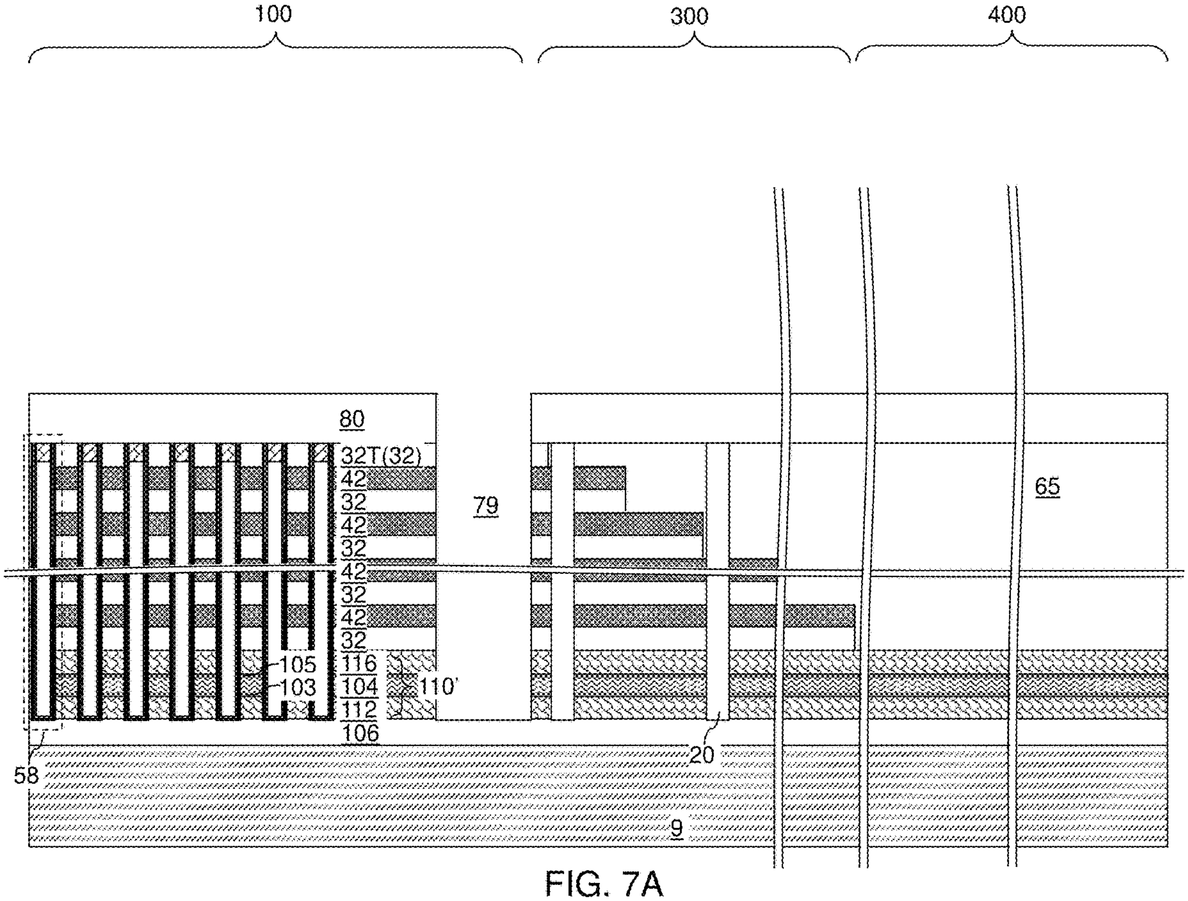
FIG. 7A is a vertical cross-sectional view of the first exemplary structure after formation of isolation trenches according to an embodiment of the present disclosure.
Figure 7B:
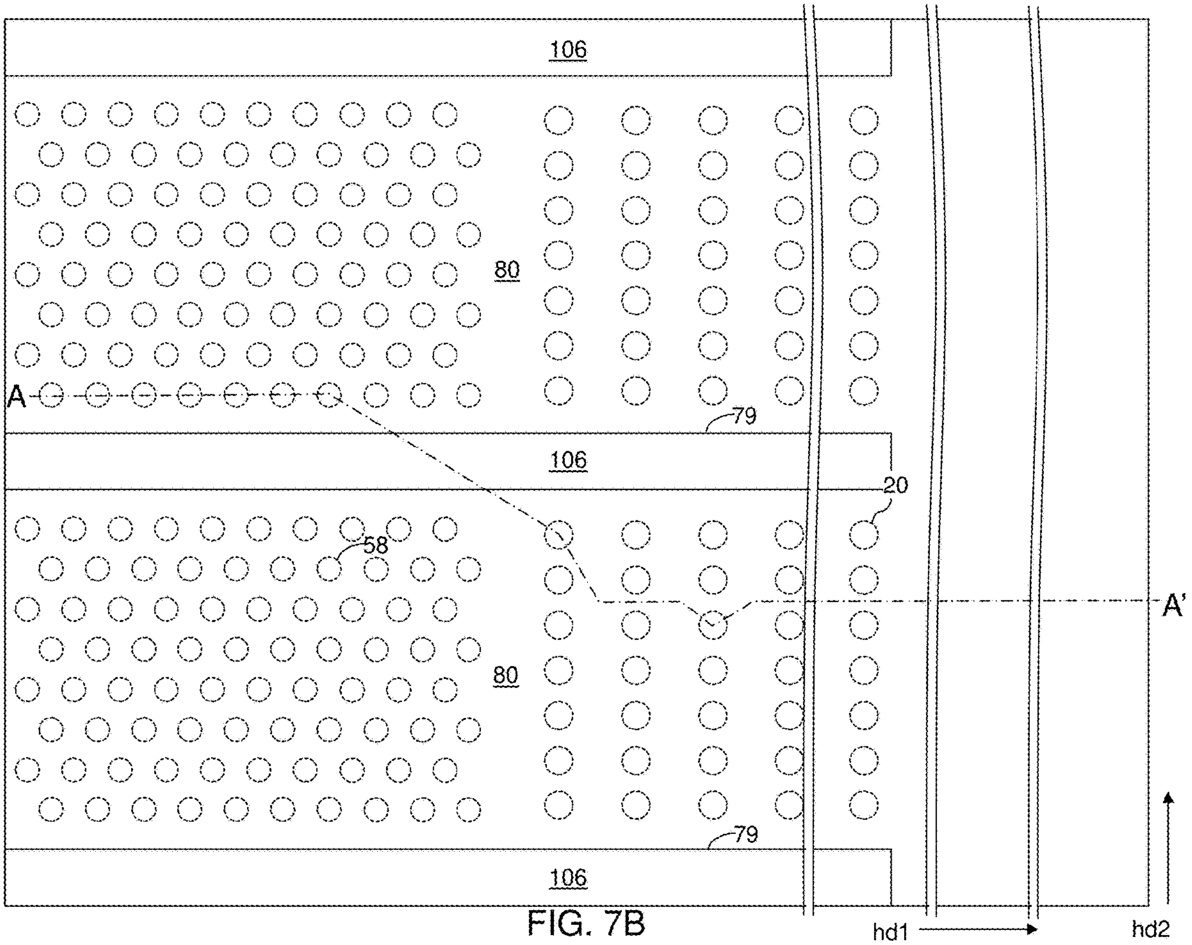
FIG. 7B is a top-down view of the first exemplary structure of FIG. 7A. The vertical plane A-A' is the cut plane of the vertical cross-sectional view of FIG. 7A.

Referring to FIGS. 7A and 7B, a dielectric material such as undoped silicate glass or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), the stepped dielectric material portion 65, and the in-process source-level material layers 110'. Lateral isolation trenches 79 laterally extending along the first horizontal direction hd1 can be formed through the alternating stack (32, 42), the stepped dielectric material portion 65, the contact-level dielectric layer 80, and the in-process source-level material layers 110'. Each of the lateral isolation trenches 79 may comprise a respective pair of lengthwise sidewalls that are parallel to the first horizontal direction hd1 and vertically extend from the stopper insulating layer 106 to the top surface of the contact-level dielectric layer 80. A top surface of the stopper insulating layer 106 can be physically exposed underneath each lateral isolation trench 79. The lateral isolation trenches 79 isolate adjacent memory blocks from each other along the second horizontal direction hd2. The photoresist layer can be subsequently removed, for example, by ashing.

Figure 8:
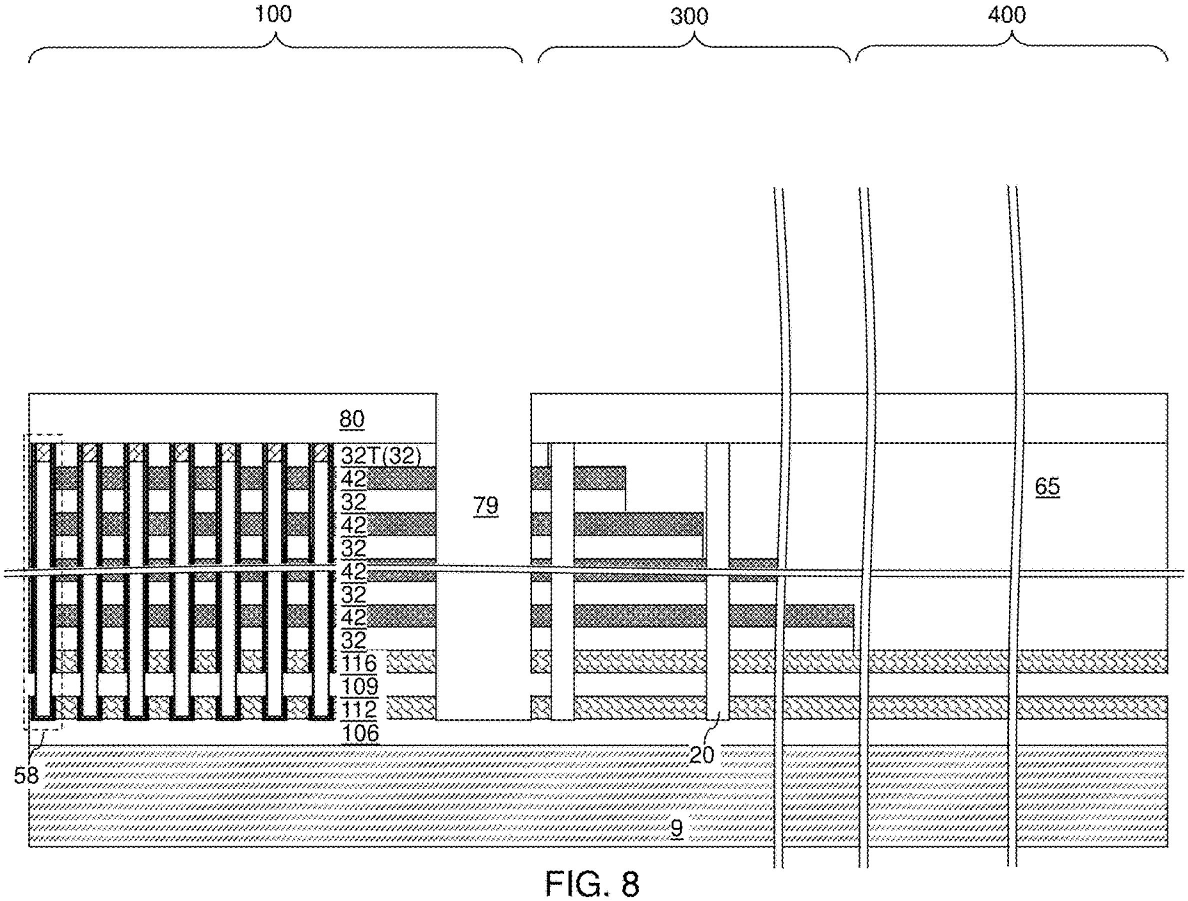
FIG. 8 is a vertical cross-sectional view of the first exemplary structure after formation of a source-level cavity according to an embodiment of the present disclosure.

Referring to FIG. 8, an etchant that etches the material of the source-level sacrificial layer 104 selective to the materials of the alternating stack (32, 42), the contact-level dielectric layer 80, the stepped dielectric material portion 65, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stack (32, 42), the contact-level dielectric layer 80, the stepped dielectric material portion 65, the lower source-level semiconductor layer 112, and the upper source-level semiconductor layer 116. A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the lateral isolation trenches 79. Specifically, even if sidewalls of the upper source-level semiconductor layer 116 are physically exposed or even if a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

A sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 9:
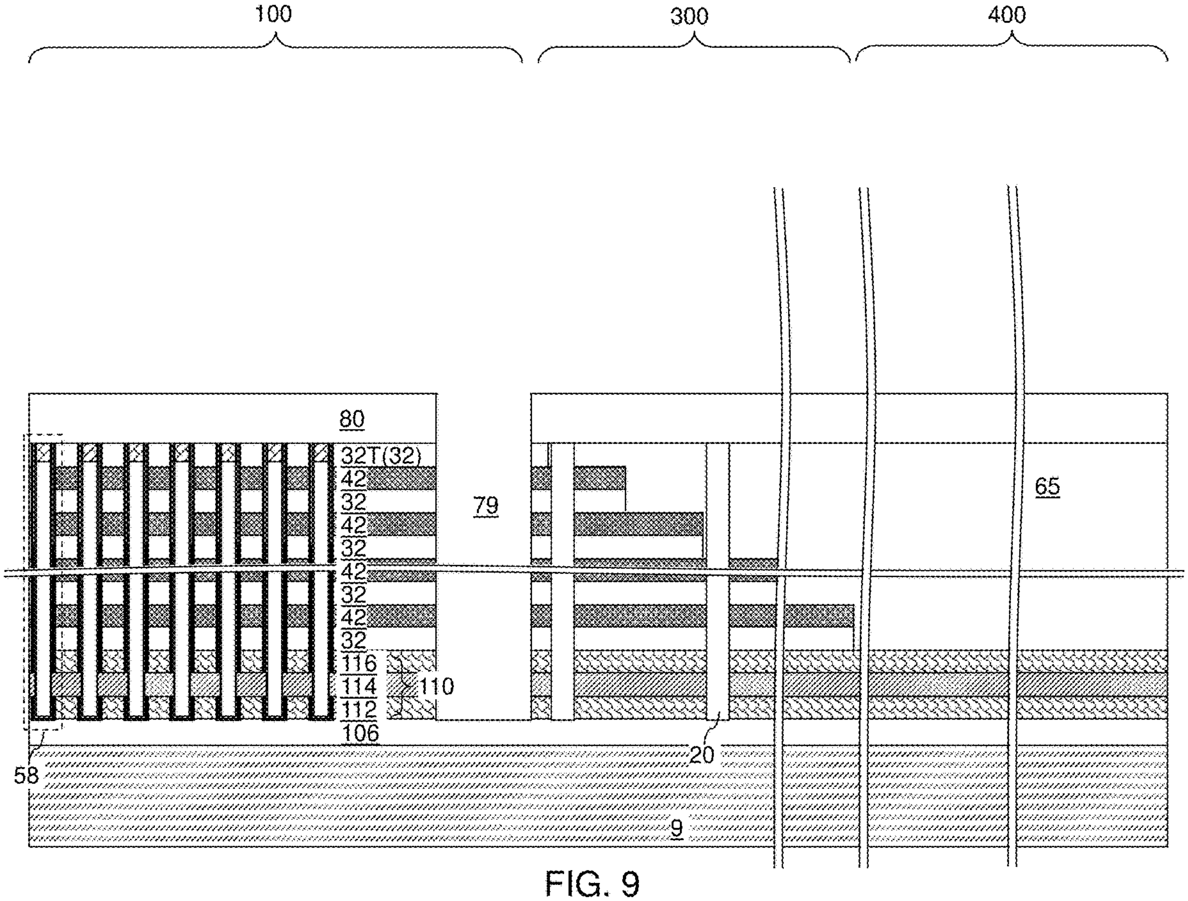
FIG. 9 is a vertical cross-sectional view of the first exemplary structure after formation of a source contact layer according to an embodiment of the present disclosure.

Referring to FIG. 9, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes a source layer 110, which replaces the in-process source-level material layers 110'. The source layer 110 contacts an end portion of each of the vertical semiconductor channels 60.

Figure 10:
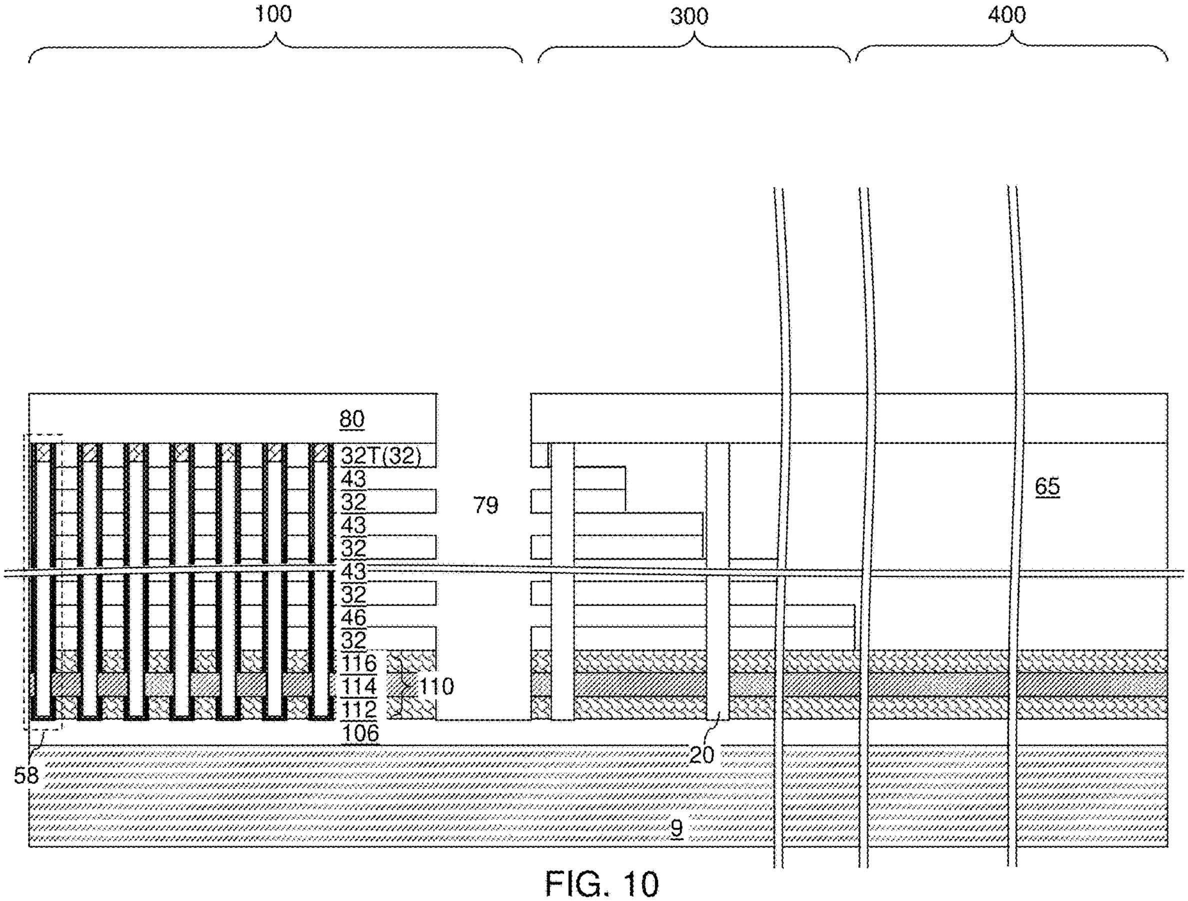
FIG. 10 is a vertical cross-sectional view of the first exemplary structure after formation of laterally-extending cavities according to an embodiment of the present disclosure.

Referring to FIG. 10, an isotropic etch process can be performed to remove the sacrificial material layers 42 selective to the insulating layers 32, the stopper insulating layer 106, the memory opening fill structures 58, the sacrificial etch stop liners 71, and the source layer 110. Laterally-extending cavities 43 can be formed in volumes from which the sacrificial material layers 42 are removed. Sidewall surface segments of the memory opening fill structures 58 can be physically exposed to the laterally-extending cavities 43. In an illustrative example, if the sacrificial material layers 42 comprise silicon nitride, the isotropic etch process may comprise a wet etch process employing hot phosphoric acid, which is a process in which the first exemplary structure is immersed in phosphoric acid at or near the boiling point of the phosphoric acid. A suitable cleaning process may be performed as needed. In summary, the laterally-extending cavities 43 can be formed by removing the sacrificial material layers 42 selective to the insulating layers 32 and the memory opening fill structures 58.

FIGS. 11A-11D are sequential vertical cross-sectional views of a region of the first exemplary structure during formation of a backside blocking dielectric layer 44 and an electrically conductive layer 46 in each of the laterally-extending cavities 43 according to an embodiment of the present disclosure.

Figure 11A:
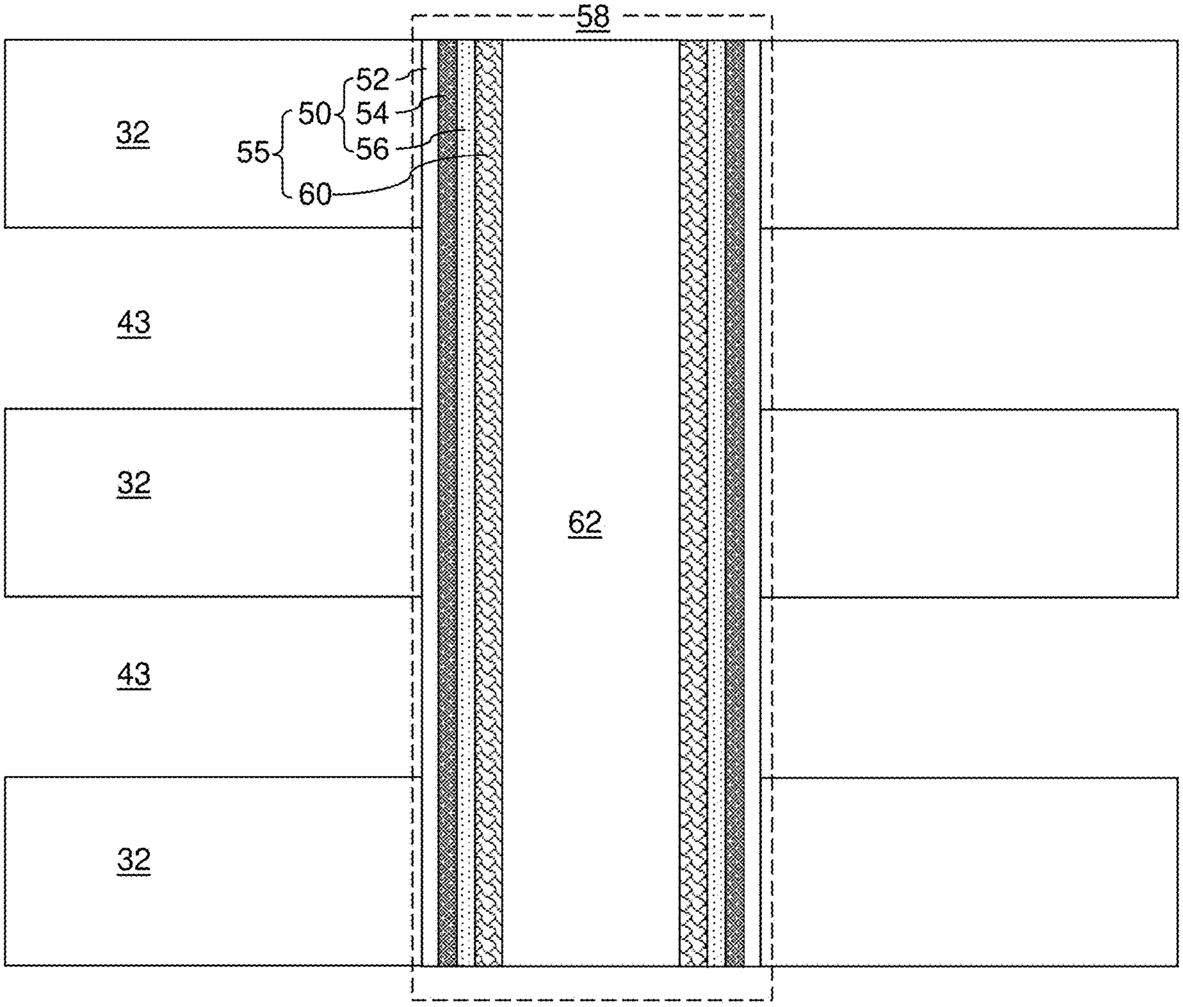
FIGS. 11A-11D are sequential vertical cross-sectional views of a region of the first exemplary structure during formation a backside blocking dielectric layer and an electrically conductive layer in each of the laterally-extending cavities according to an embodiment of the present disclosure.

Referring to FIG. 11A, a region of the first exemplary structure is illustrated after the processing steps of FIG. 10. Cylindrical outer surface segments of each memory opening fill structure 58 and horizontally-extending surfaces of the insulating layers 32 can be exposed to the laterally-extending cavities 43.

Figure 11B:
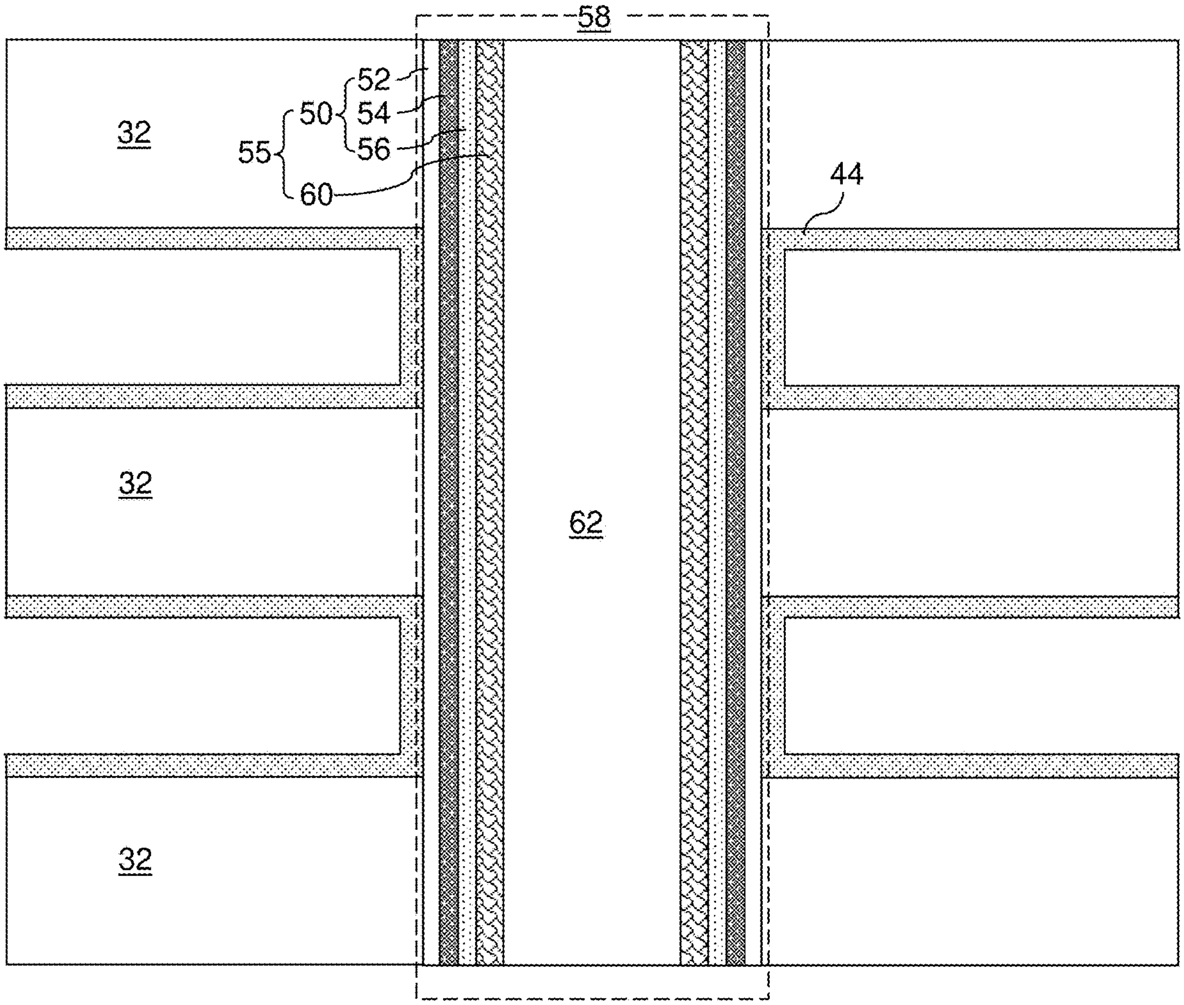

Referring to FIG. 11B, a backside blocking dielectric layer 44 is deposited in the laterally-extending cavities 43. The backside blocking dielectric layer 44 includes and/or consists essentially of a dielectric metal oxide material, such as aluminum oxide. The backside blocking dielectric layer 44 can be deposited by a conformal deposition process, and may have a uniform thickness throughout. In one embodiment, an atomic layer deposition (ALD) process or a chemical vapor deposition (CVD) process may be employed to deposit the backside blocking dielectric layer 44. The backside blocking dielectric layer 44 may have a thickness in a range from 1 nm to 10 nm, such as from 2 nm to 5 nm, although lesser and greater thicknesses may also be employed.

Figure 11C:
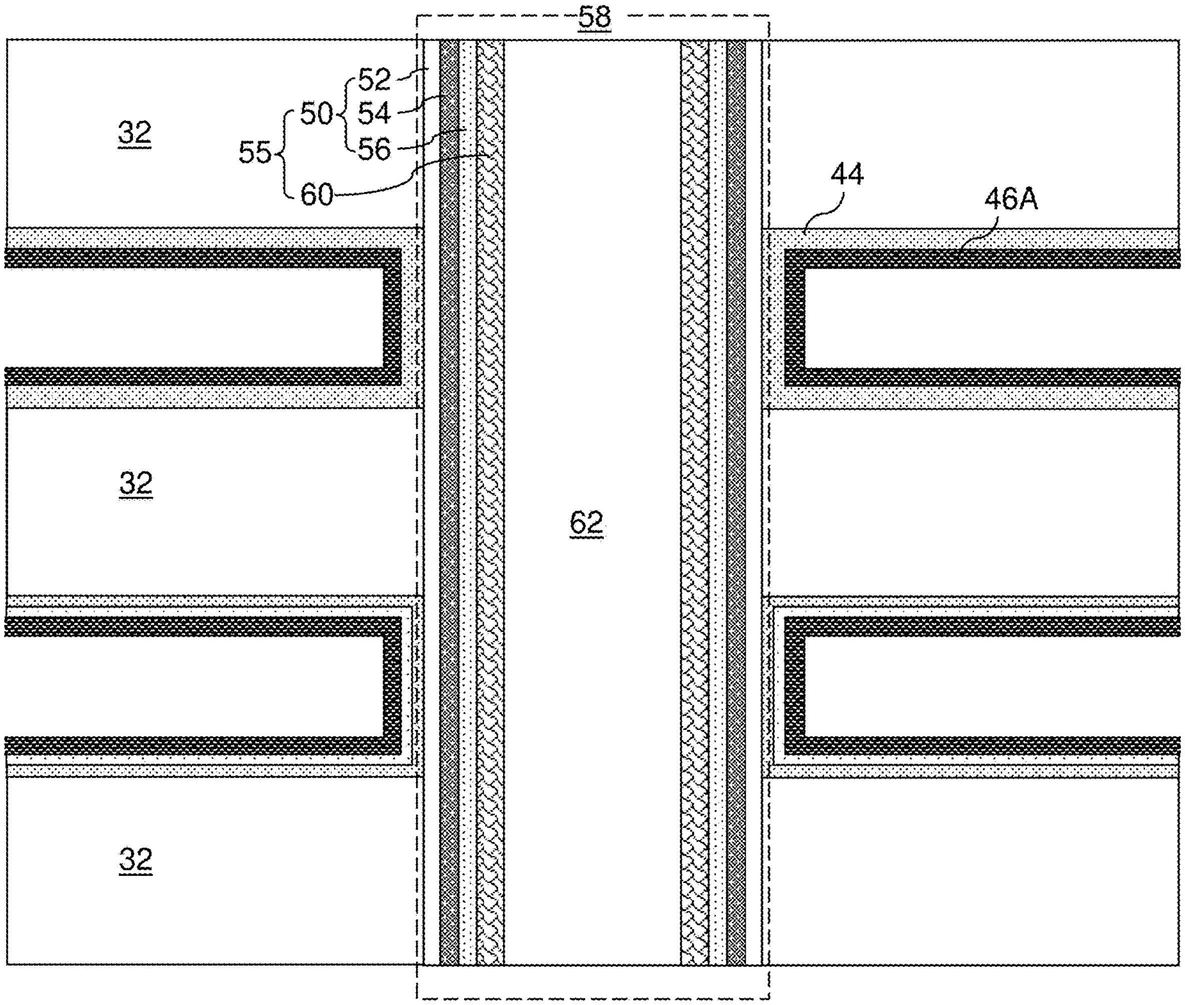

Referring to FIG. 11C, an electrically conductive diffusion barrier layer 46A can be conformally deposited on the physically exposed surfaces of the backside blocking dielectric layer 44. The diffusion barrier layer 46A may comprise tungsten nitride, titanium nitride, molybdenum nitride or tantalum nitride. The thickness of the diffusion barrier layer 46A may be in a range from 1 nm to 8 nm, such as from 2 nm to 5 nm, although lesser and greater thicknesses may also be employed.

Figure 11D:
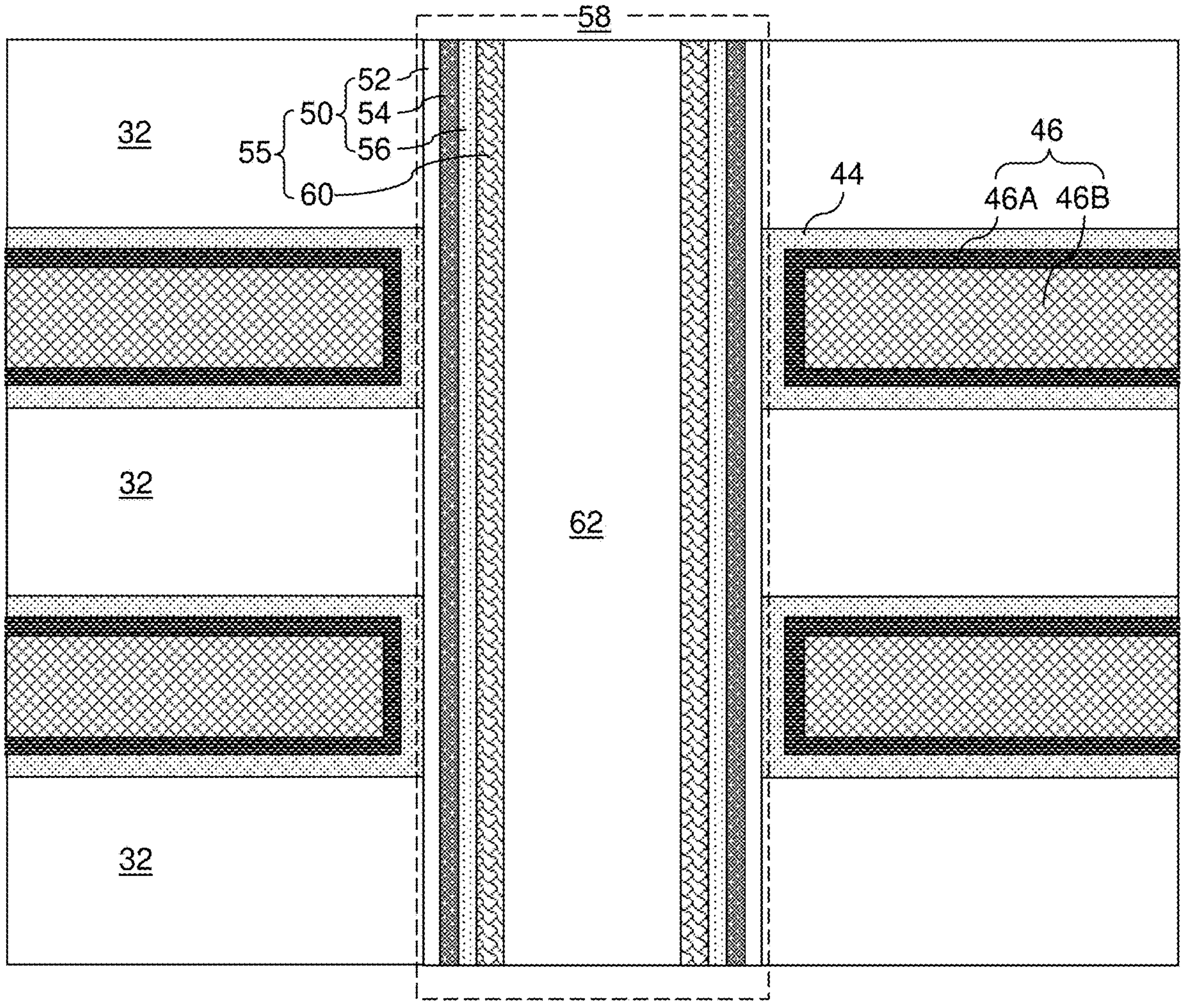

Referring to FIG. 11D, a metal layer 46B may be deposited in remaining volumes of the laterally-extending cavities 43. In one embodiment, the metal may comprise tungsten, molybdenum, ruthenium or cobalt. The metal layer 46B may be deposited by a conformal deposition process such as a chemical vapor deposition process, and can fill remaining volumes of the laterally-extending cavities 43.

An anisotropic etch process can be performed to remove portions of the metal layer 46B and the diffusion barrier layer 46A and optionally the backside blocking dielectric layer 44 from inside the volumes of the lateral isolation trenches 79 and from above the contact-level dielectric layer 80. Each contiguous remaining portion of the combination of the metal layer 46B and the diffusion barrier layer 46A located within a volume of a respective laterally-extending cavity 43 constitutes an electrically conductive layer 46. Alternating stacks (32, 46) of insulating layers 32 and electrically conductive layers 46 are thus formed. The alternating stacks (32, 46) of insulating layers 32 and electrically conductive layers 46 can be laterally spaced apart from each other along the second horizontal direction hd2 by the lateral isolation trenches 79.

Figure 12:
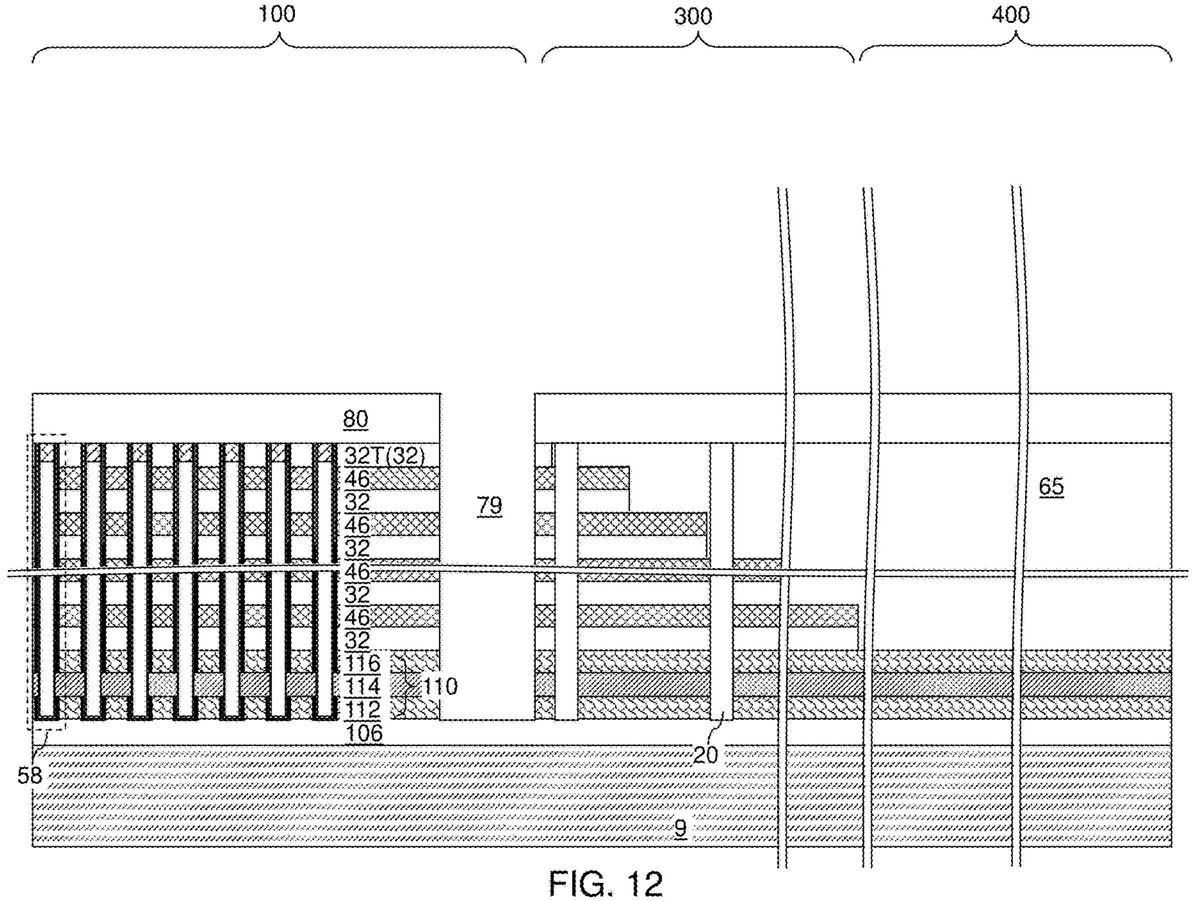
FIG. 12 is a vertical cross-sectional view of the first exemplary structure after formation of electrically conductive layers according to an embodiment of the present disclosure.

Referring to FIG. 12, the first exemplary structure is illustrated after the processing steps of FIG. 11D.

Figure 13A:
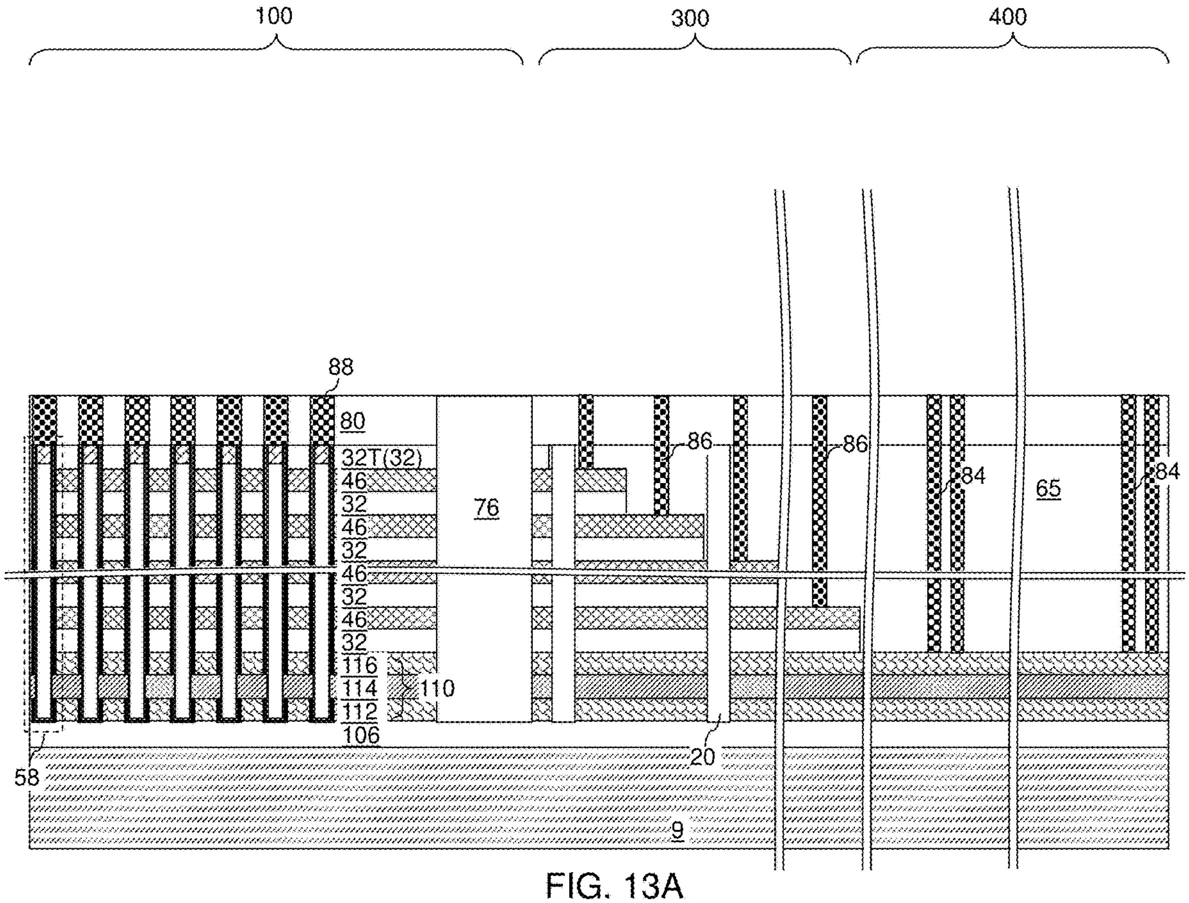
FIG. 13A is a vertical cross-sectional view of the first exemplary structure after formation of lateral isolation trench fill structures and contact via structures according to an embodiment of the present disclosure.
Figure 13B:
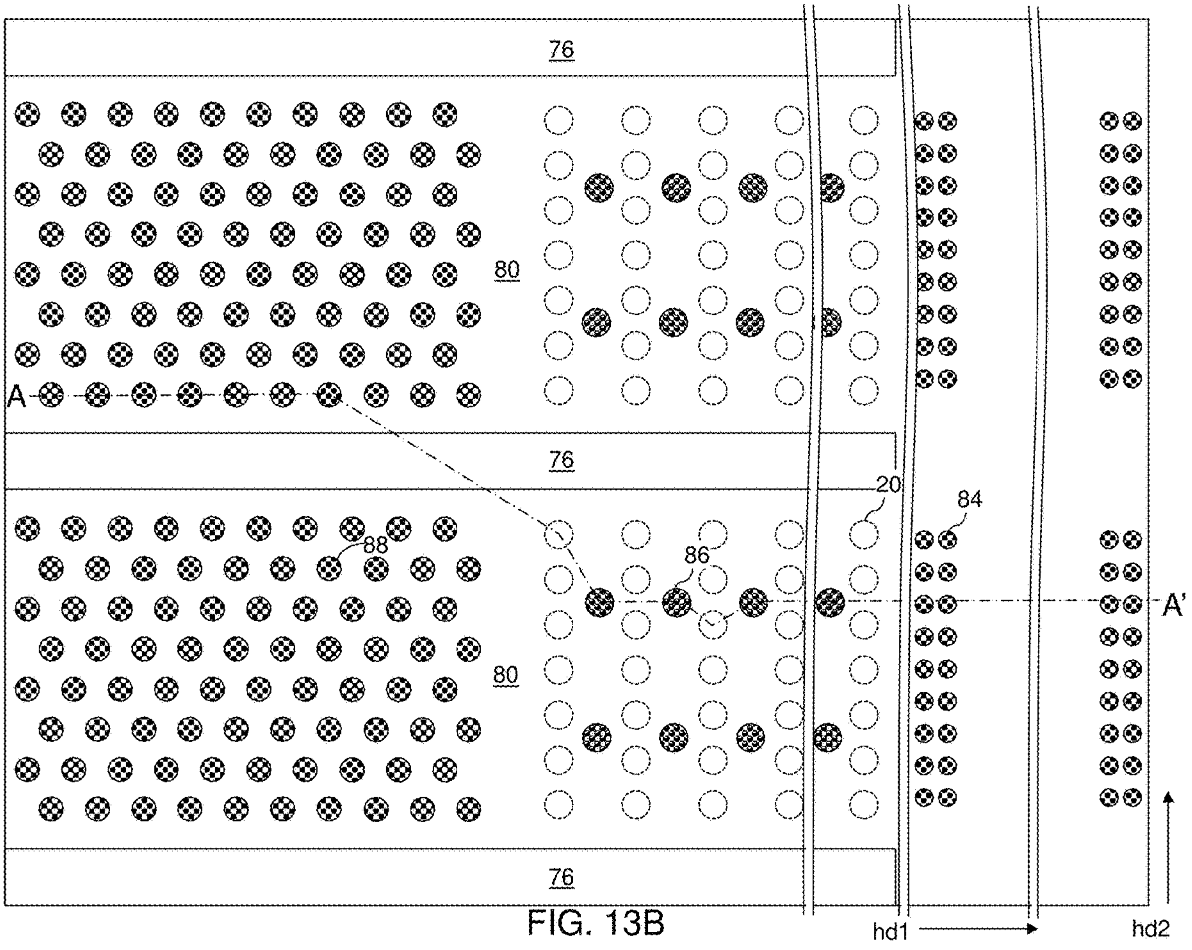
FIG. 13B is a top-down view of the first exemplary structure of FIG. 13A. The vertical plane A-A' is the cut plane of the vertical cross-sectional view of FIG. 13A.

Referring to FIGS. 13A and 13B, an insulating fill material may be conformally deposited in the lateral isolation trenches 79. Excess portions of the insulating fill material may be removed from above the contact-level dielectric layer 80, for example, by a recess etch process. Each remaining portion of the insulating fill material that fills a respective lateral isolation trench 79 constitutes an isolation trench fill structure 76. Alternatively, each isolation trench fill structure 76 may comprise a combination of a tubular insulating spacer (not expressly shown) and a conductive connection via structure (not expressly shown) that is laterally surrounded by the tubular insulating spacer. In summary, an isolation trench fill structure 76 having an insulating sidewall vertically extends from a bottommost surface of an alternating stack (32, 46) to a topmost surface of the alternating stack (32, 46).

A photoresist layer (not shown) can be applied over the contact-level dielectric layer 80, and can be lithographically patterned to form openings over each of the memory opening fill structures 58, over the horizontally-extending surfaces of the stepped surfaces in the contact region 300, and in the peripheral region 400. An anisotropic etch process can be performed to transfer the pattern of the openings in the photoresist layer through the contact-level dielectric layer 80 and the stepped dielectric material portion 65. Drain contact via cavities can be formed through the contact-level dielectric layer 80 over the memory opening fill structures 58. Layer contact via structures can be formed through the contact-level dielectric layer 80 and the stepped dielectric material portion 65 on a top surface of a respective one of the electrically conductive layers 46. Connection pad cavities are formed through the contact-level dielectric layer 80 and the stepped dielectric material portion 65 to a top surface of the source layer 110. The photoresist layer can be subsequently removed, for example, by ashing.

At least one conductive material, such as a combination of a metallic barrier material and a metallic fill material, can be deposited in the drain contact via cavities, the layer contact via cavities, and the connection pad cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fills the drain contact via cavities constitute drain contact via structures 88 contacting a top surface of a respective one of the drain regions 63. Remaining portions of the at least one conductive material that fills the layer contact via cavities constitute layer contact via structures 86 contacting a top surface of a respective one of the electrically conductive layers 46. Remaining portions of the at least one conductive material that fills the connection pad cavities constitute connection via structures 84 contacting a top surface of the source layer 110. In one embodiment, the connection via structures 84 may be formed as arrays of connection via structures 84.

Referring collectively to FIGS. 1-13B, a combination of a three-dimensional memory array and a dielectric material portion (such as a stepped dielectric material portion 65) can be formed on a first side of a source layer 110 that overlies a carrier substrate 9. The three-dimensional memory array comprises a three-dimensional array of memory elements embedded in an alternating stack (32, 46) of insulating layers 32 and electrically conductive layers 46 on the first side of a source layer 110, and the dielectric material portion is formed adjacent to the alternating stack (32, 46). The connection via structures 84 are formed through the dielectric material portion (such as a stepped dielectric material portion 65). In one embodiment, the electrically conductive layers 46 within the alternating stack (32, 46) have variable lateral extents that change with a vertical distance from the source layer 110. In one embodiment, the alternating stack (32, 46) comprises stepped surfaces, the dielectric material portion comprises a stepped dielectric material portion 65 that includes a first region that contacts the stepped surfaces of the alternating stack (32, 46) and a second region that is laterally offset from the first region and has a uniform thickness. The connection via structures 84 can vertically extend through the second region.

Figure 14A:
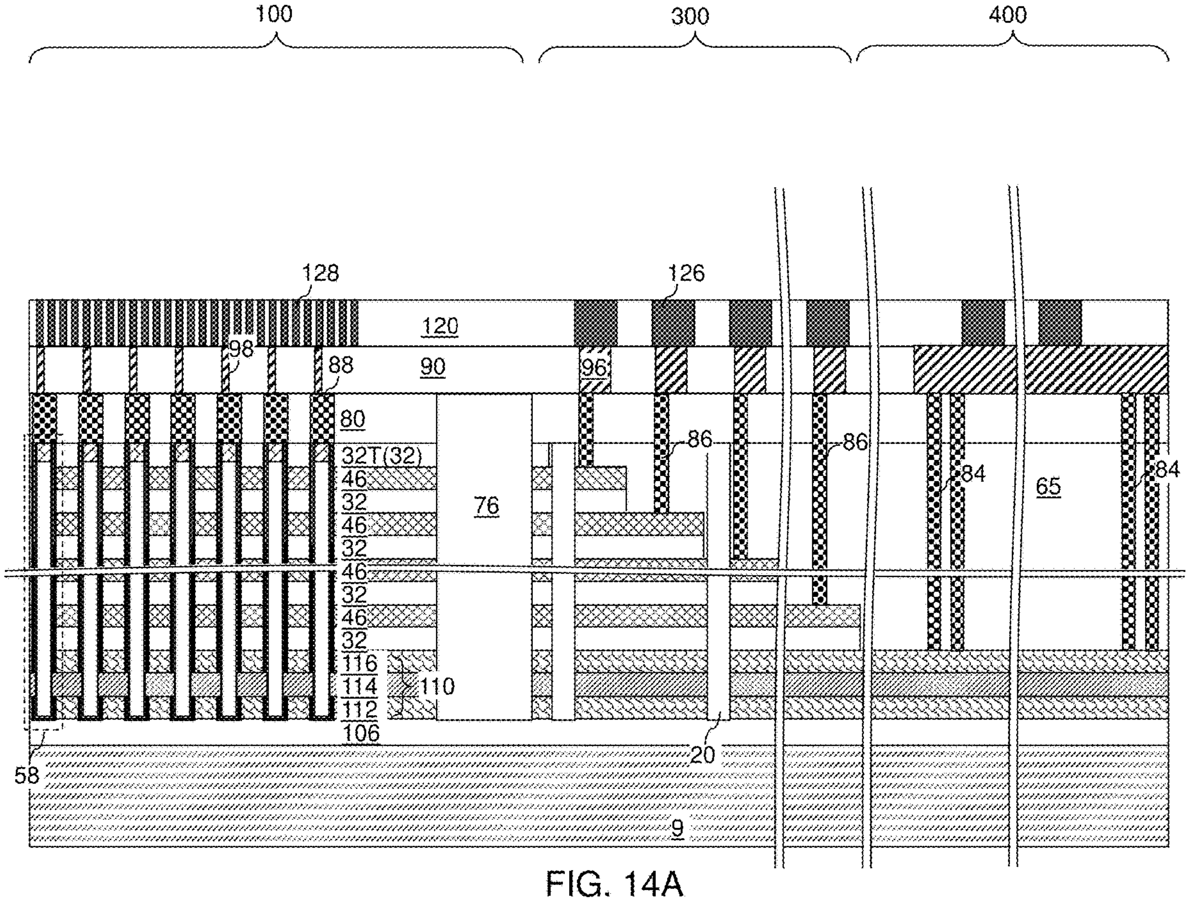
FIG. 14A is a vertical cross-sectional view of the first exemplary structure after formation of bit lines and bit-line-level metal lines according to an embodiment of the present disclosure.
Figure 14B:
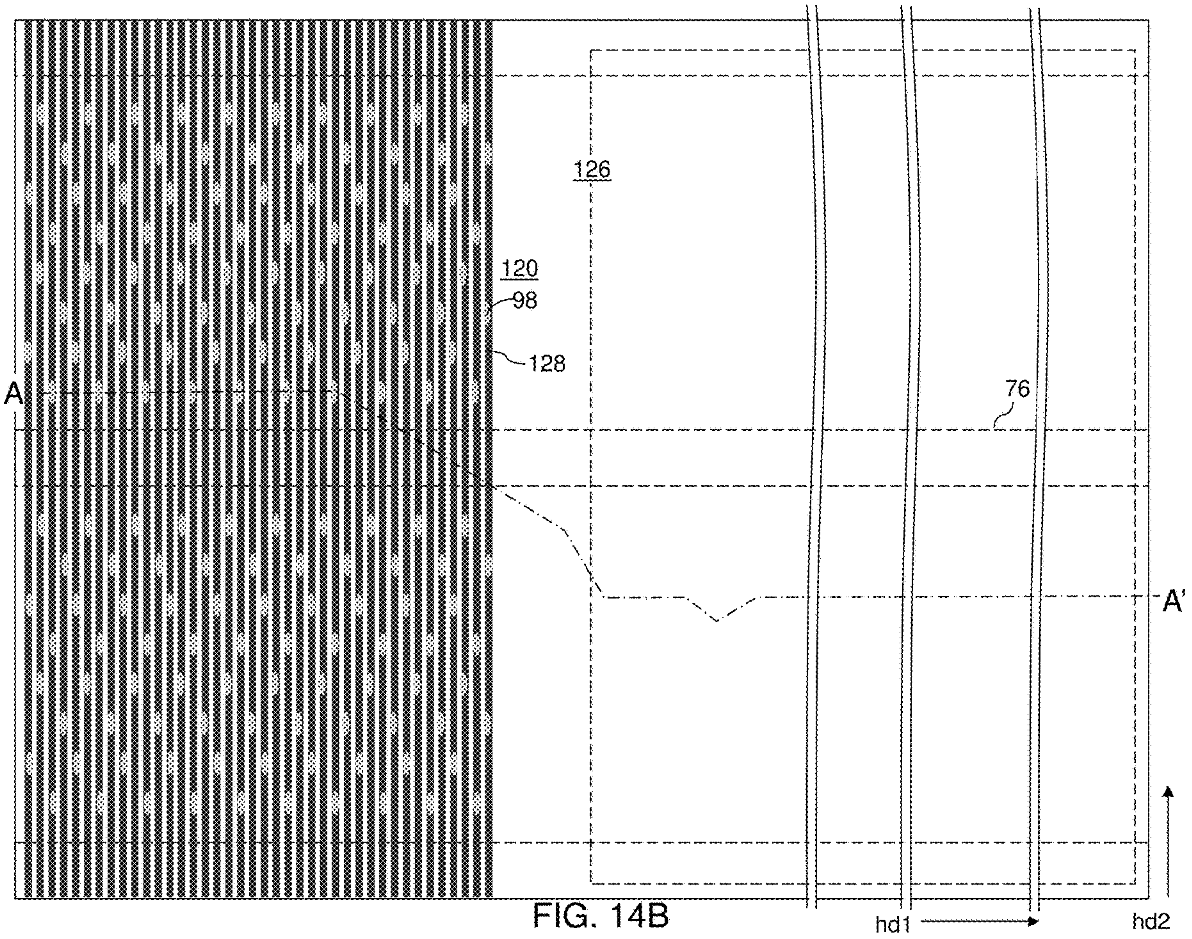
FIG. 14B is a top-down view of the first exemplary structure of FIG. 14A. The vertical plane A-A' is the cut plane of the vertical cross-sectional view of FIG. 14A.

Referring to FIGS. 14A and 14B, a connection-level dielectric layer 90 can be formed above the contact-level dielectric layer 80. Connection pad cavities can be formed through the connection-level dielectric layer 90, and can be filled with at least one conductive material (which may comprise at least one metallic material) to form connection-level via structures (98, 96). The connection-level via structures (98, 96) comprise drain connection via structures 98 that contact a respective one of the drain contact via structures 88, and layer connection via structures 96 that contact a respective one of the layer contact via structures 86.

A bit-line-level dielectric layer 120 can be formed above the connection-level dielectric layer 90. Bit-line-level line cavities can be formed through the bit-line-level dielectric layer 120, and can be filled with at least one conductive material (which may comprise at least one metallic material) to form bit-line-level metal lines (128, 126). The bit-line-level metal lines may comprise bit lines 128 that laterally extend along the second horizontal direction hd2, and bit-line-level interconnect metal lines 126 (not individually shown) that can be employed to provide electrical connection to the layer connection via structures 96.

Figure 15:
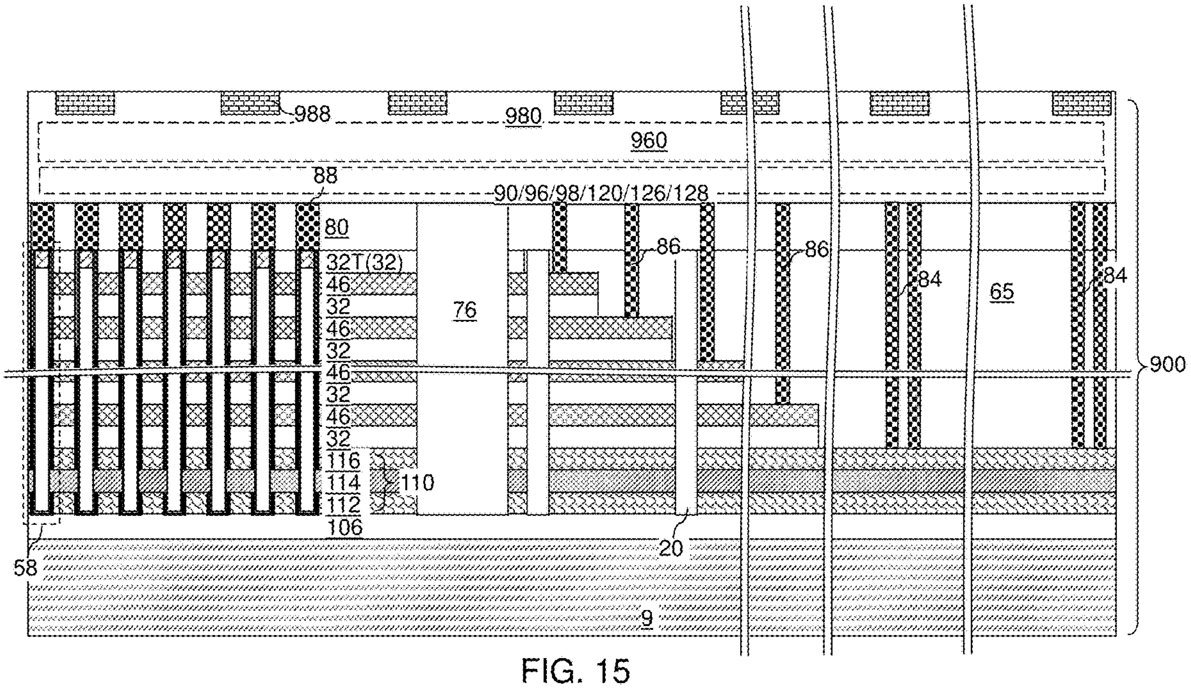
FIG. 15 is a vertical cross-sectional view of the first exemplary structure after formation of a memory die according to an embodiment of the present disclosure.

Referring to FIG. 15, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding the bit lines 128, which are a subset of the memory-side metal interconnect structures 980.

Metal bonding pads, which are herein referred to as memory-side bonding pads 988, may be formed at the topmost level of the memory-side dielectric material layers 960. The memory-side bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; a two-dimensional array of drain contact via structures 88 electrically connected to a respective one of the vertical semiconductor channels 60; and a two-dimensional array of layer contact via structures 86 electrically connected to a respective one of the electrically conductive layers 46, a subset of which functions as word lines for the three-dimensional memory array.

In summary, a three-dimensional memory array, a dielectric material portion comprising a stepped dielectric material portion 65, connection via structures 84 vertically extending through the stepped dielectric material portion 65, and memory-side bonding pads 988 can be provided in a memory die 900 comprising. In one embodiment, the memory die 900 further comprises memory-side dielectric material layers 960 and memory-side metal interconnect structures 980, and the memory-side bonding pads 988 are embedded within memory-side dielectric material layers 960. The three-dimensional memory array may include an alternating stack of insulating layers 32 and electrically conductive layers 46, and a two-dimensional array of NAND strings (e.g., the memory opening fill structures 58) vertically extending through the alternating stack (32, 46). In one embodiment, the electrically conductive layers 46 comprise word lines of the two-dimensional array of NAND strings. In one embodiment, the memory-side metal interconnect structures 980 comprise the bit lines 128 for the two-dimensional array of NAND strings.

Figure 16:
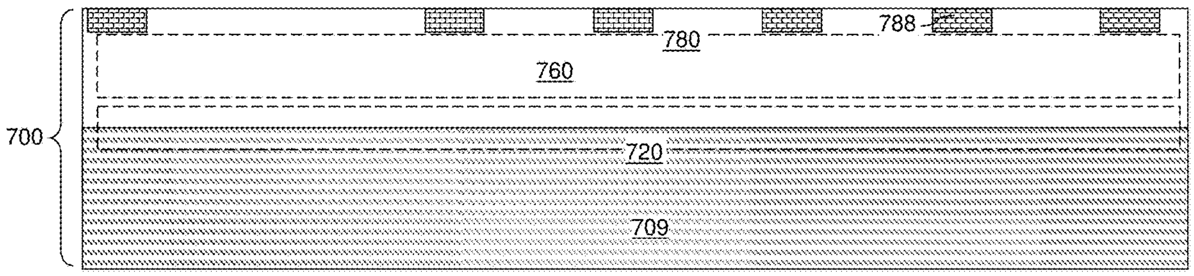
FIG. 16 is a vertical cross-sectional view of a logic die according to an embodiment of the present disclosure.

Referring to FIG. 16, a logic die 700 is provided. The logic die 700 comprises a peripheral circuit 720 that is formed on a logic-side substrate 709. According to an aspect of the present disclosure, the peripheral circuit 720 can be configured to control operation of the three-dimensional memory array in the memory die 900. For example, the peripheral circuit 720 may comprise word line driver regions, bit line driver regions, sense amplifier regions, input/output buffer regions, etc. Logic-side metal interconnect structures 780 embedded within logic-side dielectric material layers 760 can be formed over the peripheral circuit 720. The logic die 700 comprises logic-side bonding pads 788 embedded within logic-side dielectric material layers 760.

Figure 17:
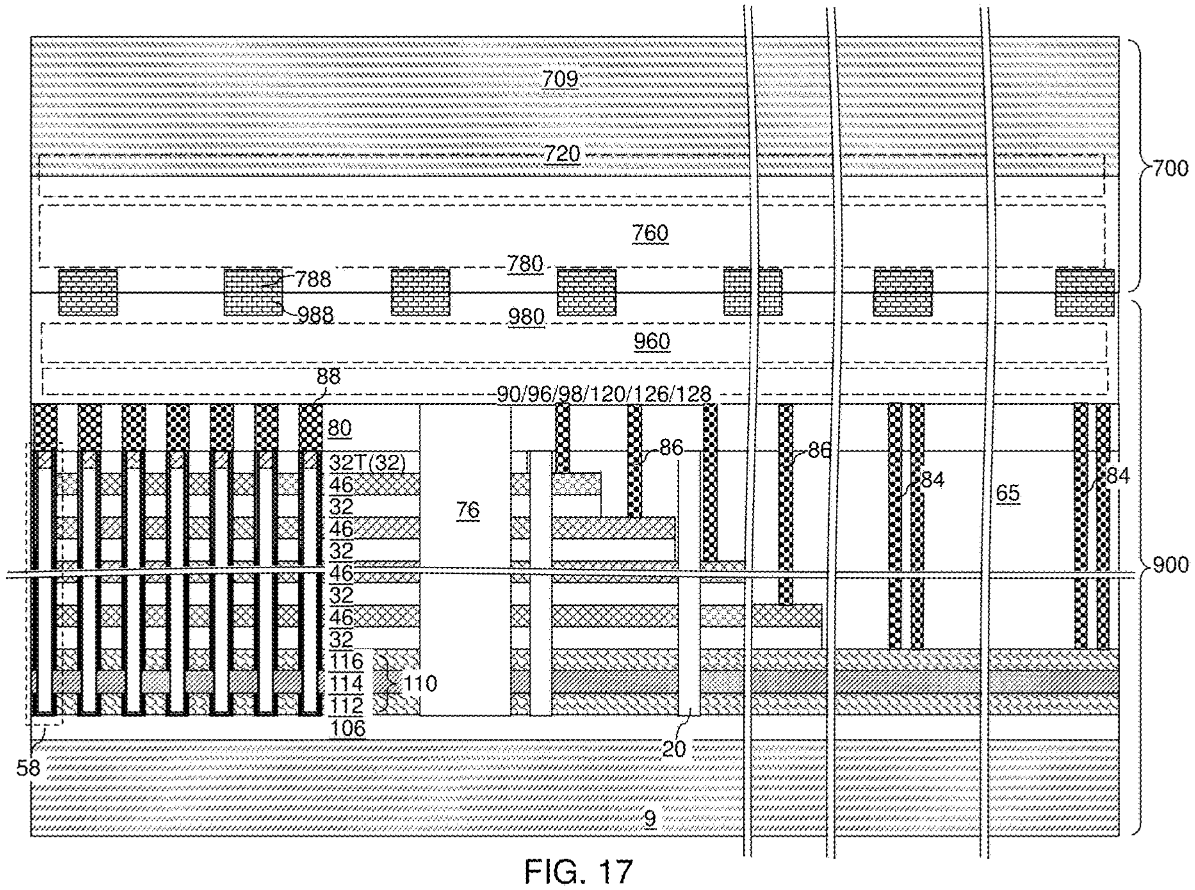
FIG. 17 is a vertical cross-sectional view of the first exemplary structure after formation of a bonded assembly of the memory die and the logic die according to an embodiment of the present disclosure.

Referring to FIG. 17, a bonded assembly can be formed by bonding a logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900. In one embodiment, the logic-side bonding pads 788 can be bonded to the memory-side bonding pads 988 by metal-to-metal bonding, such as copper-to-copper bonding.

Figure 18:
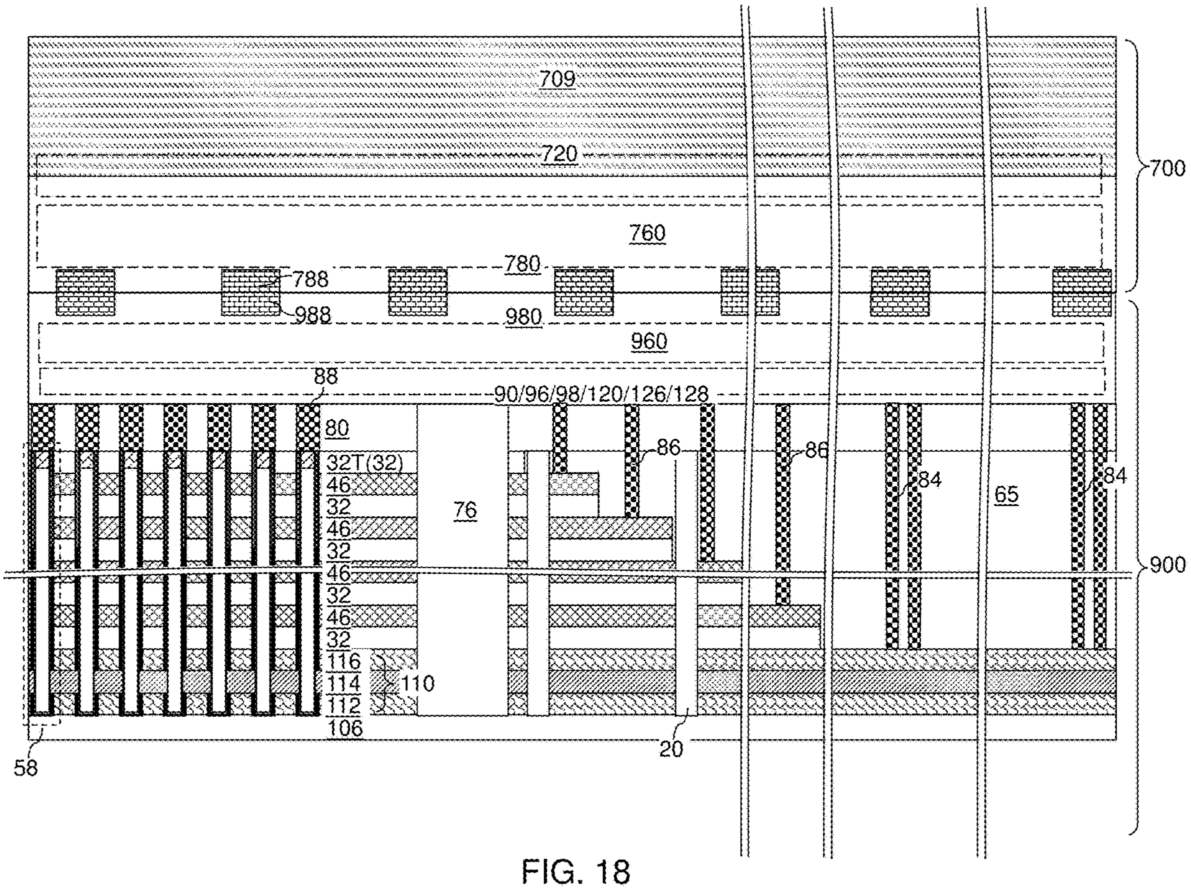
FIG. 18 is a vertical cross-sectional view of the first exemplary structure after removal of a carrier substrate from the memory die according to an embodiment of the present disclosure.

Referring to FIG. 18, the carrier substrate 9 may be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process such as a wet etch process is employed to remove the carrier substrate 9, the stopper insulating layer 106 may be subsequently employed as an etch stop material layer. Optional electrical contacts may be formed on the bottom side of the bonded assembly of the memory die 900 and the logic die 700.

Figure 19:
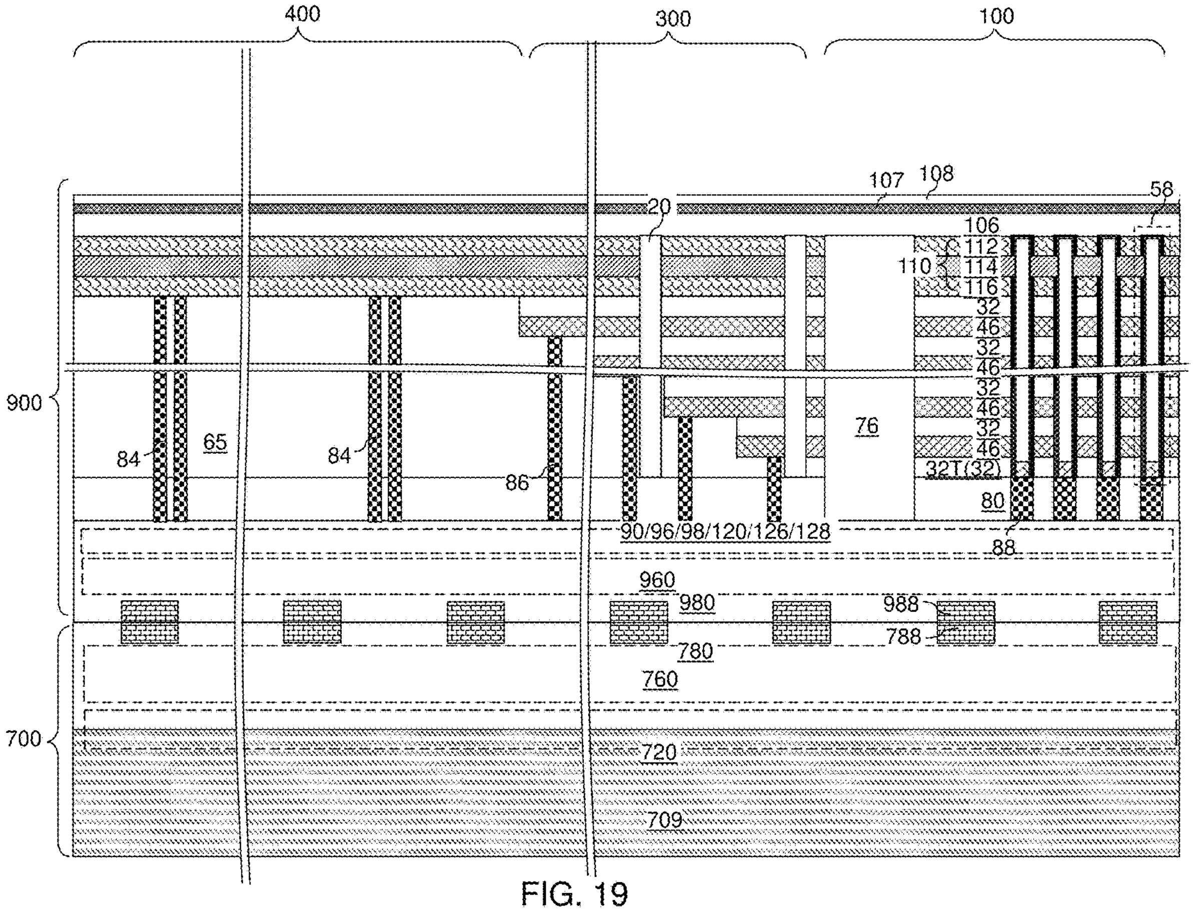
FIG. 19 is a vertical cross-sectional view of the first exemplary structure after formation of additional backside dielectric layers according to an embodiment of the present disclosure.

Referring to FIG. 19, backside dielectric layers (107, 108) can be deposited on the second side of the source layer 110. For example, the backside dielectric layers (107, 108) can be formed on the physically exposed surface (which may be referred to as a distal surface or a backside surface) of the stopper insulating layer 106. In one embodiment, the backside dielectric layers (107, 108) may comprise an optional first backside dielectric layer 107 and a second backside dielectric layer 108. In an illustrative example, the first backside dielectric layer (if present) 107 may comprise silicon nitride, silicon carbide nitride (i.e., silicon carbonitride), or any other suitable dielectric material, and may have a thickness in a range from 30 nm to 120 nm, although lesser and greater thicknesses may also be employed. The second backside dielectric layer 108 may comprise undoped silicate glass (i.e., silicon oxide) or a doped silicate glass, and may have a thickness in a range from 150 nm to 400 nm, although lesser and greater thicknesses may also be employed.

Figure 20A:
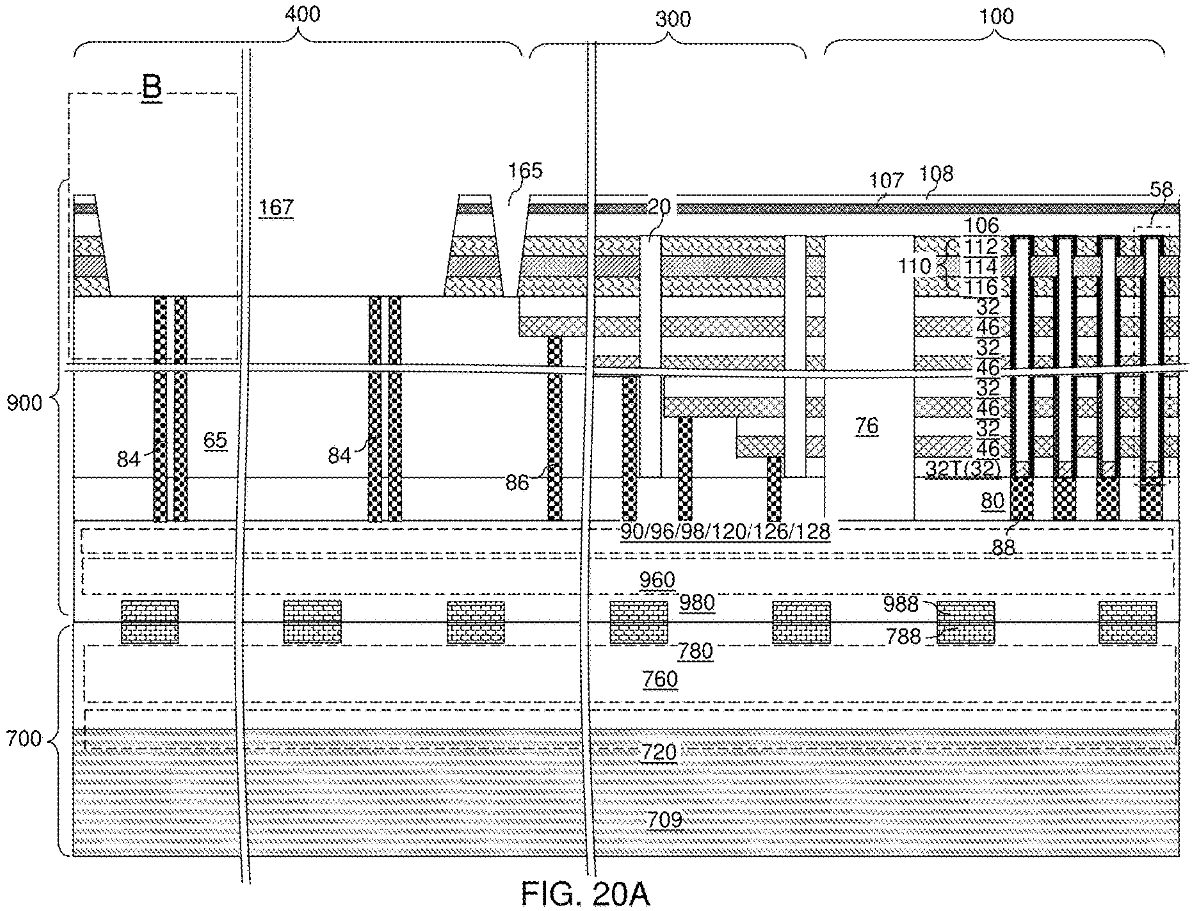
FIG. 20A is a vertical cross-sectional view of the first exemplary structure after formation of backside connection pad cavities according to an embodiment of the present disclosure.
Figure 20B:
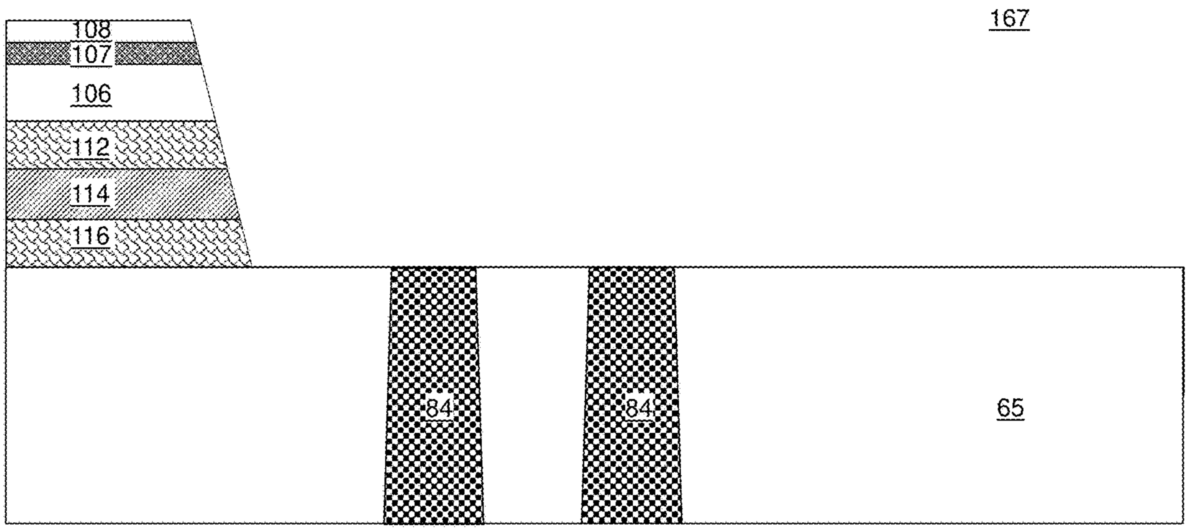
FIG. 20B is a magnified view of region B in FIG. 20A.
Figure 20C:
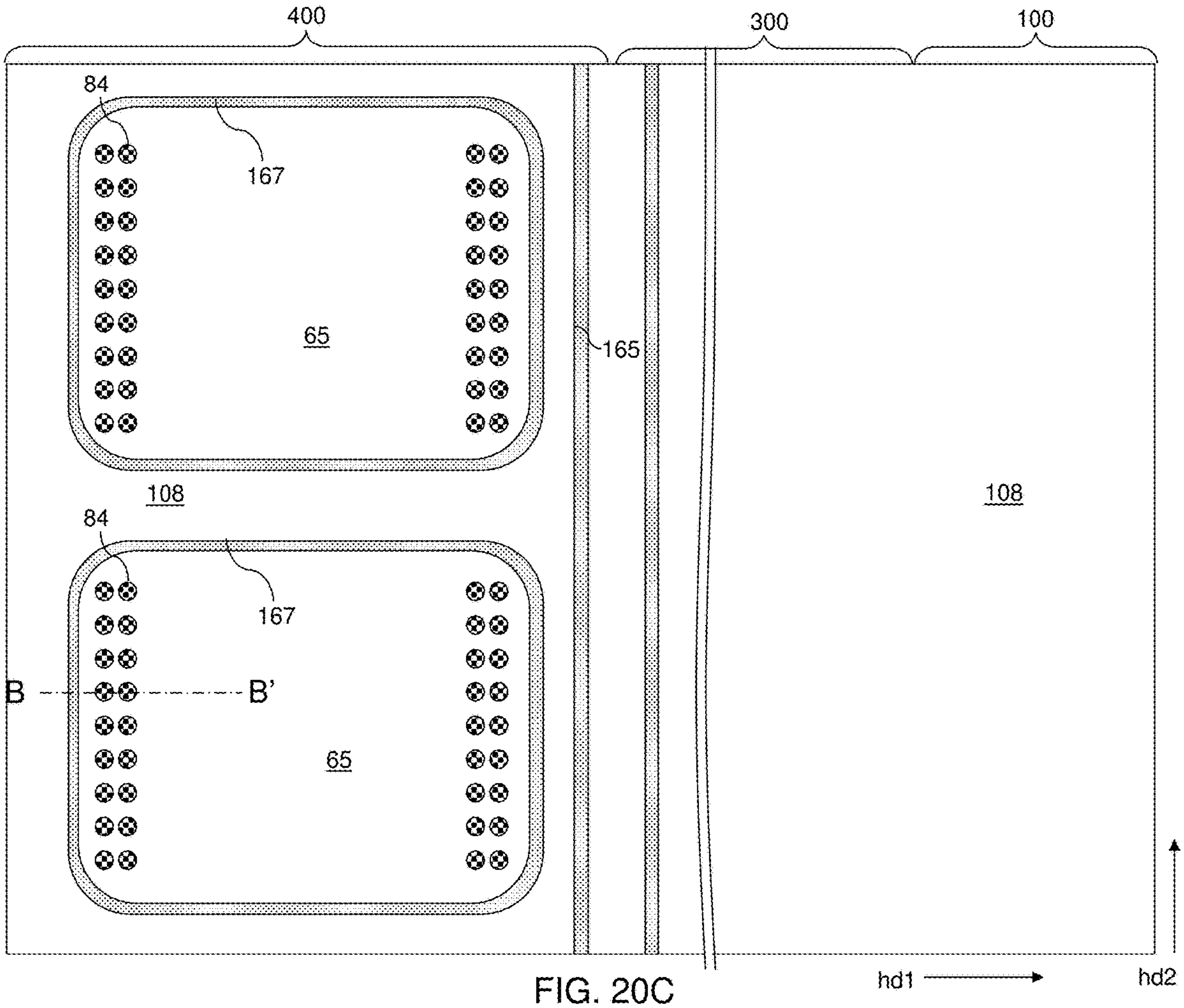
FIG. 20C is a top-down view of the first exemplary structure of FIG. 20A. The vertical cross-sectional plane B-B' corresponds to the cut plane for the view of FIG. 20B.

Referring to FIGS. 20A-20C, a photoresist layer (not shown) can be applied over the backside dielectric layers (107, 108), and can be lithographically patterned to form various openings in the peripheral region 400 and optionally at least one elongated opening at or adjacent to a boundary between the peripheral region 400 and the contact region 300. The openings in the peripheral region 400 can be formed over a respective subset of the connection via structures 84. In an illustrative example, each opening in the photoresist layer in the peripheral region 400 may have an areal overlap with two two-dimensional arrays of connection via structures 84.

An anisotropic etch process can be performed to transfer the pattern of the openings in the photoresist layer through the backside dielectric layers (107, 108), the stopper insulating layer 106, and the source layer 110. Backside connection pad cavities 167 vertically extend through the backside dielectric layers (107, 108), the stopper insulating layer 106, and the source layer 110. A row of backside connection pad cavities 167 arranged along the second horizontal direction hd2 may be formed within the peripheral region 400. In one embodiment, each of the backside connection pad cavities 167 may have a tapered sidewall. The taper angle of the tapered sidewall, as measured with respect to the vertical direction, may be in a range from 1 degree to 30 degrees, such as from 3 degrees to 15 degrees, although lesser and greater taper angles may also be employed.

Each backside connection pad cavity 167 may have a proximal periphery that is formed on a physically exposed surface (i.e., a distal surface) of the source layers 110, and may have a distal periphery that is formed on a distal surface of the backside dielectric layers (107, 108) (i.e., the top of the second backside dielectric layer 108). The shape of each distal periphery of the backside connection pad cavities 167 may be a rounded rectangle, a circle, an ellipse, or any other two-dimensional shape having a closed periphery.

At least one connection via structure 84 is physically exposed within each backside connection pad cavity 167. In one embodiment, at least one row of connection via structures 84 may be physically exposed within each backside connection pad cavity 167. In one embodiment, a plurality of rows of connection via structures 84 may be physically exposed within each backside connection pad cavity 167. In the illustrated example of FIG. 20C, two two-dimensional arrays of connection via structures 84 may be physically exposed within each backside connection pad cavity 167. In the illustrated example of FIG. 20C, each backside connection pad cavity 167 may have shape of a rounded rectangle in a plan view. In one embodiment, at least one separation trench 165 may be optionally formed between the peripheral region 400 and the contact region 300.

As used herein, in case an element other than the source layer 110 comprises more than two horizontal surfaces, a proximal horizontal surface refers to a horizontal surface that is proximal to the source layer 110, and a distal horizontal surface refers to a horizontal surface that is distal from the source layer 110. If an element other than the source layer 110 comprises multiple portions, a proximal portion refers to a portion that is proximal to the source layer 110, and a distal portion refers to a portion that is distal from the source layer 110.

Figure 21A:
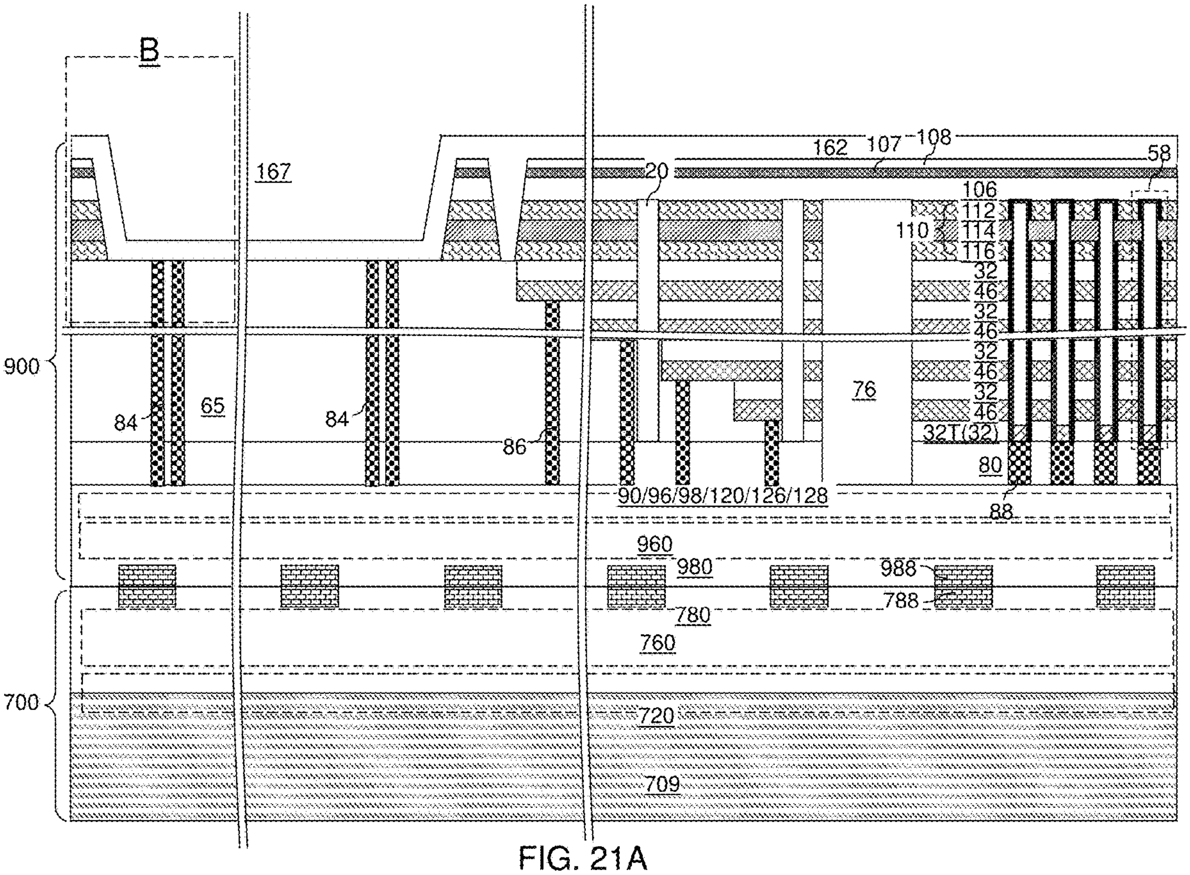
FIG. 21A is a vertical cross-sectional view of the first exemplary structure after formation of backside isolation layer according to an embodiment of the present disclosure.
Figure 21B:
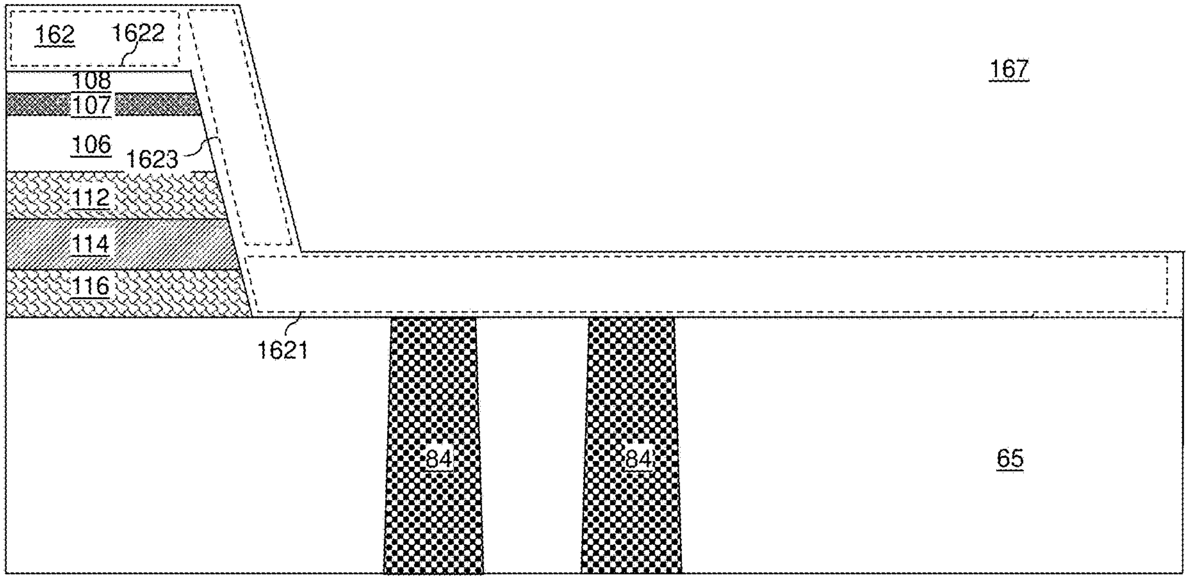
FIG. 21B is a magnified view of region B in FIG. 21A.
Figure 21C:
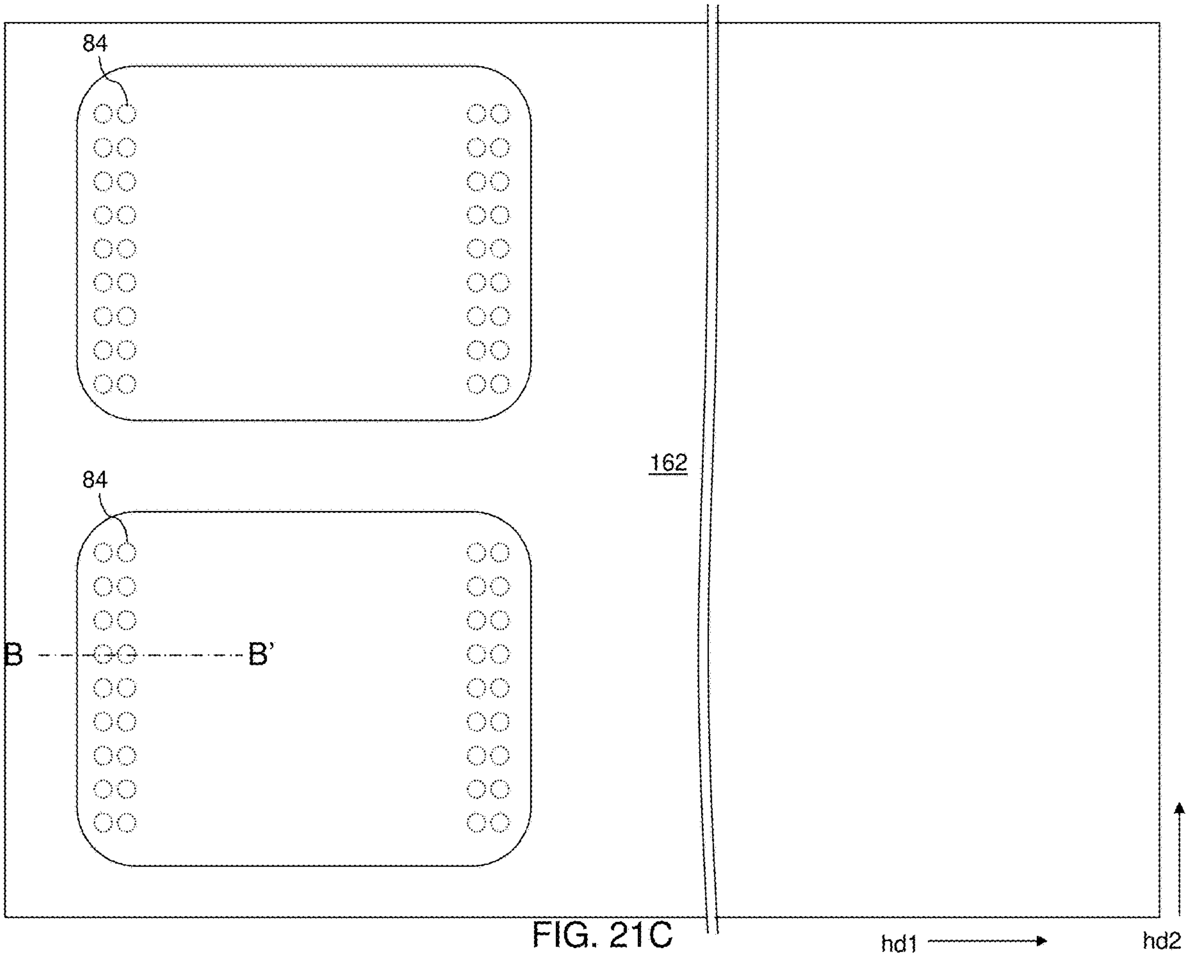
FIG. 21C is a top-down view of the first exemplary structure of FIG. 21A. The vertical cross-sectional plane B-B' corresponds to the cut plane for the view of FIG. 21B.

Referring to FIGS. 21A-21C, a backside isolation layer 162 can be deposited on the distal surface (i.e., a backside surface) of the backside dielectric layers (107, 108), on the physically exposed sidewalls of the backside dielectric layers (107, 108), the stopper insulating layer 106, and the source layer 110, and on the physically exposed surface segments of the stepped dielectric material portion 65. The backside isolation layer 162 comprises a dielectric material, such as undoped silicate glass or a doped silicate glass, and can be formed by chemical vapor deposition. The thickness of the horizontally-extending portions of the backside isolation layer 162 may be in a range from 200 nm to 1,000 nm, such as from 300 nm to 600 nm, although lesser and greater thicknesses may also be employed.

Referring to FIG. 21B, the backside isolation layer 162 comprises first horizontally-extending portions 1621 located within a respective one of the backside connection pad cavities 167, in direct contact with a respective horizontal surface segment of the stepped dielectric material portion 65, and optionally having a uniform vertical thickness throughout. The backside isolation layer 162 also comprises a second horizontally-extending portion 1622 that is located on the second side of the source layer 110 and contacting a distal horizontal surface of the backside dielectric layers (107, 108). The backside isolation layer 162 further comprises connecting portions 1623 that connect a respective one of the first horizontally-extending portions 1621 and the second horizontally-extending portion 1622, and overlying a respective sidewall of a layer stack including the source layer 110, the stopper insulating layer 106, and the backside dielectric layers (107, 108).

The backside isolation layer 162 is deposited directly on sidewalls of the source layer 110 and directly on the end surfaces of the connection via structures 84. A proximal horizontal surface of the second horizontally-extending portion 1622 of the backside isolation layer 162 can be formed directly on a distal horizontal surface of the backside dielectric layers (107, 108). Each connecting portion 1623 of the backside isolation layer 162 may have a respective outer sidewall which is formed directly on sidewalls of the backside dielectric layers (107, 108). Each connecting portion 1623 of the backside isolation layer 162 comprises an inner sidewall that is exposed to a remaining void of a respective backside connection pad cavity 167. The separation trench 165 may be completely filled with a portion of the backside isolation layer 162, as shown in FIG. 21A.

Figure 22A:
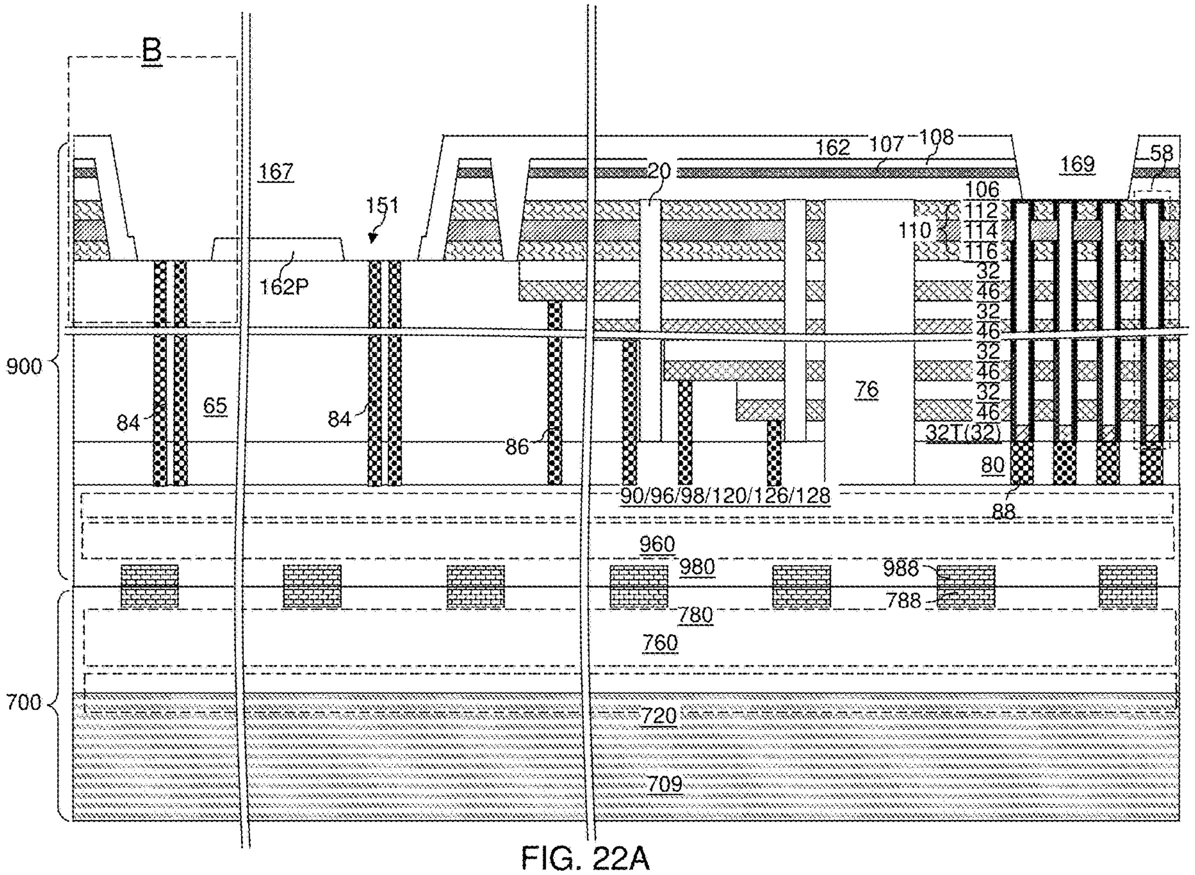
FIG. 22A is a vertical cross-sectional view of the first exemplary structure after patterning of backside isolation layer and the backside dielectric layers according to an embodiment of the present disclosure.
Figure 22B:
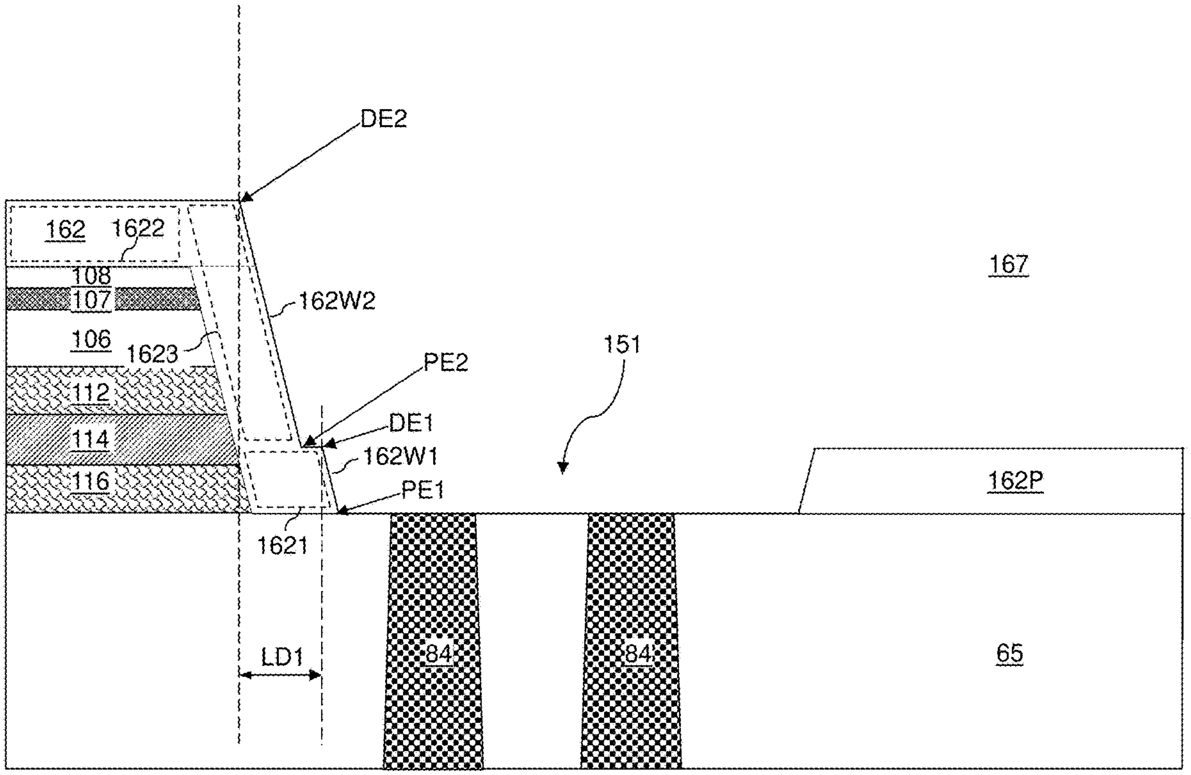
FIG. 22B is a magnified view of region B in FIG. 22A for the case in which the first exemplary structure has a first configuration.
Figure 22C:
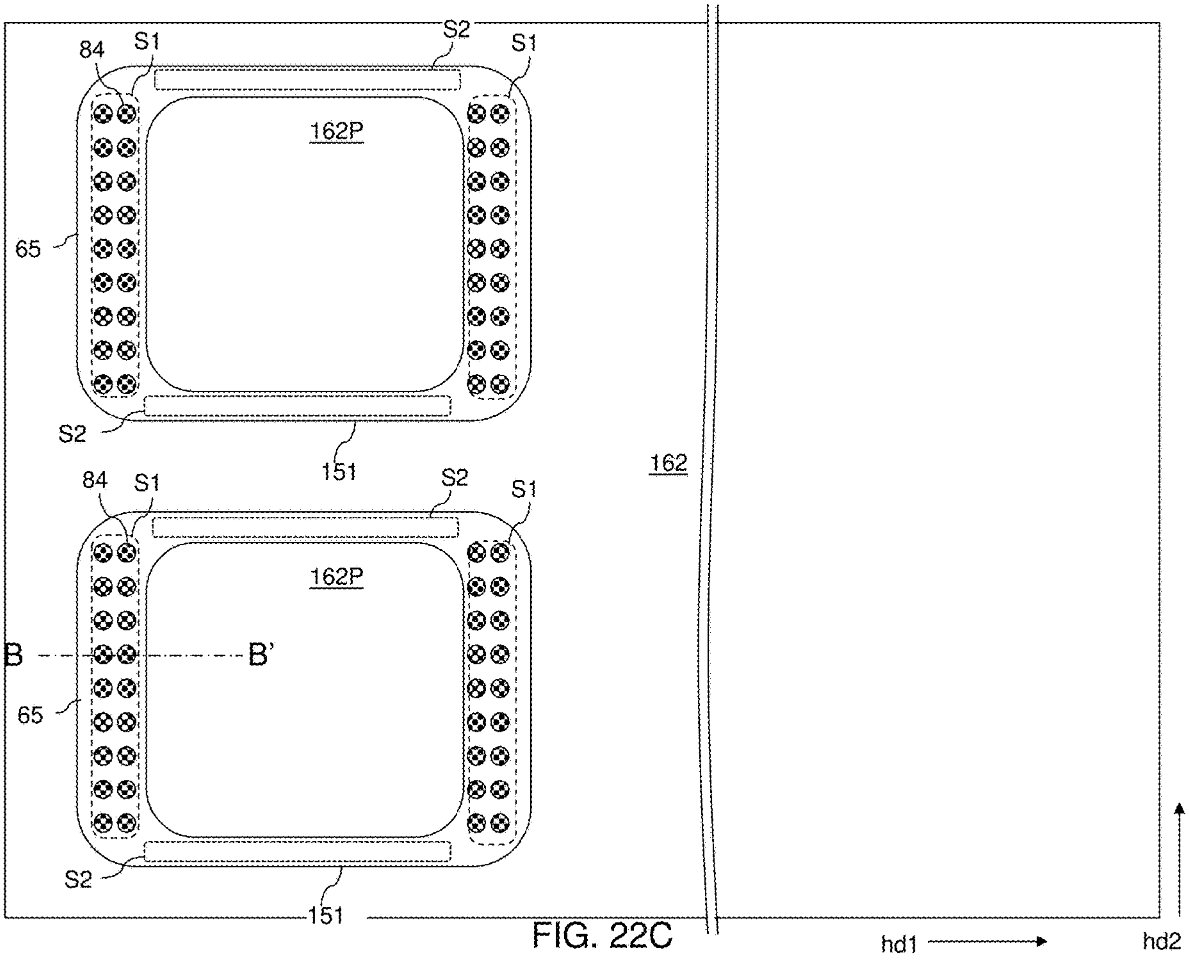
FIG. 22C is a top-down view of the first exemplary structure of FIG. 22A for the case in which the first exemplary structure has the first configuration. The vertical cross-sectional plane B-B' corresponds to the cut plane for the view of FIG. 22B.
Figure 22D:
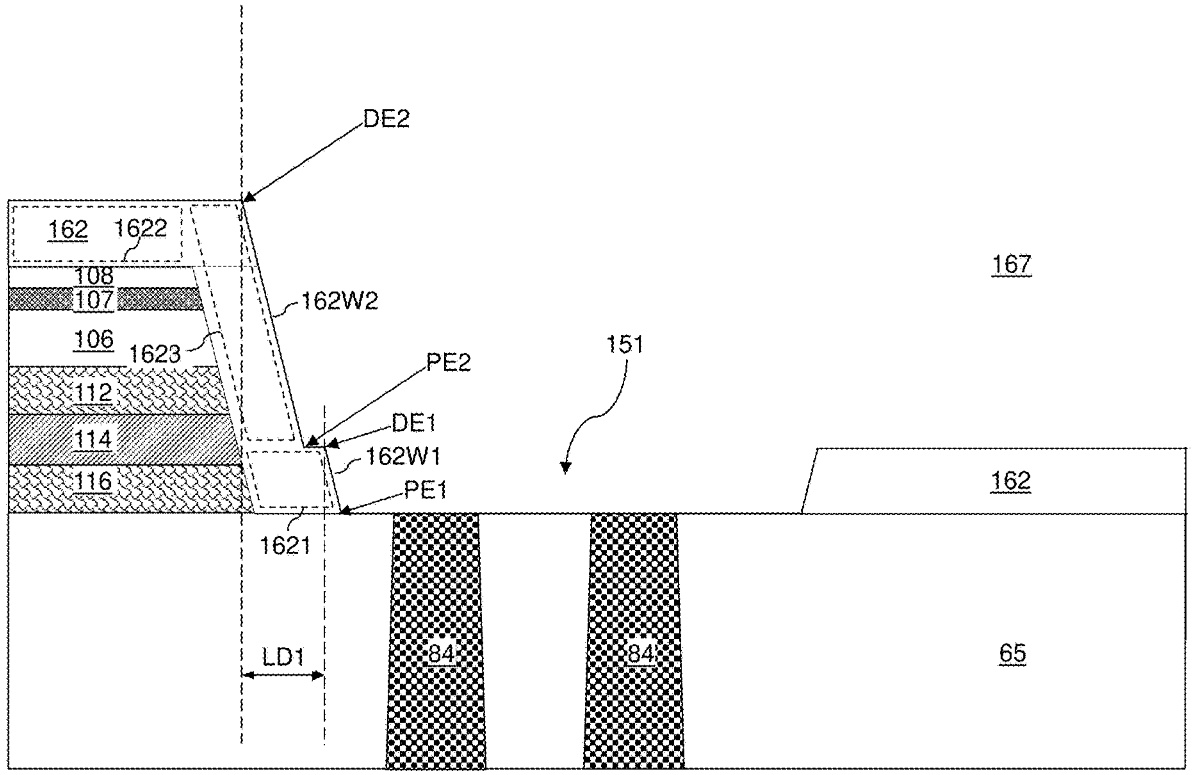
FIG. 22D is a magnified view of region B in FIG. 22A for the case in which the first exemplary structure has a second configuration.
Figure 22E:
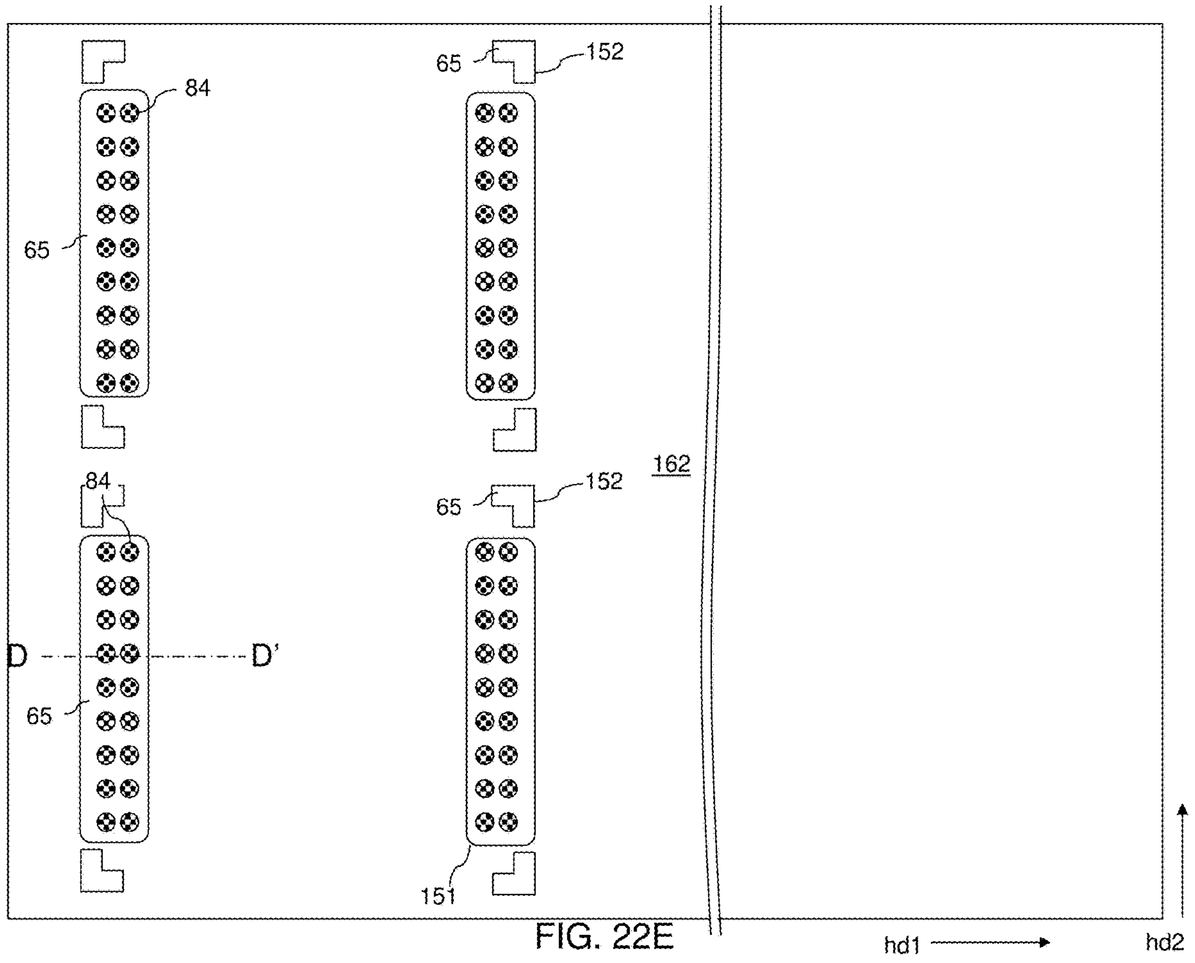
FIG. 22E is a top-down view of the first exemplary structure of FIG. 22A for the case in which the first exemplary structure has the second configuration. The vertical cross-sectional plane D-D' corresponds to the cut plane for the view of FIG. 22D.
Figure 22F:
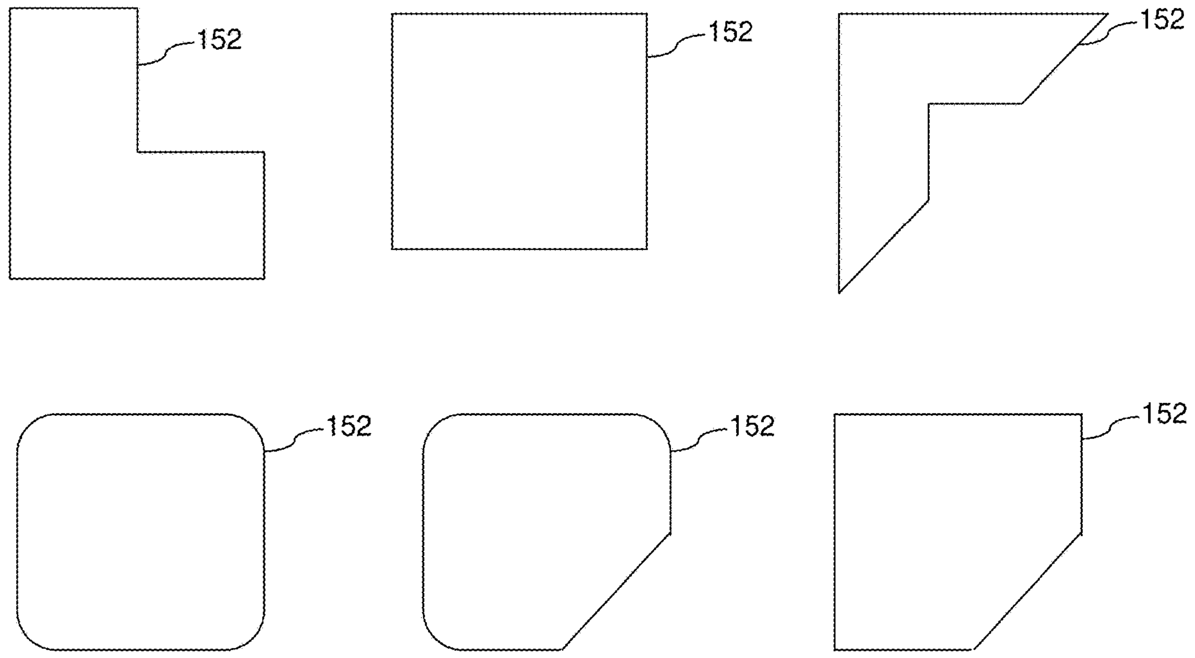
FIG. 22F are exemplary shapes for auxiliary openings through the backside isolation layer.

FIGS. 22A-22E are various views of the first exemplary structure after patterning of backside isolation layer 162, the backside dielectric layers (107, 108), and the stopper insulating layer 106. FIGS. 22B and 22C illustrate a first configuration of the first exemplary structure. FIGS. 22D and 22E illustrate a second configuration of the first exemplary structure. FIG. 22F illustrates various exemplary shapes for second-type openings 152 that may be employed in the second configuration of the first exemplary structure.

The first exemplary structure illustrated in FIGS. 22A-22E can be derived from the first exemplary structure illustrated in FIGS. 21A-21C by forming source connection pad cavities 169 over the three-dimensional array of memory elements in the memory array region 100, and by forming discrete openings (151, 152) within the first horizontally-extending portions of the backside isolation layer 162 that is in direct contact with the stepped dielectric material portion 65. The source connection pad cavities 169 may be formed prior to, during or after formation of the discrete openings (151, 152).

In an illustrative example, the source connection pad cavities 169 may be formed by applying a first photoresist layer over the backside isolation layer 162, by lithographically patterning the first photoresist layer to form openings over areas of the three-dimensional memory array, and by performing a first anisotropic etch process that forms source connection pad cavities 169. The first photoresist layer can be subsequently removed after formation of the source connection via cavities 169. The discrete openings (151, 152) within the first horizontally-extending portions 1621 of the backside isolation layer 162 may be formed by applying a second photoresist layer over the backside isolation layer 162, by lithographically patterning the second photoresist layer to form openings within the areas of the first horizontally-extending portions 1621 of the backside isolation layer 162, and by performing a second anisotropic etch process that transfer the pattern of the openings in the second photoresist layer through the first horizontally-extending portions 1621 of the backside isolation layer 162. The second photoresist layer can be subsequently removed after formation of the discrete openings (151, 152).

The locations of the discrete openings (151, 152) can be selected such that distal peripheries of the discrete openings (151, 152) are formed in close proximity to a most proximal inner sidewall of tapered portions (i.e., the connecting portions 1623) of the backside isolation layer 162 that overlies sidewalls of the source layer 110. Each discrete opening (151, 152) may comprise a respective proximal periphery that is adjoined to the stepped dielectric material portion 65, and a respective distal periphery that is spaced from the stepped dielectric material portion 65 by the thickness of the first horizontally-extending portions 1621 of the backside isolation layer 162. In one embodiment, the minimum lateral distance between each distal periphery of the discrete opening (151, 152) and a respective most proximal inner sidewall of the backside isolation layer 162 may be in a range from 5% to 100%, such as from 10% to 50%, and/or from 15% to 30%, of the vertical thickness of the first horizontally-extending portions of the backside isolation layer 162.

Referring to FIGS. 22B and 22D, within each region around a backside connection pad cavity 167, the backside isolation layer 162 comprises a first horizontally-extending portion 1621 located within the backside connection pad cavity 167 and comprising a first inner sidewall 162W1 having a first proximal edge PE1 that is in contact with a horizontal surface of the stepped dielectric material portion 65, and having a first distal edge DE1 that is spaced from the dielectric material portion by a vertical thickness of the first horizontally-extending portion 1621. Within each region around a backside connection pad cavity 167, the backside isolation layer 162 further comprises a second horizontally-extending portion 1622 that is located over the second side of the source layer 110 and contacting a distal surface of the backside dielectric layers (107, 108). Within each region around a backside connection pad cavity 167, the backside isolation layer 162 also comprises a connecting portion 1623 that connects the first horizontally-extending portion 1621 and the second horizontally-extending portion 1622 and comprises a second inner sidewall 162W2 having a second distal edge DE2 that is adjoined to a distal horizontal surface of the second horizontally-extending portion 1622 and having a second proximal edge PE2 that is vertically spaced from the dielectric material portion by the vertical thickness of the first horizontally-extending portion 1621.

A lateral distance between the first distal edge DE1 and the second distal edge DE2 within a backside connection pad cavity 167 is herein referred to as a first lateral distance LD1. The first lateral distance LD1 can be in a range from 20% to 200%, such as from 40% to 120%, of the thickness of the first horizontally-extending portion 1621 of the backside isolation layer 162. In an illustrative example, the first lateral distance LD1 may be in a range from 240 nm to 4,000 nm, such as from 360 nm to 3,000 nm, although lesser and greater values may also be employed.

The first distal edge DE1 and the second proximal edge PE2 may be located within a same horizontal plane, and may be laterally spaced apart from the stepped dielectric material portion 65 by the vertical thickness of the first horizontally-extending portions 1621 of the backside isolation layer 162. Generally, each second inner sidewall 162W2 of the backside isolation layer 162 may be formed upon deposition of the backside isolation layer 162 at the processing step described with reference to FIGS. 21A-21C, and each first inner sidewall 162W1 of the backside isolation layer 162 may be formed upon patterning of the backside isolation layer 162 at the processing steps described with reference to FIGS. 22A-22E.

The discrete openings (151, 152) comprise first-type openings 151 in both first and second configurations and optionally at least one second-type opening 152 (in the second configuration). End surfaces of a respective subset of the connection via structures 84 can be exposed within each first-type opening 151. The first exemplary structure may be formed in a first configuration illustrated in FIGS. 22B and 22C, or may be formed in a second configuration illustrated in FIGS. 22D and 22E.

In the first configuration of the first exemplary structure illustrated in FIGS. 22A, 22B, and 22C, at least one of the first-type openings 151 may be moat-shaped, i.e., may have a shape of a moat that separates a center area from a peripheral area. The inner periphery of each moat-shaped first-type opening 151 may have a shape of a rounded rectangle or a rectangle, and the outer periphery of each moat-shaped first-type opening 151 may have a shape of a rounded rectangle or a rectangle. End surfaces of at least one row of connection via structures 84 may be physically exposed within each moat-shaped first-type opening 151.

Each patterned remaining portion of the backside isolation layer 162 that is laterally surrounded by a respective moat-shaped first-type opening 151 constitutes a backside isolation plate 162P. The backside isolation plate 162P is located in a center region of a backside connection pad cavity 167, and contacts a horizontal surface of the stepped dielectric material portion 65. The backside isolation plate 162P is laterally spaced from a remaining portion of the backside isolation layer 162 that is located outside the outer periphery of the moat-shaped first-type opening 151 by a lateral gap, which is herein referred to as moat-shaped lateral gap.

In one embodiment shown in FIG. 22C, each moat-shaped first-type opening 151 in the first configuration of the first exemplary structure may comprise a pair of first strip regions S1 that laterally extend along the second horizontal direction hd2 and laterally spaced from each other along the first horizontal direction hd1, and may further comprise a pair of second strip regions S2 that laterally extend along the first horizontal direction hd1 and laterally spaced from each other along the second horizontal direction hd2. In one embodiment, end surfaces of an array of connection via structures 84 may be physically exposed within the area of each first strip region S1, but not in the second strip regions S2.

In the second configuration of the first exemplary structure illustrated in FIGS. 22A, 22D, and 22E, at least one of the first-type openings 151 and at least one second-type opening 152 may be formed within each backside connection pad cavity 167. Each first-type opening 151 may have a shape of a rounded rectangle, a rectangle, or any elongated shape such that a respective subset of the connection via structures 84 is physically exposed within each first-type opening 151. The at least one second-type opening 152 may be formed in proximity to corner regions of a respective backside connection pad cavity 167. The second-type openings 152 are formed in areas in which the connection via structures 84 are absent. Thus, the entirety of a surface that is exposed underneath each second-type opening 152 may be a surface segment of the stepped dielectric material portion 65.

In one embodiment, shown in FIG. 22E a pair of first-type openings 151 can be formed within the area of a backside connection via cavity 167. The pair of first-type openings 151 may be laterally spaced from each other by a remaining portion of the backside isolation layer 162 that contacts the stepped dielectric material portion 65. In other words, a portion of the backside isolation layer 162 may be located in a center region of a backside connection pad cavity 167, and may be connected to the second horizontally-extending portion 1622 of the backside isolation layer 162.

The second-type openings 152 can be subsequently employed to accommodate downward-protruding portions of backside connection pad structures. Various types of shapes may be employed for the second-type openings 152. Non-limiting examples of the horizontal cross-sectional shapes of the second-type openings 152 are illustrated in FIG. 22F.

In the second configuration of the first exemplary structure shown in FIG. 22D, each first-type opening 151 can be formed through a respective first horizontally-extending portion 1621 of the backside isolation layer 162 such that end surfaces of a respective subset of the connection via structures 84 are exposed within the first-type opening 151. Each second-type opening 152 can be formed through a respective first horizontally-extending portion 1621 of the backside isolation layer 162 such that an entirety of a physically-exposed surface within the second-type opening 152 comprises or consists only of a surface of the stepped dielectric material portion 65. In one embodiment, within each backside connection via cavity 167, a pair of first-type openings 151 can be formed through a first horizontally-extending portion 1621 of the backside isolation layer 162 such that end surfaces of a respective subset of the connection via structures 84 are exposed within each first-type opening 151. Within each backside connection via cavity 167, a plurality of second-type openings 152 can also be formed through a first horizontally-extending portion 1621 of the backside isolation layer 162 such that an entirety of a physically-exposed surface within each second-type opening 152 comprises or consists only of a surface of the stepped dielectric material portion 65.

Figure 23A:
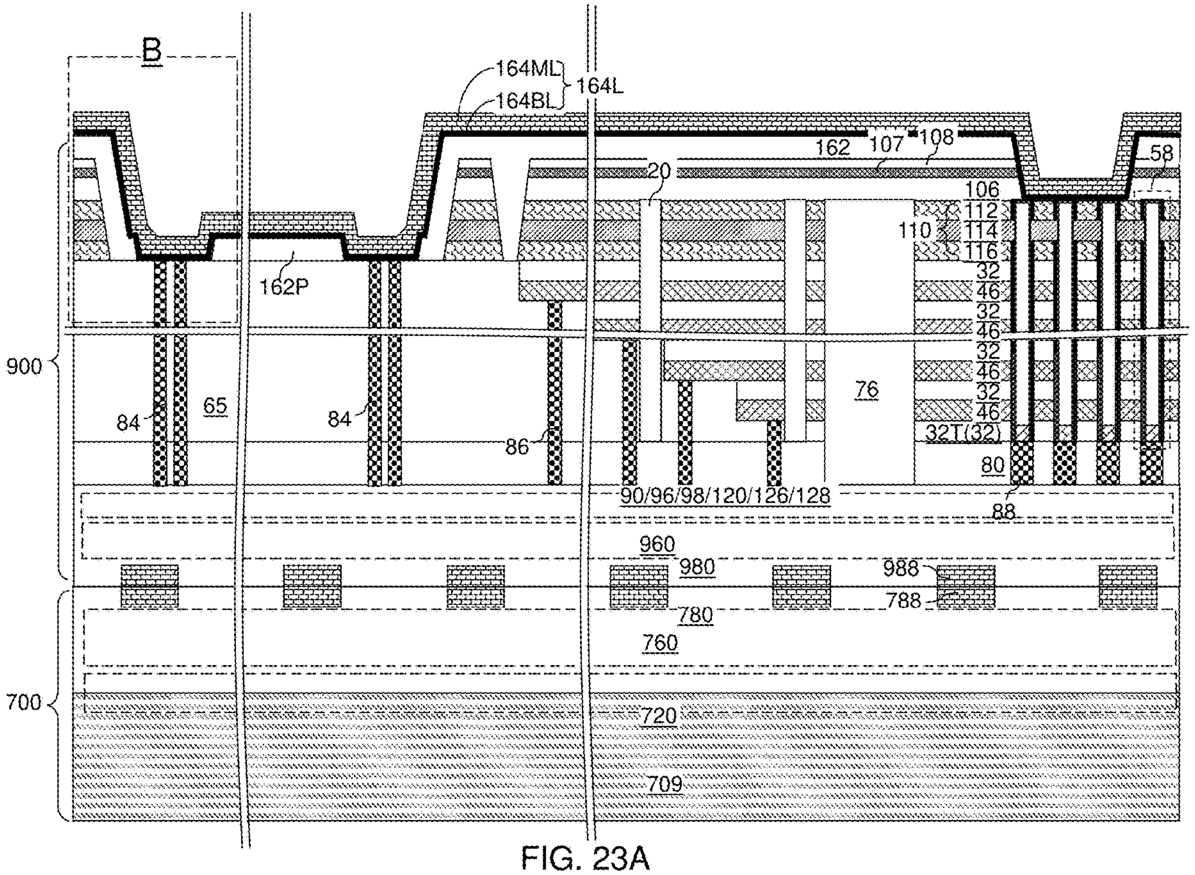
FIG. 23A is a vertical cross-sectional view of the first exemplary structure after formation of a backside connection pad layer according to an embodiment of the present disclosure.
Figure 23B:
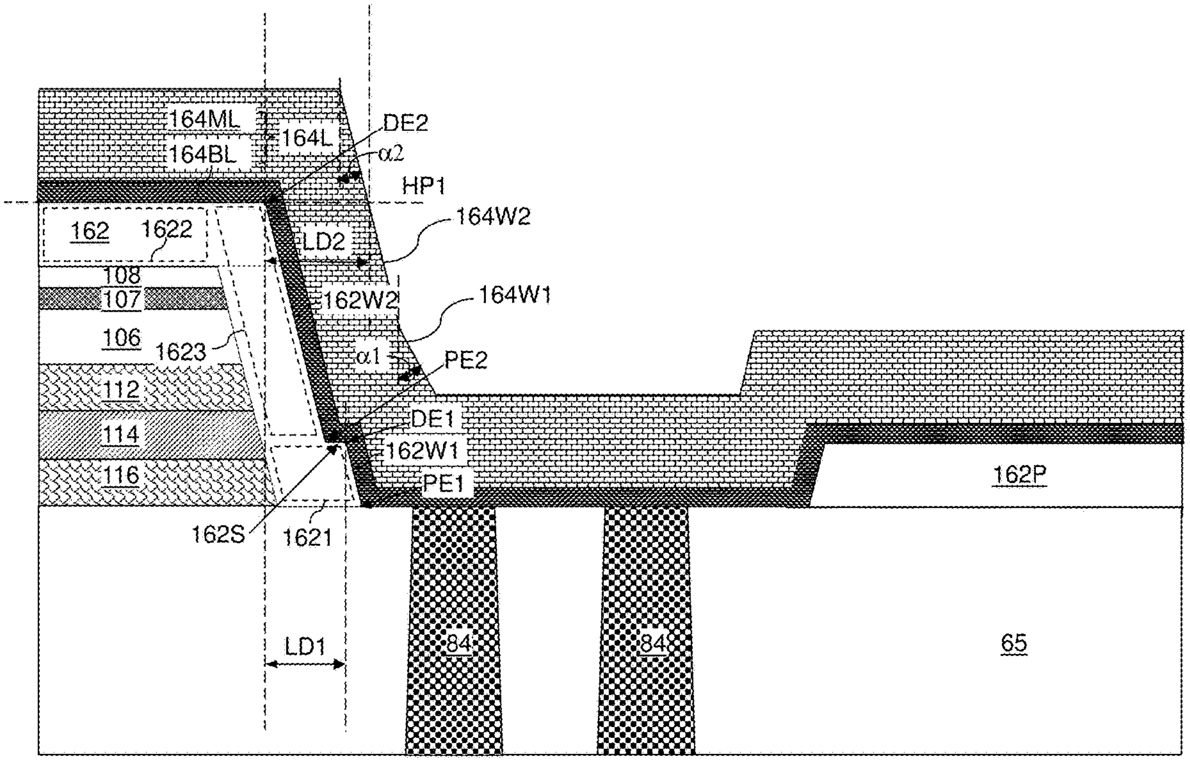
FIG. 23B is a magnified view of region B in FIG. 23A for the case in which the first exemplary structure has the first configuration.
Figure 23C:
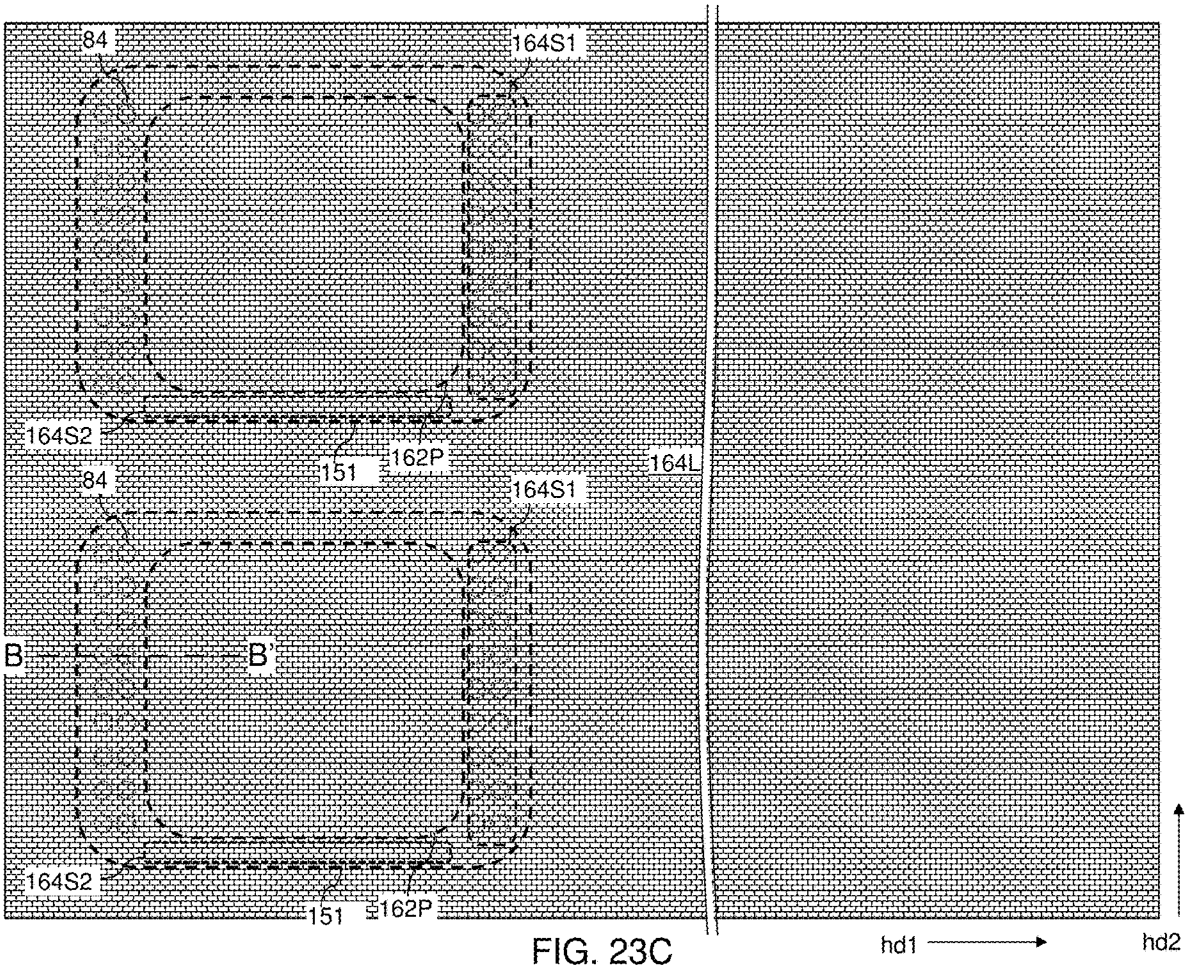
FIG. 23C is a top-down view of the first exemplary structure of FIG. 23A for the case in which the first exemplary structure has the first configuration. The vertical cross-sectional plane B-B' corresponds to the cut plane for the view of FIG. 23B.
Figure 23D:
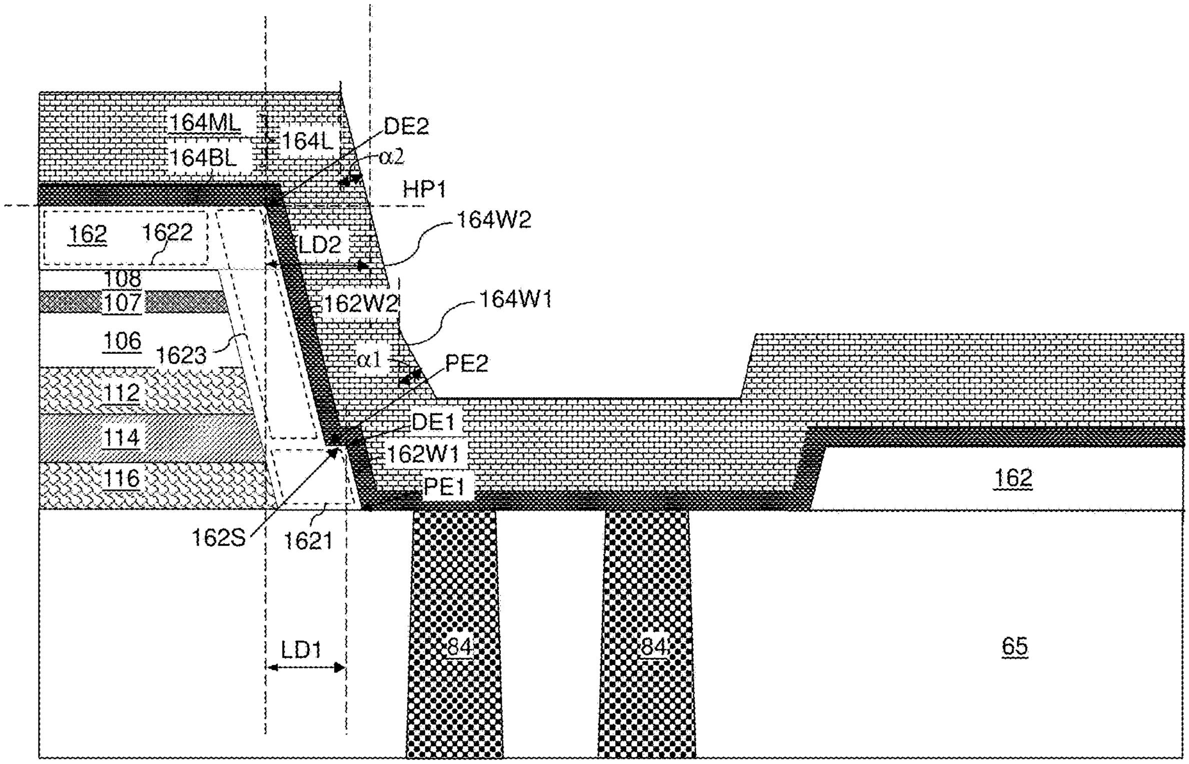
FIG. 23D is a magnified view of region B in FIG. 23A for the case in which the first exemplary structure has a second configuration.
Figure 23E:
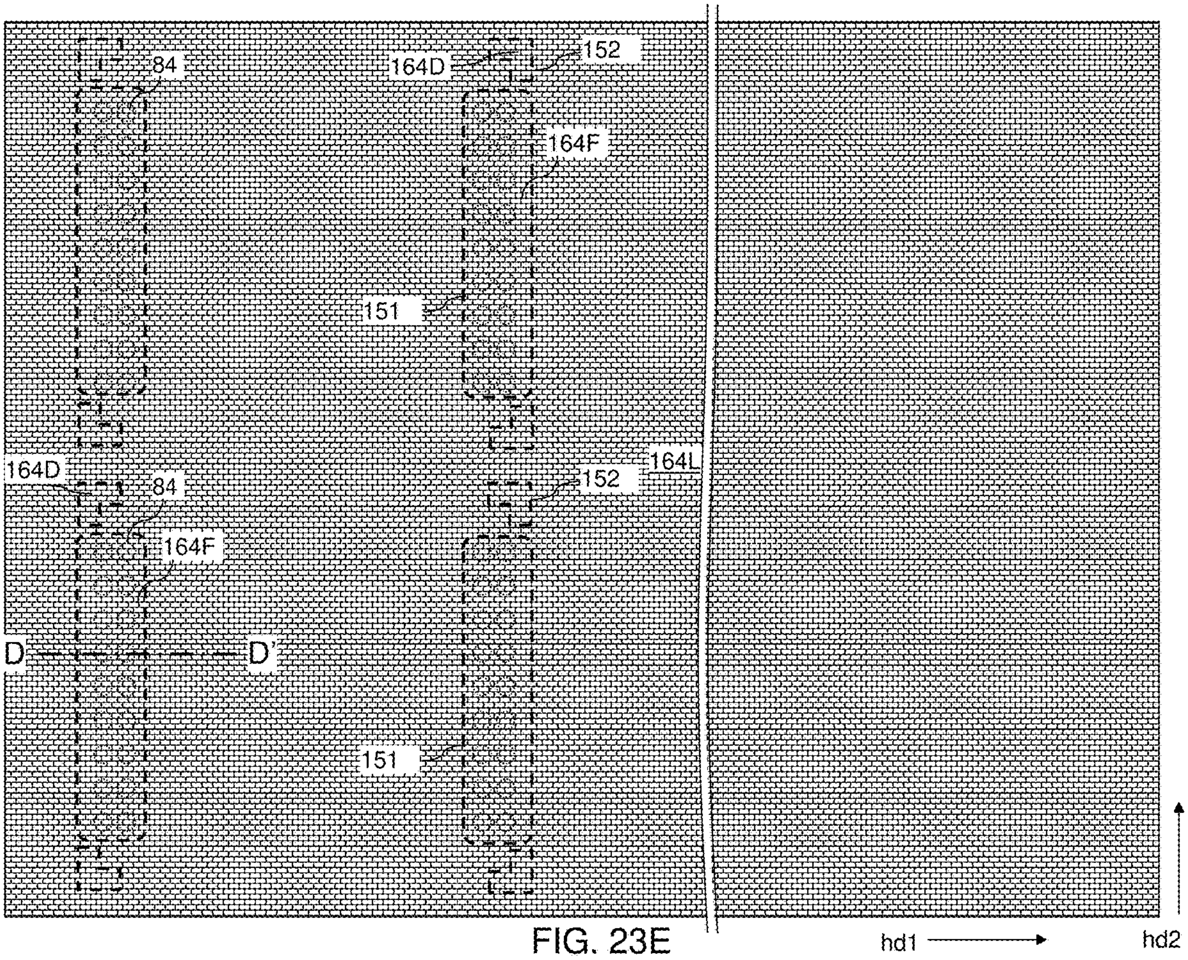
FIG. 23E is a top-down view of the first exemplary structure of FIG. 23A for the case in which the first exemplary structure has the second configuration. The vertical cross-sectional plane D-D' corresponds to the cut plane for the view of FIG. 23D.

FIGS. 23A-23E are various views of the first exemplary structure after formation of a backside connection pad layer 164L. FIGS. 23B and 23C illustrate the first configuration of the first exemplary structure. FIGS. 23D and 23E illustrate the second configuration of the first exemplary structure.

The backside connection pad layer 164L can be formed by depositing a backside metallic barrier liner layer 164BL and a backside metallic material layer 164ML. The backside metallic barrier liner layer 164BL comprises at least one metallic barrier material that can function as an adhesion promoter material and as a metallic diffusion barrier material. For example, the backside metallic barrier liner layer 164BL may comprise a combination of an adhesion promotion metal such as Ti or Ta, and a conductive metallic nitride material such as WN, TiN, TaN, MoN, or a layer stack thereof. In an illustrative example, the backside metallic barrier liner layer 164BL may comprise a layer stack of a titanium layer and a titanium nitride layer. The backside metallic barrier liner layer 164BL may be deposited by physical vapor deposition. The thickness of the backside metallic barrier liner layer 164BL may be in a range from 10 nm to 100 nm, such as from 20 nm to 50 nm, although lesser and greater thicknesses may also be employed. The backside metallic material layer 164ML comprises a metal that provides high electrical conductivity. For example, the backside metallic material layer 164ML may comprise and/or may consist essentially of aluminum, copper, tungsten, etc.

Referring to FIGS. 23B and 23D, the thickness of the backside connection pad layer 164L can be the same as the sum of the thickness of the backside metallic barrier liner layer 164BL and the thickness of the backside metallic material layer 164ML. The lateral thickness of the backside connection pad layer 164L within a first horizontal plane HP1 including the distal horizontal surface of the backside isolation layer 162 is herein referred to as a second lateral distance LD2. In one embodiment, the thickness of horizontally-extending portions and tapered portions of the backside connection pad layer 164L may be in a range from 400 nm to 2,000 nm, such as from 600 nm to 1,000 nm, although lesser and greater thicknesses may also be employed.

Referring to FIGS. 23B and 23D, the second lateral distance LD2 is greater than the first lateral distance LD1. For example, LD2 may be greater than LD1 by at least 5%, such as by at least 10%, for example, by 5% to 100%, such as by 10% to 50%. The lateral distance between the first distal edge DE1 and the second proximal edge PE2 is less than the first lateral distance LD1, and is less than the second lateral distance LD2. An upper portion of each inner sidewall of the backside connection pad layer 164L that overlies a first distal edge DE1 of the backside isolation layer 162 can be formed without any horizontal step.

In one embodiment, an inner sidewall of the backside connection pad layer 164L may have a first inner sidewall segment 164W1 adjoined to a proximal horizontally-extending portion of the backside connection pad layer 164L that contacts connection via structures and a second inner sidewall segment 164W2 adjoined to a distal horizontally-extending portion of the backside connection pad layer 164L that overlies the second horizontally-extending portion of the backside isolation layer 162. The first inner sidewall segment 164W1 may have a first taper angle a1 with respect to the vertical direction, and the second inner sidewall segment 164W2 may have a second taper angle a2 with respect to the vertical direction. As discussed above, the thickness of the backside connection pad layer 164L can be selected such that the second lateral distance LD2 is greater than the first lateral distance LD1. This condition induces the first taper angle a1 to be greater than second taper angle a2. The difference between the first taper angle a1 and the second taper angle a2 may be in a range from 1 degree to 30 degrees, such as from 3 degrees to 10 degrees. Presence of the first inner sidewall segment 164W1 having a greater taper angle than the second inner sidewall segment 164W2 has the effect of reducing mechanical stress at peripheral regions of proximal portions of the backside connection pad layer 164L that contact the stepped dielectric material portion 65. By forming a small step 162S in or at the bottom of the connecting portions 1623 of the backside isolation layer 162, but not in the backside metallic material layer 164ML, an overhang or lateral protrusion in the backside metallic material layer 164ML may be avoided. As noted above, the first lateral distance LD1 is the distance between a first distal edge DE1 and a second distal edge DE2 within a backside connection pad cavity 167. The first lateral distance LD1 may also be characterized as the sum of the width of the step 162S projected to the top of the backside isolation layer 162, and the second lateral distance LD2 may be the thickness of the backside connection pad layer 164L. If LD2 is greater than LD1, the sidewall of the backside connection pad layer 164L is sloped rather than laterally protruding. By avoiding the overhang or lateral protrusion, electromigration damage in the backside metallic material layer 164ML is reduced, and voids and/or cracks in a passivation dielectric material to be formed over the backside metallic material layer 164ML can also be reduced or avoided.

Each proximal portion of the backside connection pad layer 164L can be formed within the area laterally enclosed by a bottom periphery of a respective tapered sidewall portions of the backside connection pad layer 164L. Each proximal portion of the backside connection pad layer 164L comprises at least one first region in respective first-type opening 151 that contacts the end surfaces of a respective subset of the connection via structures 84.

In the first configuration of the first exemplary structure illustrated in FIG. 23C, the first-type openings 151 can be formed as moat-shaped openings. In this configuration, the first regions 164S1 are formed within the first strip regions S1 of the moat-shaped first-type openings 151. Additional dummy second regions 164S2 of the backside connection pad layer 164L are formed within the second strip regions S2 of the moat-shaped first-type openings 151, and do not contact the end surfaces of a respective subset of the connection via structures 84. The dummy second regions 164S2 of the backside connection pad layer 164L provide enhanced adhesion between the backside connection pad layer 164L and the stepped dielectric material portion 65, and redistribute and reduce the mechanical stress between the backside connection pad layer 164L and the combination of the stepped dielectric material portion 65, the source layer 110, the stopper insulating layer 106, and the backside dielectric layers (107, 108). Thus, the dummy second regions 164S2 reduce the likelihood of voids and/or cracks in the passivation dielectric material to be formed over the backside connection pad layer 164L.

In the second configuration of the exemplary structure illustrated in FIG. 23E, at least one first region 164F of the backside connection pad layer 164L in respective first-type opening 151 contacts the end surfaces of a respective subset of the connection via structures 84. Each proximal portion of the backside connection pad layer 164L further comprises at least one dummy second region 164D that is formed within a respective second-type opening 152 in the backside isolation layer 162 and contacting the stepped dielectric material portion 65, and not contacting the end surfaces of a respective subset of the connection via structures 84. The dummy second regions 164D reduce the likelihood of voids and/or cracks in the passivation dielectric material to be formed over the backside connection pad layer 164L.

Figure 24A:
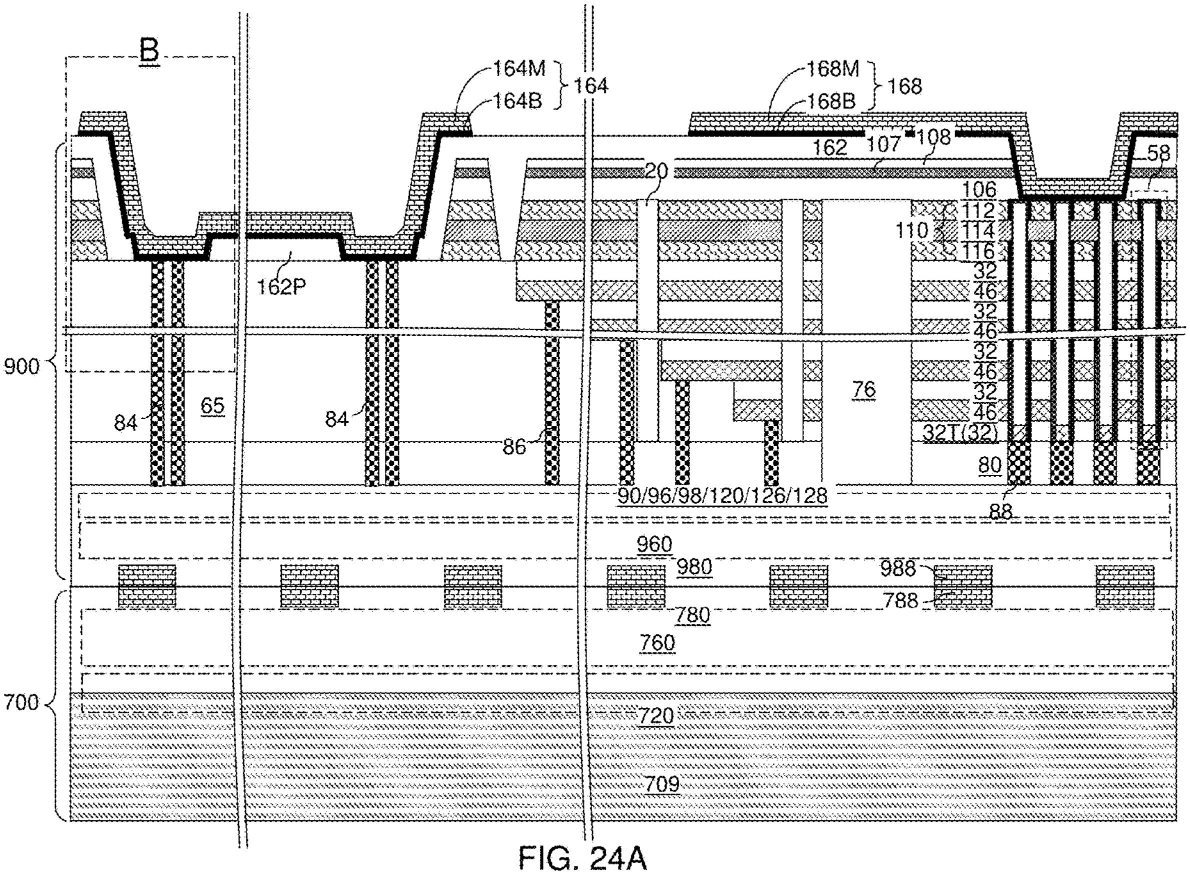
FIG. 24A is a vertical cross-sectional view of the first exemplary structure after patterning the backside connection pad layer according to an embodiment of the present disclosure.
Figure 24B:
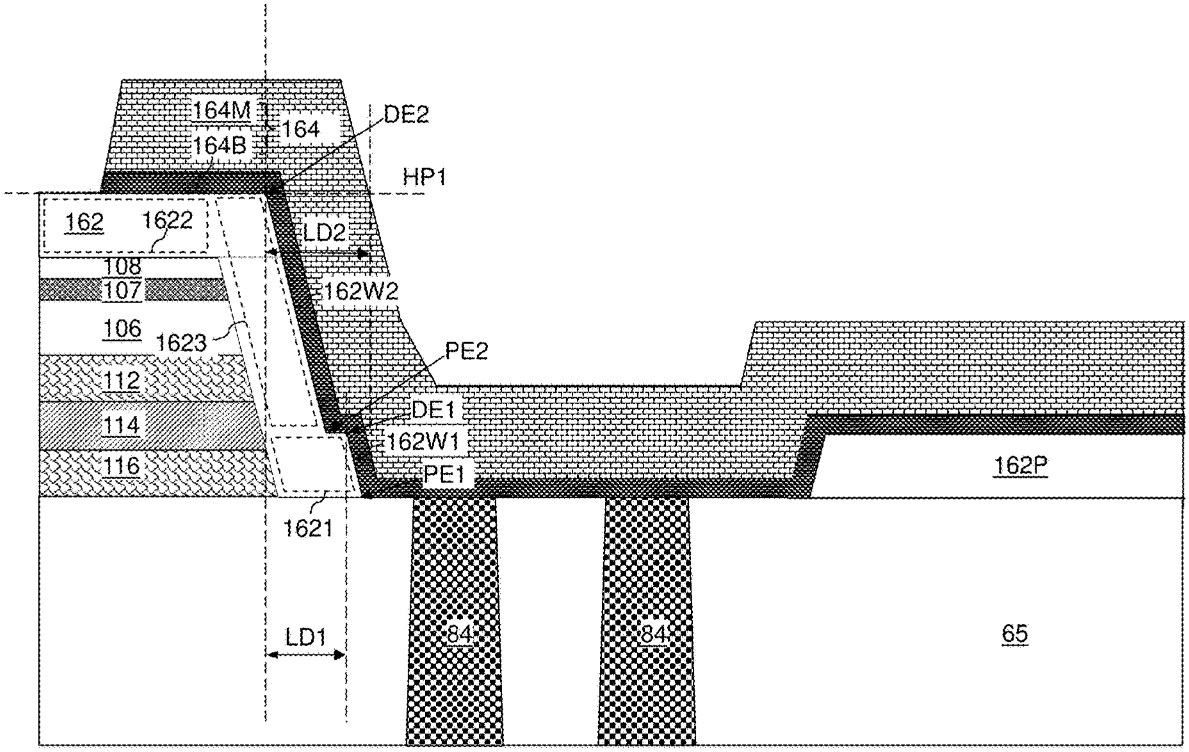
FIG. 24B is a magnified view of region B in FIG. 24A for the case in which the first exemplary structure has the first configuration.
Figure 24C:
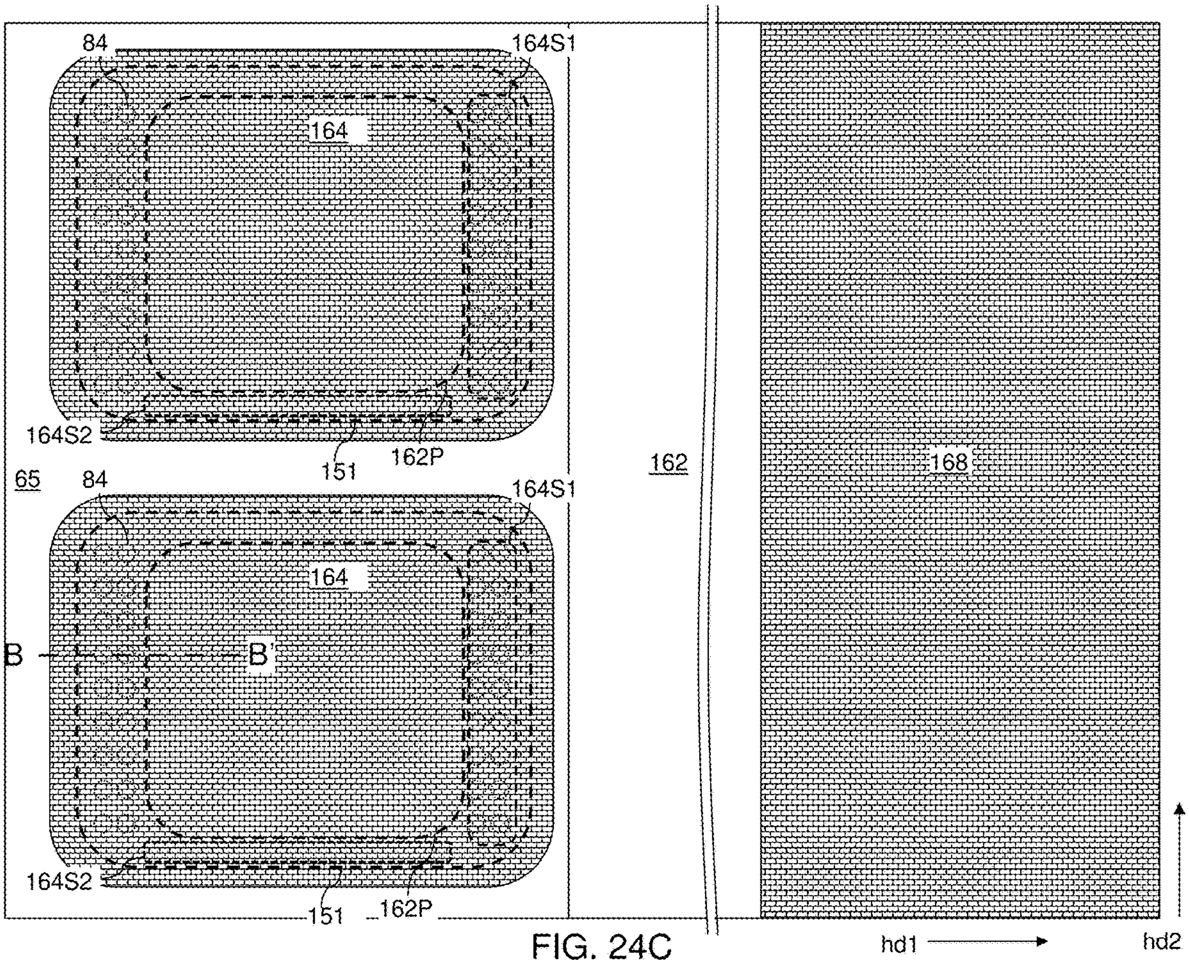
FIG. 24C is a top-down view of the first exemplary structure of FIG. 24A for the case in which the first exemplary structure has the first configuration. The vertical cross-sectional plane B-B' corresponds to the cut plane for the view of FIG. 24B.
Figure 24D:
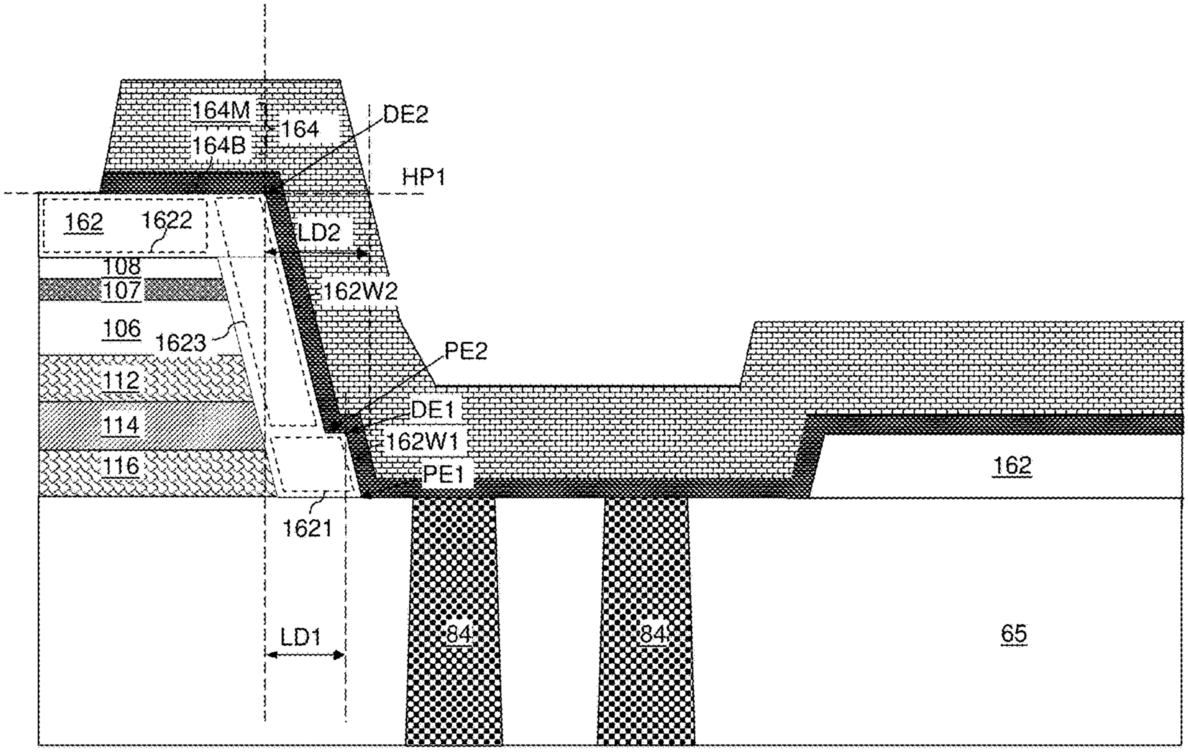
FIG. 24D is a magnified view of region B in FIG. 24A for the case in which the first exemplary structure has a second configuration.
Figure 24E:
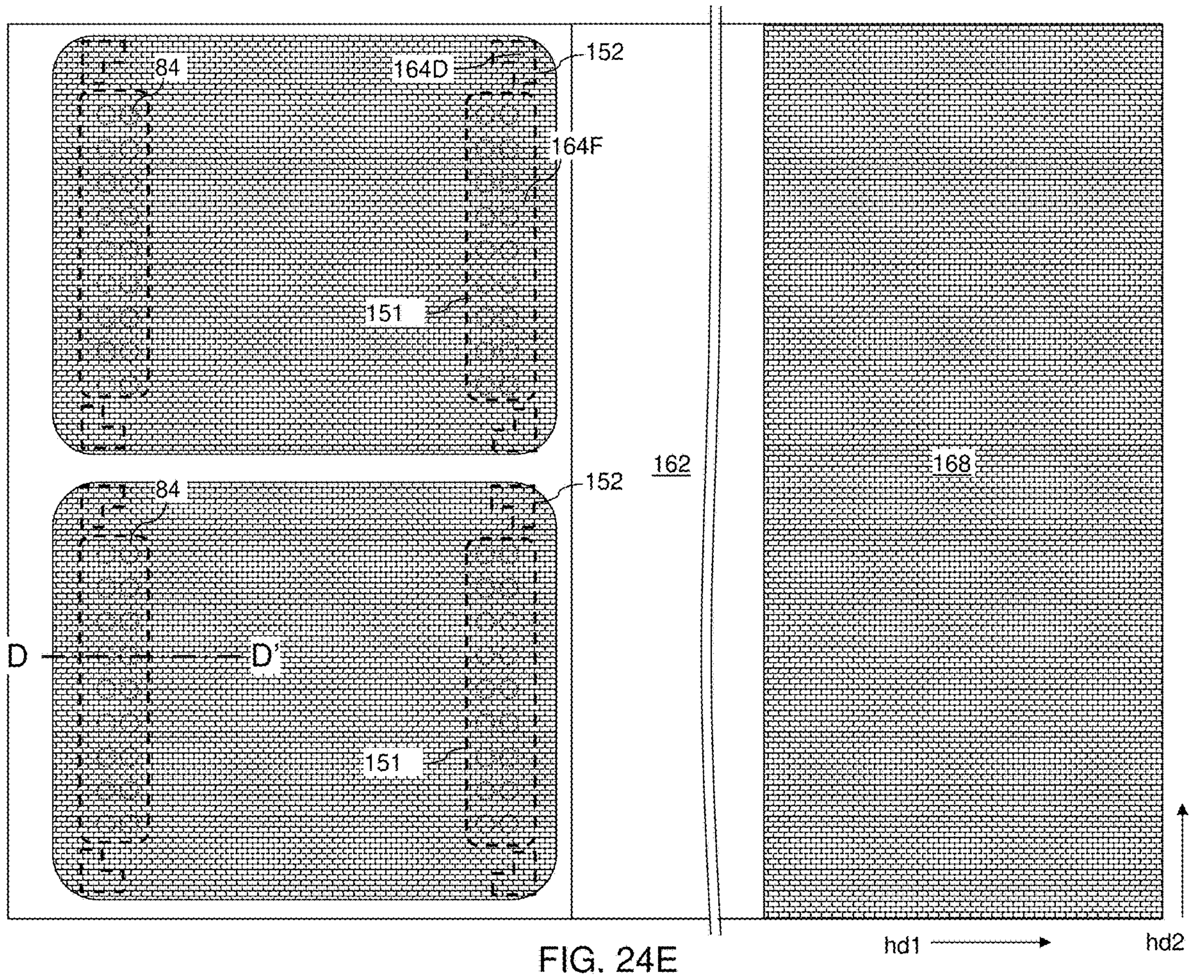
FIG. 24E is a top-down view of the first exemplary structure of FIG. 24A for the case in which the first exemplary structure has the second configuration. The vertical cross-sectional plane D-D' corresponds to the cut plane for the view of FIG. 24D.

FIGS. 24A-24E are various views of the first exemplary structure after patterning the backside connection pad layer 164L into backside connection pad structures 164 and source connection pad structures 168. FIGS. 24B and 24C illustrate the first configuration of the first exemplary structure. FIGS. 24D and 24E illustrate the second configuration of the first exemplary structure.

A photoresist layer (not shown) can be applied over the backside connection pad layer 164L, and can be lithographically patterned into discrete photoresist material portions each covering the area of a respective one of the backside connection pad cavities 167 or a respective one of the source connection pad cavities 169. An anisotropic etch process can be performed to remove portions of the backside connection pad layer 164L that are not covered by the patterned photoresist material portions. Each patterned portion of the backside connection pad layer 164L that overlies a backside connection pad cavity 167 constitutes a backside connection pad structure 164. Each patterned portion of the backside connection pad layer 164L that overlies a source connection pad cavity 169 constitutes a source connection pad structure 168. The patterned photoresist material portions can be subsequently removed, for example, by ashing.

Each backside connection pad structure 164 may comprise a combination of a backside metallic barrier liner 164B and a backside metallic layer 164M. The backside metallic barrier liner 164B is a patterned portion of the backside metallic barrier liner layer 164BL. The backside metallic layer 164M is a patterned portion of the backside metallic material layer 164ML. Each source connection pad structure 168 may comprise a combination of a source metallic barrier liner 168B and a source metallic layer 168M. The source metallic barrier liner 168B is a patterned portion of the backside metallic barrier liner layer 164BL. The source metallic layer 168M is a patterned portion of the backside metallic material layer 164ML.

Each backside connection pad structure 164 can be formed on the backside isolation layer 162 and a respective subset of the connection via structures 84. Each backside connection pad structure 164 comprises a proximal portion contacting end surfaces of the respective subset of the connection via structures 84, a distal portion in contact with the second horizontally-extending portion 1622 of the backside isolation layer 162, and a connecting portion that connects the proximal portion and the distal portion. A lateral distance, i.e., the second lateral distance LD2, between an inner sidewall and an outer sidewall of the connecting portion of a backside connection pad structure 164 within a first horizontal plane HP1 containing the second distal edge DE2 is greater than a lateral distance, i.e., the first lateral distance LD1, between the first distal edge DE1 and the second distal edge DE2.

Each backside connection pad structure 164 comprises at least one first region (164S1, 164F) in respective first-type opening 151 that contacts the end surfaces of a respective subset of the connection via structures 84, and at least one dummy second region (164S2, 164D) which contacts the stepped dielectric portion 65, but which does not contact the end surfaces of a respective subset of the connection via structures 84. Each backside connection pad structure 164 further comprises portions located on patterned portions of the backside isolation layer 162. Each backside connection pad structure 164 can be formed directly on a backside surface of a horizontally-extending remaining portion of the backside isolation layer 162 that is formed in the processing steps described with reference to FIGS. 22A-22F.

In the first configuration illustrated in FIGS. 24B and 24C, a patterned portion of the backside isolation layer 162 comprises a backside isolation plate 162P located in a center region of a backside connection pad cavity 167 and contacting a horizontal surface of the stepped dielectric material portion 65. A backside connection pad structure 164 can contact an entirety of a distal horizontal surface of a backside isolation plate 162P, and can laterally surround and enclose the backside isolation plate 162P. In this case, the backside isolation plate 162P is laterally spaced from a remaining portion of the backside isolation layer 162 located outside an outer periphery of a moat-shaped first-type opening 151 in the backside isolation layer 162 by a moat-shaped portion (e.g., regions 164S1 and 164S2) of the backside connection pad structure 164 that contacts the stepped dielectric material portion 65.

In the second configuration illustrated in FIGS. 24D and 24E, the backside isolation layer 162 may comprise first-type openings 151 laterally surrounding a respective subset of the connection via structures 84, and second-type openings 152 that do not laterally surround any connection via structure 84. Each backside connection pad structure 164 may comprise a respective proximal portion (e.g., the first region 164F) that includes at least one first region that is formed within a respective one of the first-type openings 151 and contacting end surfaces of a respective subset of the connection via structures 84, and at least one dummy second region 164D that is formed within a respective one of the second-type openings 152 and contacting a respective horizontal surface segment of the stepped dielectric material portion 65. In the second configuration, the backside connection pad structure 164 may be formed directly on a backside surface of a horizontally-extending remaining portion of the backside isolation layer 162 that contacts a horizontal surface of the stepped dielectric material portion 65.

In the second configuration, the first horizontally-extending portion 1621 of the backside isolation layer 162 may comprise a plurality of first-type openings 151 laterally surrounding the respective first regions 164F of the proximal portion of the backside connection pad structure 164, which contact the respective subset of the connection via structures 84 that are embedded in the stepped dielectric material portion 65. Further, the first horizontally-extending portion 1621 of the backside isolation layer 162 may comprise a plurality of second-type openings 152 laterally surrounding the respective dummy second regions 164D of the proximal portion of the backside connection pad structure 164. An entirety of a horizontal surface of each dummy second region 164D located within an area of a respective second-type opening 152 is in contact with a respective surface segment of the stepped dielectric material portion 65.

The second dummy regions 164S2 or 164D of the backside connection pad structures 164 may be present or may be omitted in the first embodiment.

Each source connection pad structure 168 can be formed through the backside dielectric layers (107, 108) and the backside isolation layer 162 directly on a horizontal surface of the source layer 110. Each source connection pad structure 168 has a same material composition and a same thickness as the backside connection pad structure 164.

Figure 25A:
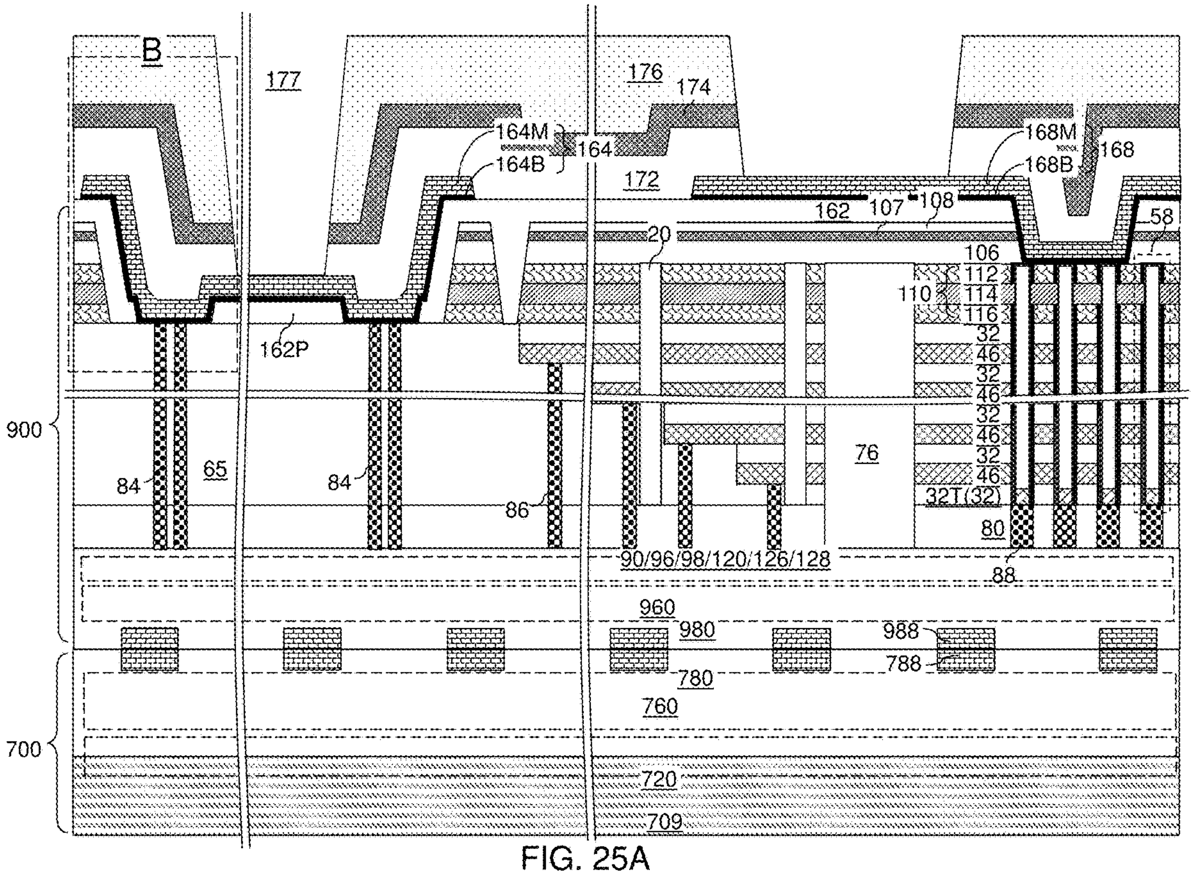
FIG. 25A is a vertical cross-sectional view of the first exemplary structure after formation of passivation dielectric layers and contact via cavities according to an embodiment of the present disclosure.
Figure 25B:
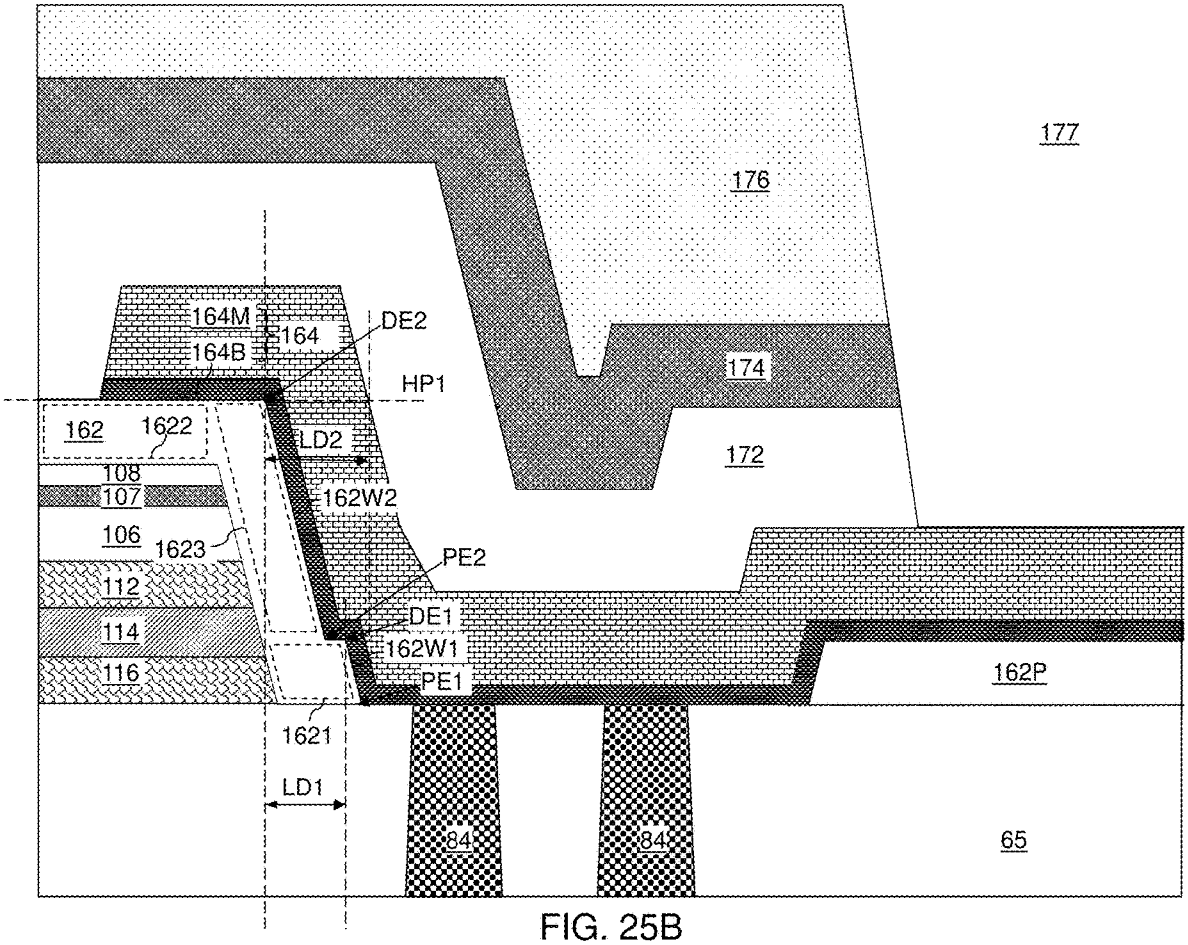
FIG. 25B is a magnified view of region B in FIG. 25A for the case in which the first exemplary structure has the first configuration.
Figure 25C:
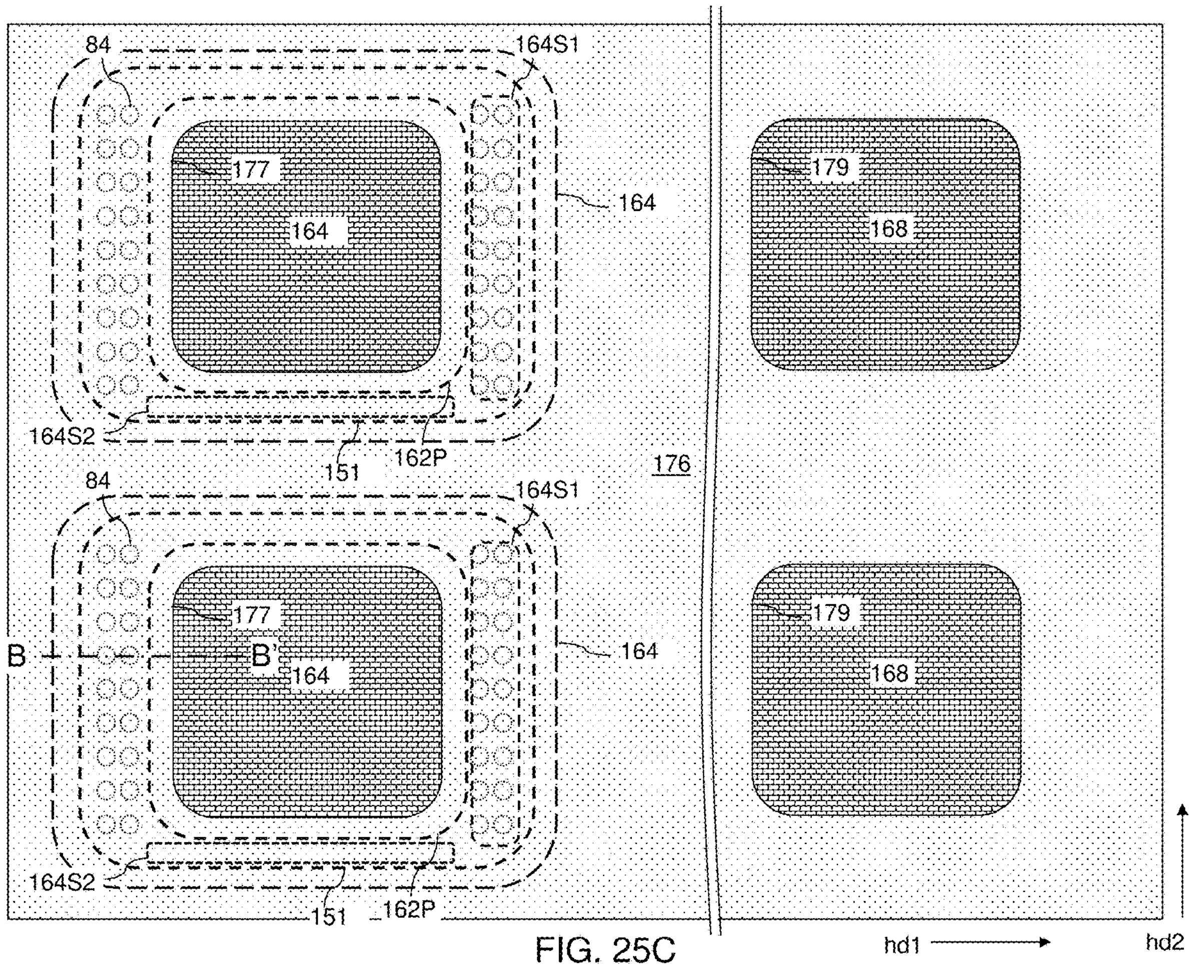
FIG. 25C is a top-down view of the first exemplary structure of FIG. 25A for the case in which the first exemplary structure has the first configuration. The vertical cross-sectional plane B-B' corresponds to the cut plane for the view of FIG. 25B.
Figure 25D:
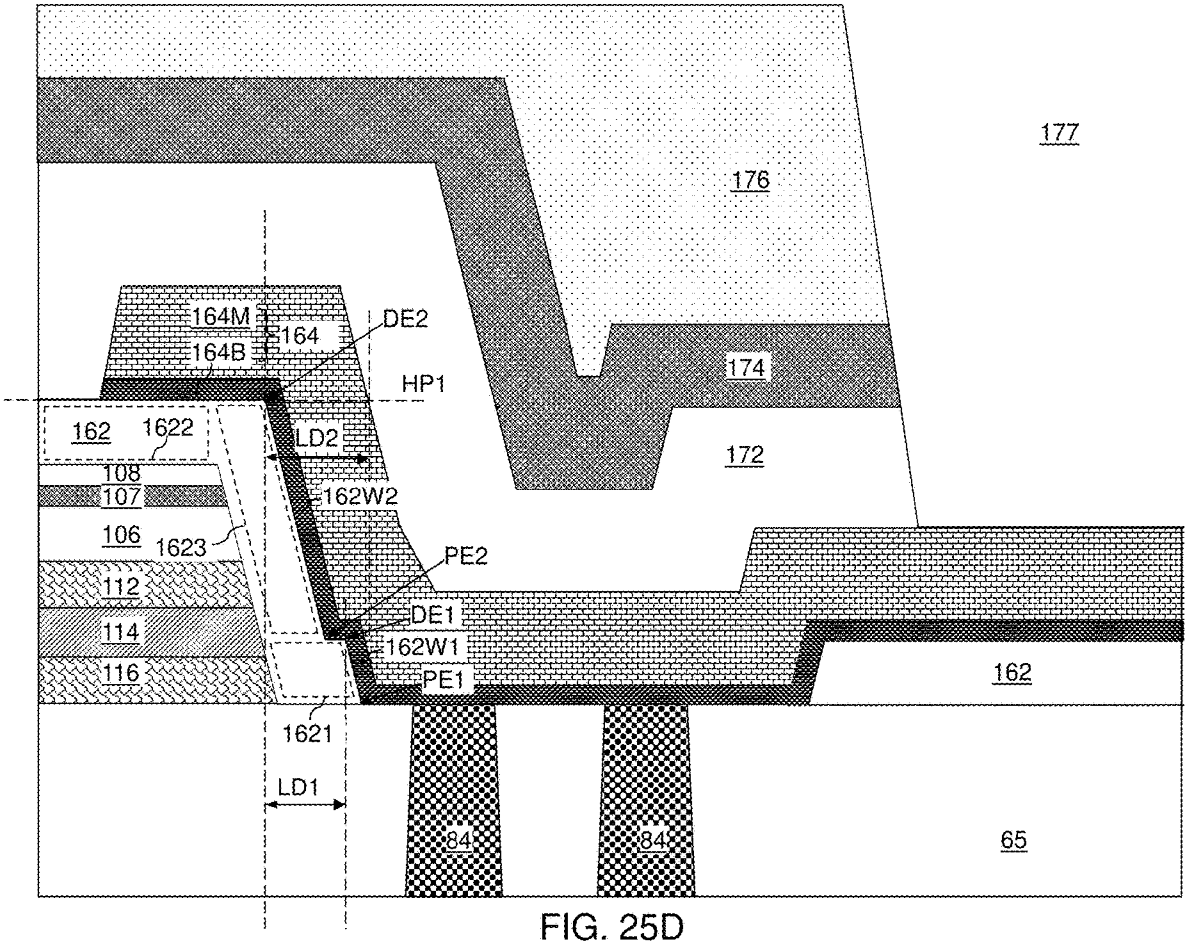
FIG. 25D is a magnified view of region B in FIG. 25A for the case in which the first exemplary structure has a second configuration.
Figure 25E:
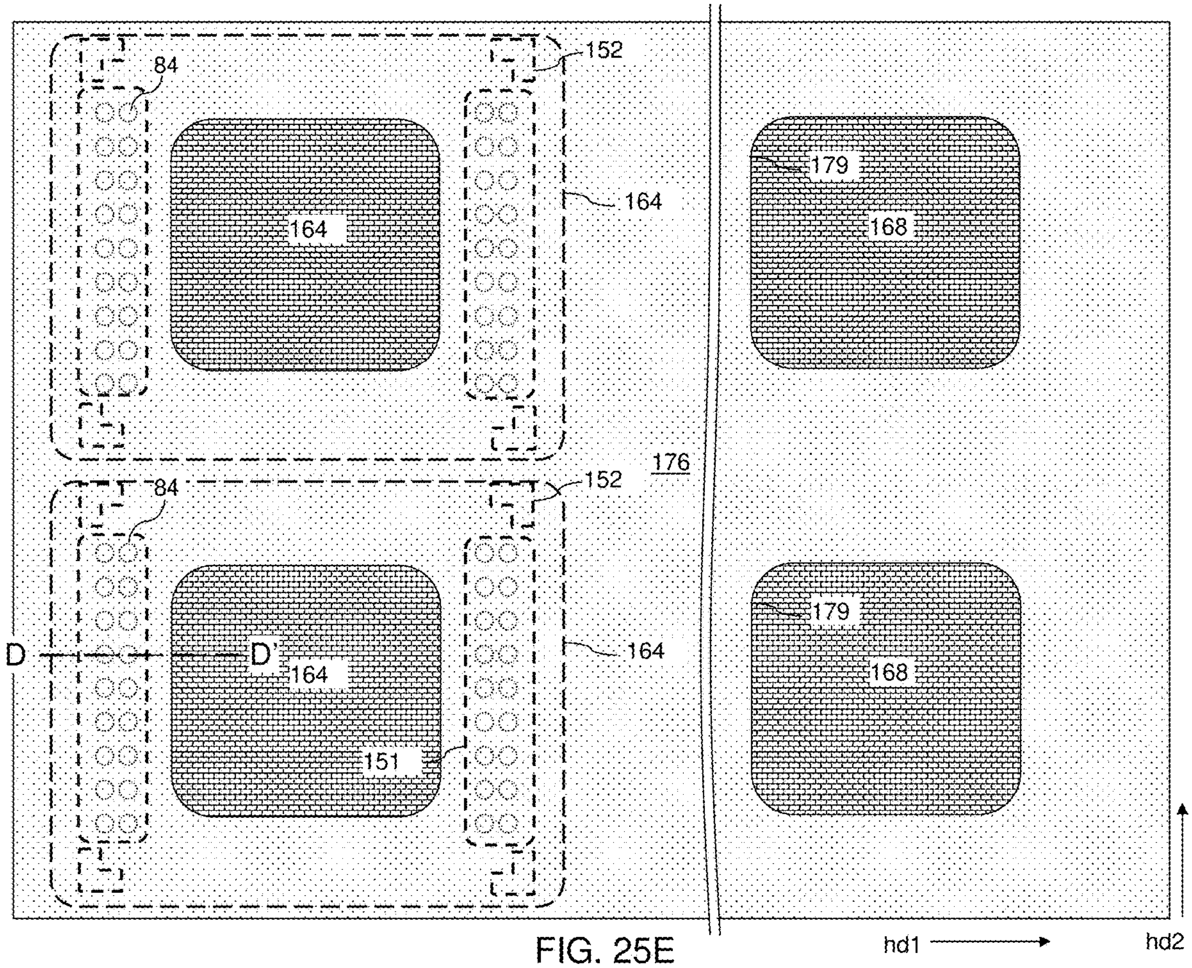
FIG. 25E is a top-down view of the first exemplary structure of FIG. 25A for the case in which the first exemplary structure has the second configuration. The vertical cross-sectional plane D-D' corresponds to the cut plane for the view of FIG. 25D.

FIGS. 25A-25E are various views of the first exemplary structure after formation and patterning of at least one passivation dielectric layer (172, 174, 176). FIGS. 25B and 25C illustrate the first configuration of the first exemplary structure. FIGS. 25D and 25E illustrate the second configuration of the first exemplary structure.

The at least one passivation dielectric layer (172, 174, 176) can be formed over the distal surfaces of the backside connection pad structures 164, the source connection pad structures 168, and the backside isolation layer 162. In one embodiment, the at least one passivation dielectric layer (172, 174, 176) may comprise a first passivation dielectric layer 172, a second passivation dielectric layer 174, and a third passivation dielectric layer 176. In an illustrative example, the first passivation dielectric layer 172 may comprise a silicon oxide layer having a thickness in a range from 500 nm to 2,000 nm, the second passivation dielectric layer 174 may comprise a silicon nitride layer having a thickness in a range from 200 nm to 600 nm, and the third passivation dielectric layer 176 may comprise a polyimide layer having a thickness in a range from 3 microns to 10 microns, although lesser and greater thicknesses may also be employed.

The at least one passivation dielectric layer (172, 174, 176) can be patterned to form various contact cavities (177, 179). If the third passivation dielectric layer 176 comprises a polyimide layer, the polyimide layer can be patterned by lithographic exposure and development to form various cavities therein. An anisotropic etch process can be performed to vertically extend the cavities in the polyimide layer to form the various contact cavities (177, 179). The various contact cavities (177, 179) may comprise backside contact cavities 177 that are formed above the backside connection pad structures 164, and source contact cavities 179 that are formed over the source connection pad structures 168.

Each backside contact cavity 177 may be formed through the at least one passivation dielectric layer (172, 174, 176) such that a portion of a distal surface of a backside connection pad structure 164 is exposed at the bottom of each backside contact cavity 177. In one embodiment, a proximal portion of a backside connection pad structure 164 that is exposed to a backside contact cavity 177 may be vertically spaced from the stepped dielectric material portion 65 by a horizontally-extending remaining portion of the backside isolation layer 162 that remains after patterning the backside isolation layer 162 at the processing steps described with reference to FIGS. 22A-22E.

Figure 26:
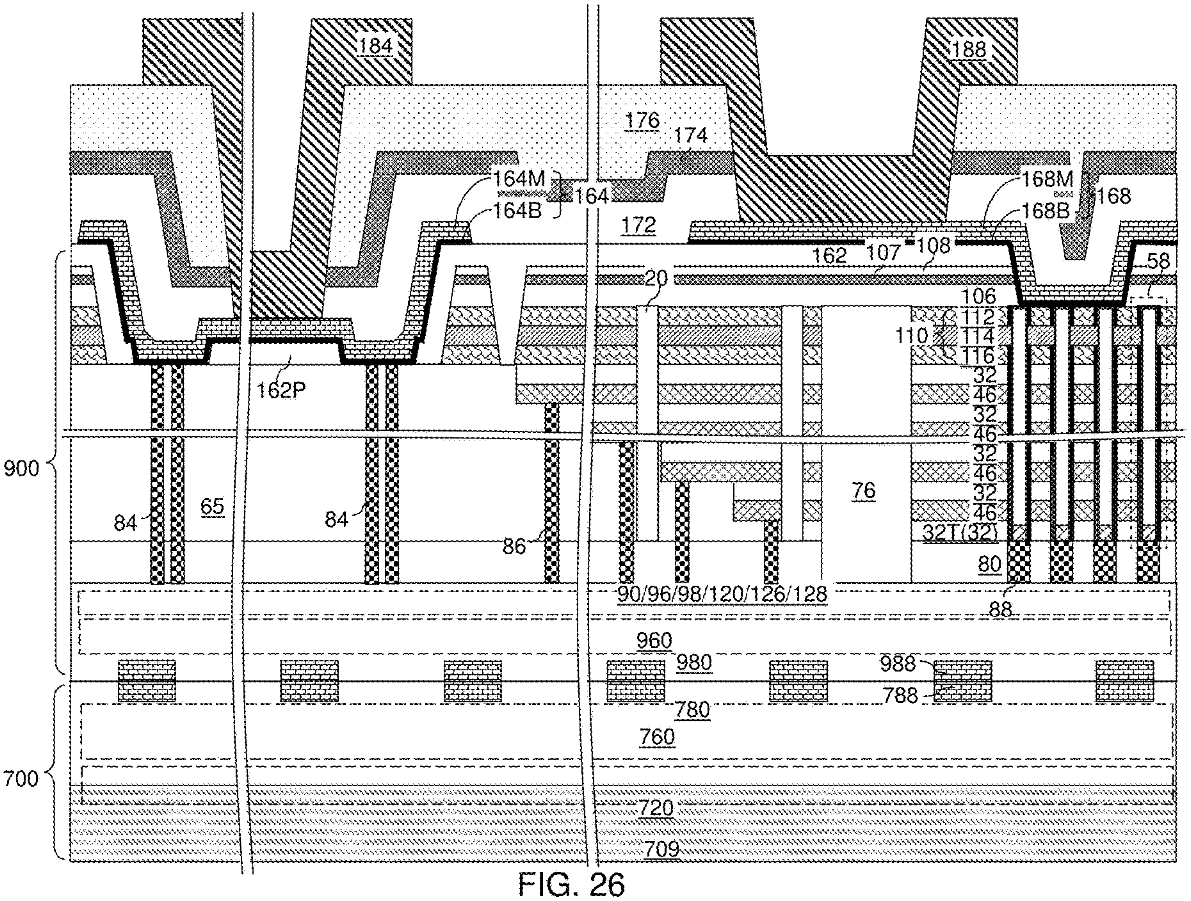
FIG. 26 is a vertical cross-sectional view of the first exemplary structure after formation of backside contact pads according to an embodiment of the present disclosure.

Referring to FIG. 26, at least one conductive material can be deposited in the backside contact cavities 177 and source contact cavities 179, and can be patterned to provide backside contact pads 184 and the source contact pads 188. The at least one passivation dielectric layer (172, 174, 176) can contact a first segment of a distal surface of each backside connection pad structure 164 and can contact a distal surface of the backside isolation layer 162. The backside contact pads 184 vertically extend through the at least one passivation dielectric layer (172, 174, 176) and contact a second segment of the distal surface of a respective one of the backside connection pad structures 164.

A proximal portion of a backside connection pad structure 164 that is contacted by a backside contact pad 184 may be vertically spaced from the stepped dielectric material portion 65 by a horizontally-extending remaining portion of the backside isolation layer 162 that remains after patterning the backside isolation layer 162. In one embodiment, a proximal portion of a backside connection pad structure 164 that is contacted by a backside contact pad 184 can be vertically spaced from the stepped dielectric material portion 65 by a horizontally-extending portion of the backside isolation layer 162 (as in the case of the second exemplary structure), or by a backside isolation plate 162P having a same material composition and a same thickness as the second horizontally-extending portion 1622 of the backside isolation layer 162 (as in the case of the first exemplary structure). The backside isolation plate 162P is laterally spaced from the backside isolation layer 162 by a ring-shaped region of a backside connection pad structure 164 that contacts the stepped dielectric material portion 65 and laterally surrounds the backside isolation plate 162P.

Figure 27A:
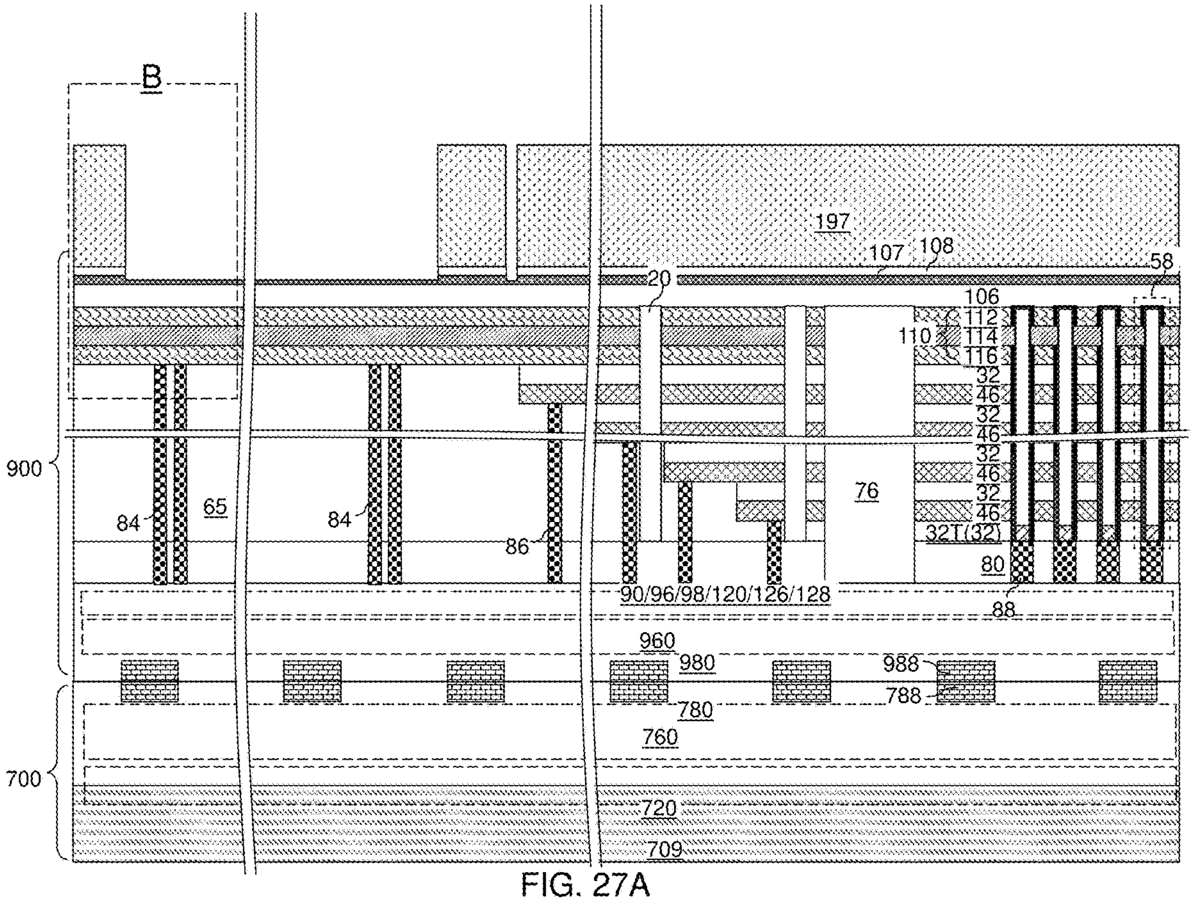
FIG. 27A is a vertical cross-sectional view of a second exemplary structure after formation of trimmable etch mask layer and performing a first anisotropic etch process according to an embodiment of the present disclosure.
Figure 27B:
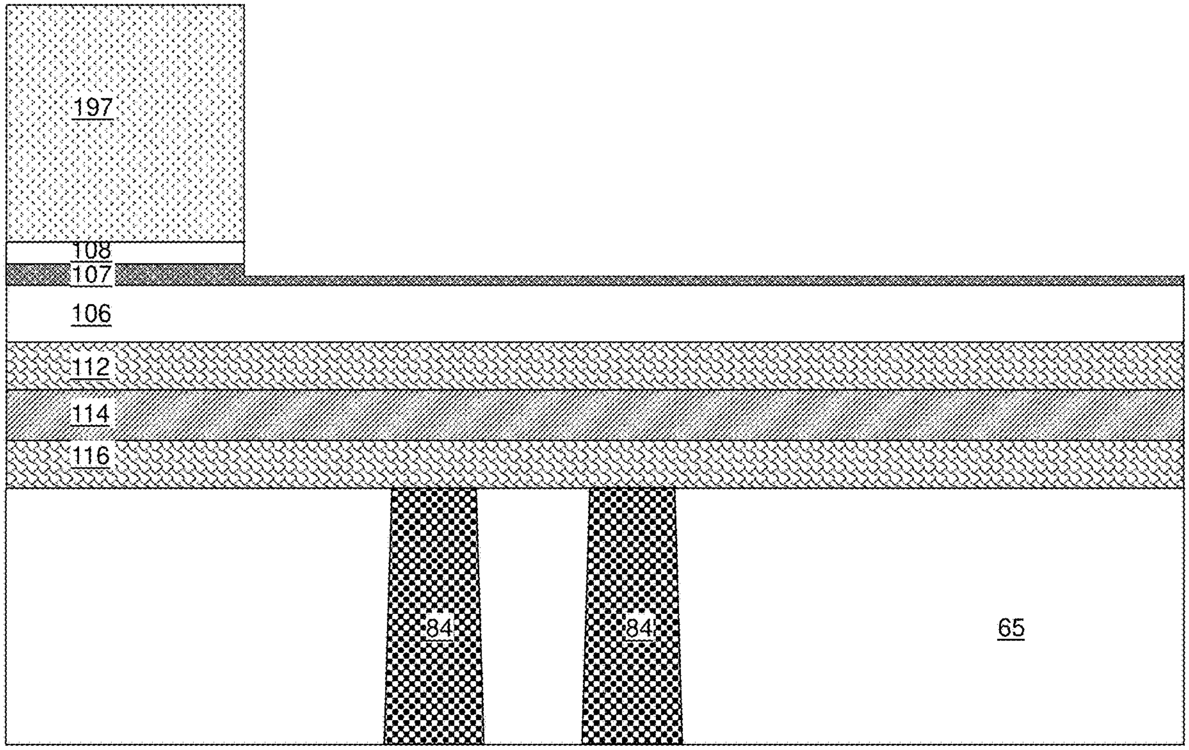
FIG. 27B is a magnified view of region B in FIG. 27A.

Referring to FIGS. 27A and 27B, a second exemplary structure according to an embodiment of the present disclosure may be derived from the first exemplary structure illustrated in FIG. 19 by forming a patterned trimmable etch mask layer 197 and performing a first anisotropic etch process. The patterned trimmable etch mask layer 197 may comprise a trimmable photoresist material, i.e., a photoresist material that may be isotropically trimmed, for example, by removing surface portions at a controlled removal rate. Controlled removal of the trimmable photoresist material may be performed by a slow ashing process. The pattern in the patterned trimmable etch mask layer 197 can be derived from the pattern of the backside connection pad cavities 167 and the separation trenches 165 illustrated in FIGS. 20A-20C by isotropically shifting edges of the patterns inward. The lateral pattern shift distance may be greater than the lateral distance between a proximal periphery and a distal periphery of a backside connection pad cavity 167 illustrated in FIGS. 20A-20C.

Generally, the pattern in the patterned trimmable etch mask layer 197 can be derived from the pattern of proximal peripheries of the backside connection pad cavities 167 and the separation trenches 165 illustrated in FIGS. 20A-20C by laterally recessing all of the proximal peripheries outward by a same lateral pattern shift distance. The lateral pattern shift distance may be in a range from 20% to 200%, such as from 40% to 100%, of the total thickness of the layer stack including the source layer 110, the stopper insulating layer 106, and the backside dielectric layers (107, 108).

A first anisotropic etch process can be performed to transfer that pattern of the openings in the trimmable etch mask layer 197 through an upper portion of the backside dielectric layers (107, 108). The etch depth of the first anisotropic etch process may be about 1/N times the total thickness of the layer stack including the source layer 110, the stopper insulating layer 106, and the backside dielectric layers (107, 108), in which N is an integer greater than 1, such as an integer in a range from 3 to 20, such as from 5 to 10.

Figure 28A:
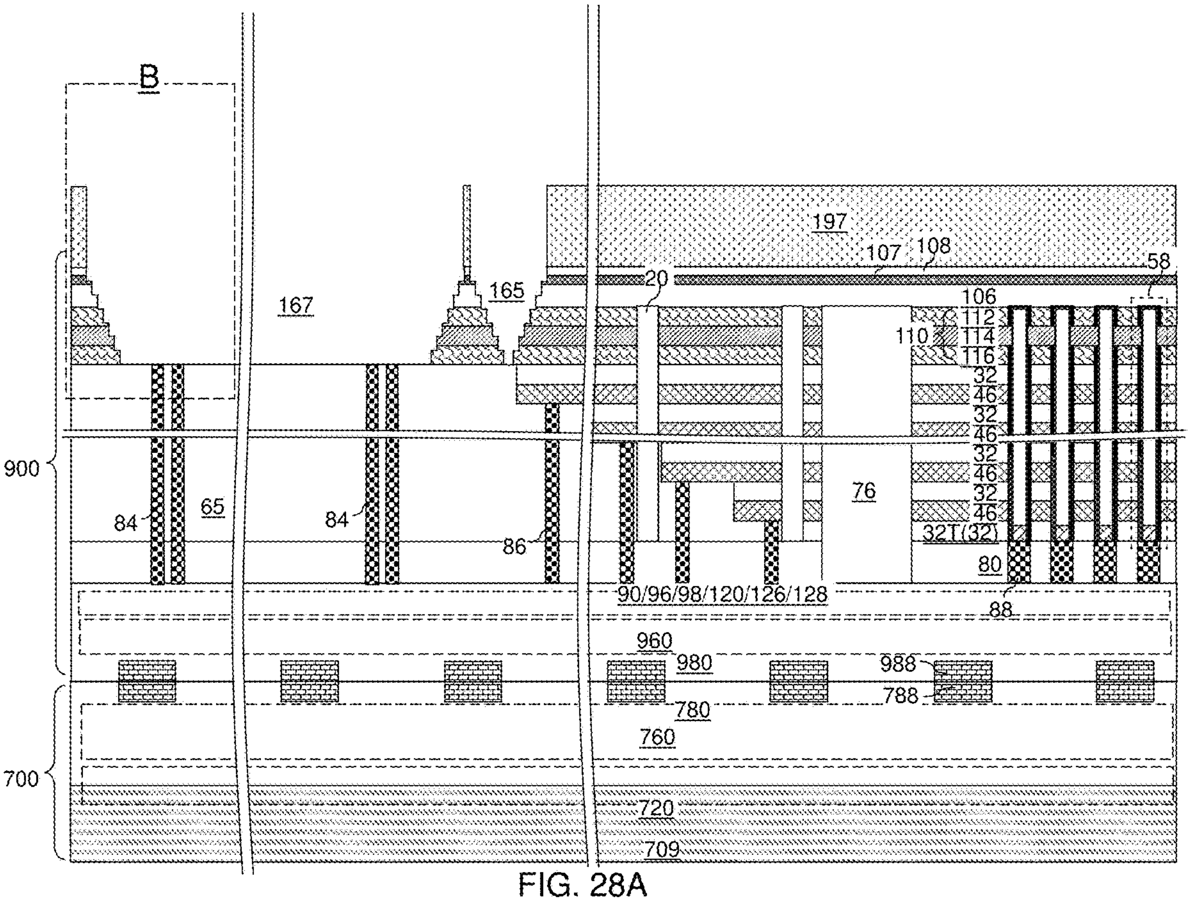
FIG. 28A is a vertical cross-sectional view of the second exemplary structure after formation of backside connection pad cavities according to an embodiment of the present disclosure.
Figure 28B:
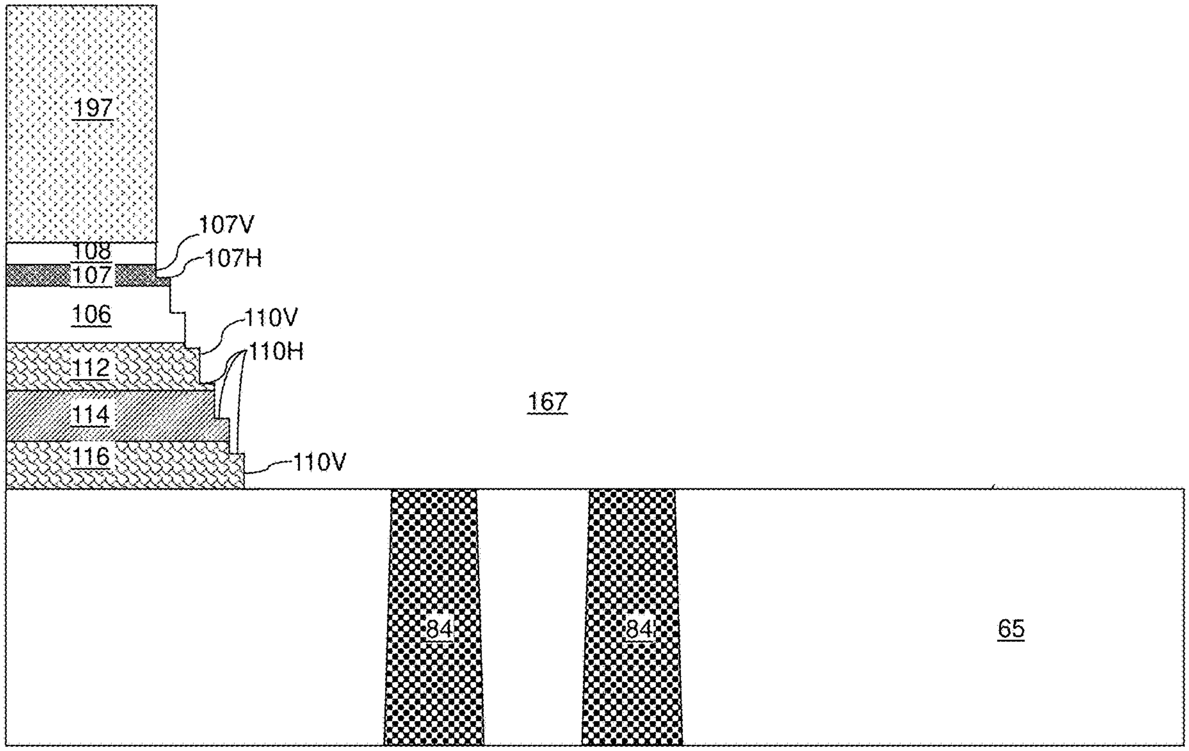
FIG. 28B is a magnified view of region B in FIG. 28A.

Referring to FIGS. 28A and 28B, the trimmable etch mask layer 197 can be isotropically trimmed by a lateral trimming distance, which may be about 1/(N−1) times the lateral pattern shift distance.

Referring collectively to FIGS. 27A, 27B, 28A, and 28B, a combination of an anisotropic etch step and a mask trimming step that trims the trimmable etch mask layer 197 can be performed at least twice. For example, the combination of the anisotropic etch step and the mask trimming step can be performed (N−1) times, in which N is an integer greater than 2. A final anisotropic etch step may be performed after the (N−1) iterations of the combination to etch through a bottommost portion of the source layers 110 such that top surfaces of the connection via structures 84 are exposed after the final anisotropic etch step. Each anisotropic etch step may etch through a vertical distance of about 1/N times the total thickness of the layer stack including the source layer 110, the stopper insulating layer 106, and the backside dielectric layers (107, 108). Each mask trimming step may trim the trimmable etch mask layer 197 by a trimming distance that is about 1/(N−1) times the lateral pattern shift distance.

Each of the backside connection pad cavities 167 may be formed with a stepped sidewall comprising a plurality of horizontally-extending surface segments 110H of the source layer 110, a plurality of vertically-extending surface segments 110V of the source layer 110, at least one horizontally-extending surface segment 107H of the backside dielectric layers (107, 108) (which may comprise a plurality of horizontally-extending surface segments of the backside dielectric layers), and a plurality of vertically-extending surface segments 107V of the backside dielectric layers (107, 108). The separation trench 165 may be formed with a plurality of vertically-extending surface segments and a plurality of horizontally-extending surface segments that are located at the same levels as the plurality of horizontally-extending surface segments of the backside connection pad cavities 167.

Figure 29:
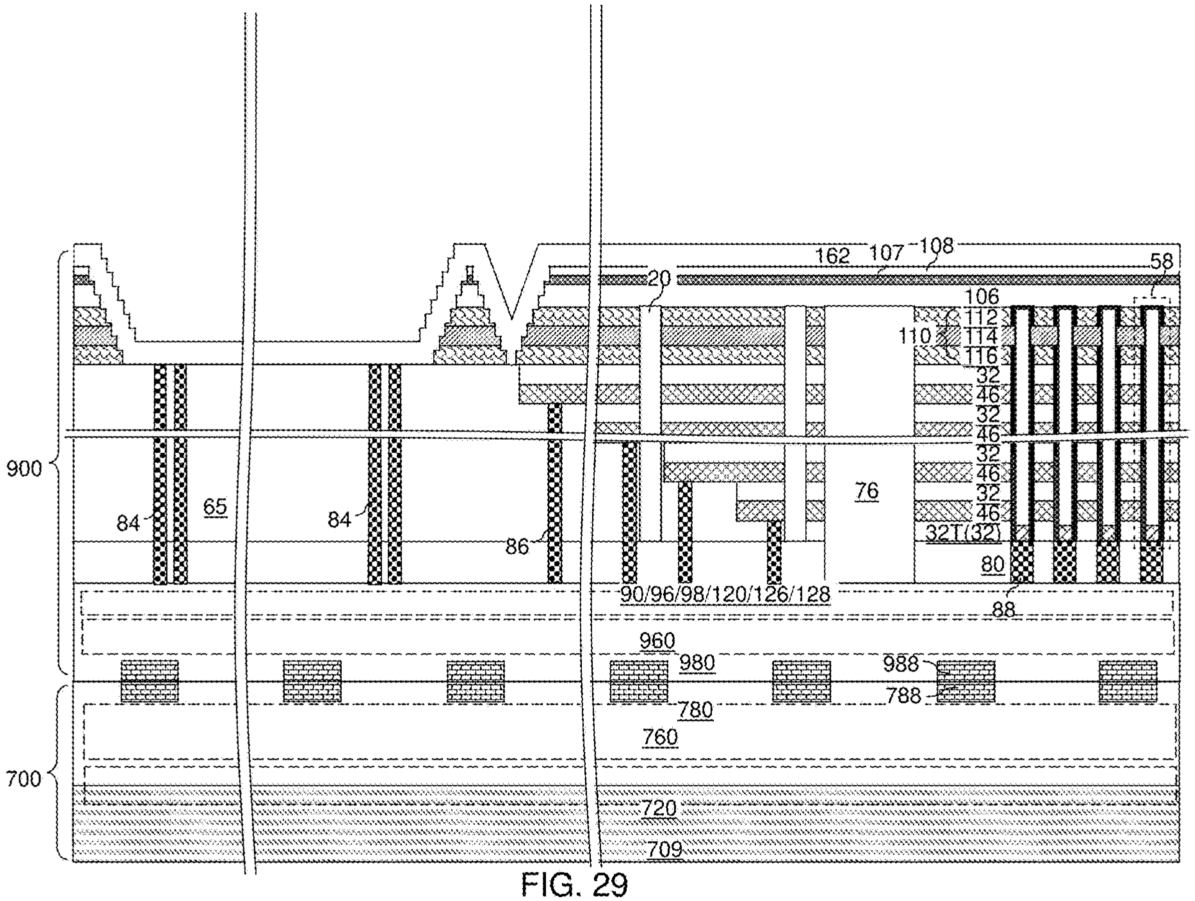
FIG. 29 is a vertical cross-sectional view of the second exemplary structure after formation of a backside isolation layer according to an embodiment of the present disclosure.

Referring to FIG. 29, the processing steps described with reference to FIGS. 21A-21C can be performed to form a backside isolation layer 162 comprising first horizontally-extending portions 1621 located within a peripheral region of a respective backside connection pad cavity 167, a second horizontally-extending portion 1622, and connecting portions 1623 that connects a respective one of the first horizontally-extending portions 1621 and the second horizontally-extending portion 1622 and comprising a stepped outer sidewall and a stepped inner sidewall. In one embodiment, each stepped outer sidewall comprises a plurality of horizontally-extending surface segments 110H of the source layer 110 and a plurality of vertically-extending surface segments 110V of the source layer 110. In one embodiment, each stepped outer sidewall comprises a plurality of vertically-extending surface segments 107V of the backside dielectric layers (107, 108). In one embodiment, each stepped outer sidewall comprises a plurality of vertically-extending surface segments of the stopper insulating layer 106. In some embodiments, a vertically-extending surface segment of the stopper insulating layer 106 may be vertically coincident with a vertically-extending surface segment of the first backside dielectric layer 107. In one embodiment, another vertically-extending surface segment of the stopper insulating layer 106 may be vertically coincident with a vertically-extending surface segment of the source layer 110.

Figure 30:
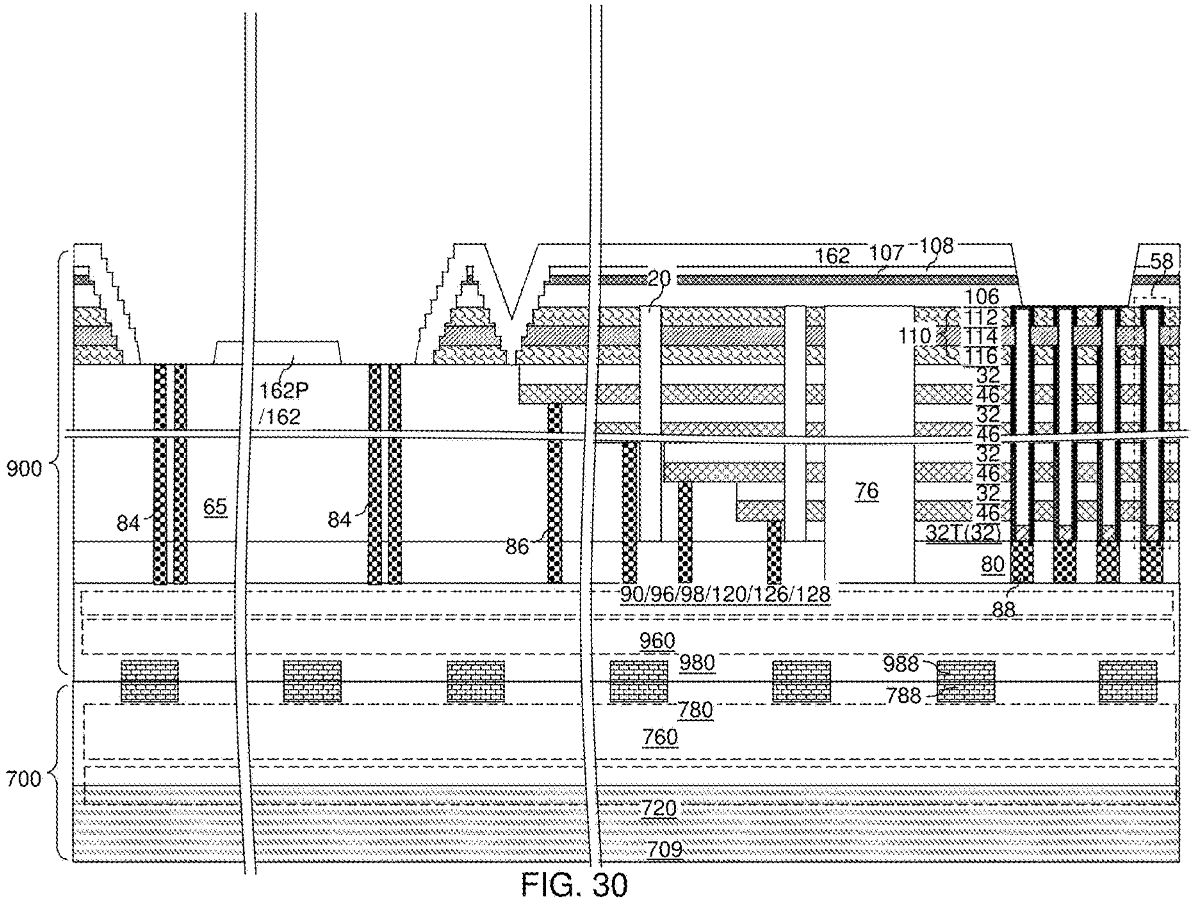
FIG. 30 is a vertical cross-sectional view of the second exemplary structure after patterning the backside isolation layer according to an embodiment of the present disclosure.

Referring to FIG. 30, the processing steps described with reference to FIGS. 22A-22F can be performed. The second exemplary structure may be formed in the first configuration described with reference to FIGS. 22B and 22C, or may be formed in the second configuration described with reference to FIGS. 22D, 22E, and 22F. Generally, the second exemplary structure may be formed in any of the various configurations described with reference to the first exemplary structure with the modification that each connecting portion 1623 of the backside isolation layer 162 can be formed with a respective outer stepped sidewall and with a respective inner stepped sidewall, which reduces mechanical stress generated by the backside connection pad structures to be subsequently formed.

Figure 31:
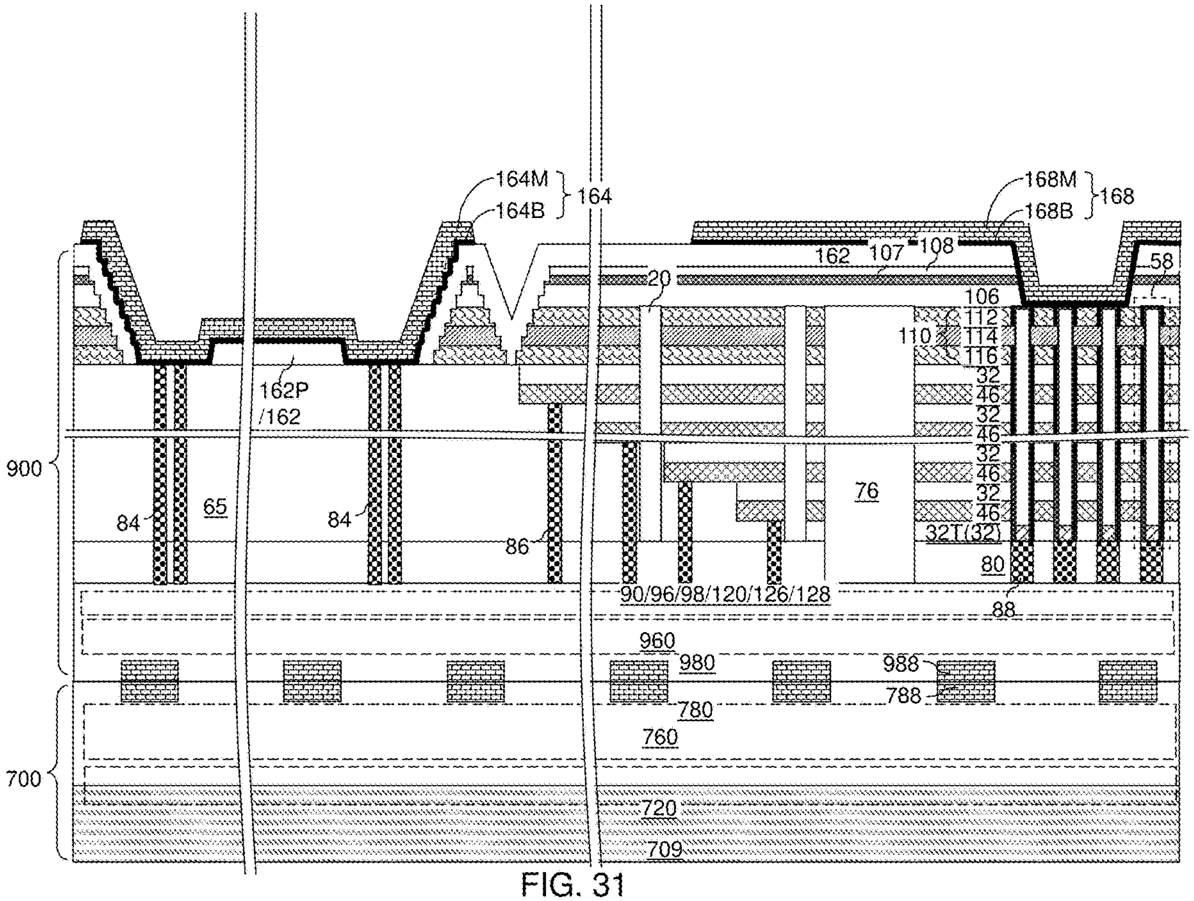
FIG. 31 is a vertical cross-sectional view of the second exemplary structure after formation of backside connection pad structures and source connection pad structures according to an embodiment of the present disclosure.

Referring to FIG. 31, the processing steps described with reference to FIGS. 23A-23E and 24A-24E can be performed to form backside connection pad structures 164 and source connection pad structures 168. The second dummy regions 164S2 or 164D of the backside connection pad structures 164 may be present or may be omitted in the second embodiment.

Figure 32A:
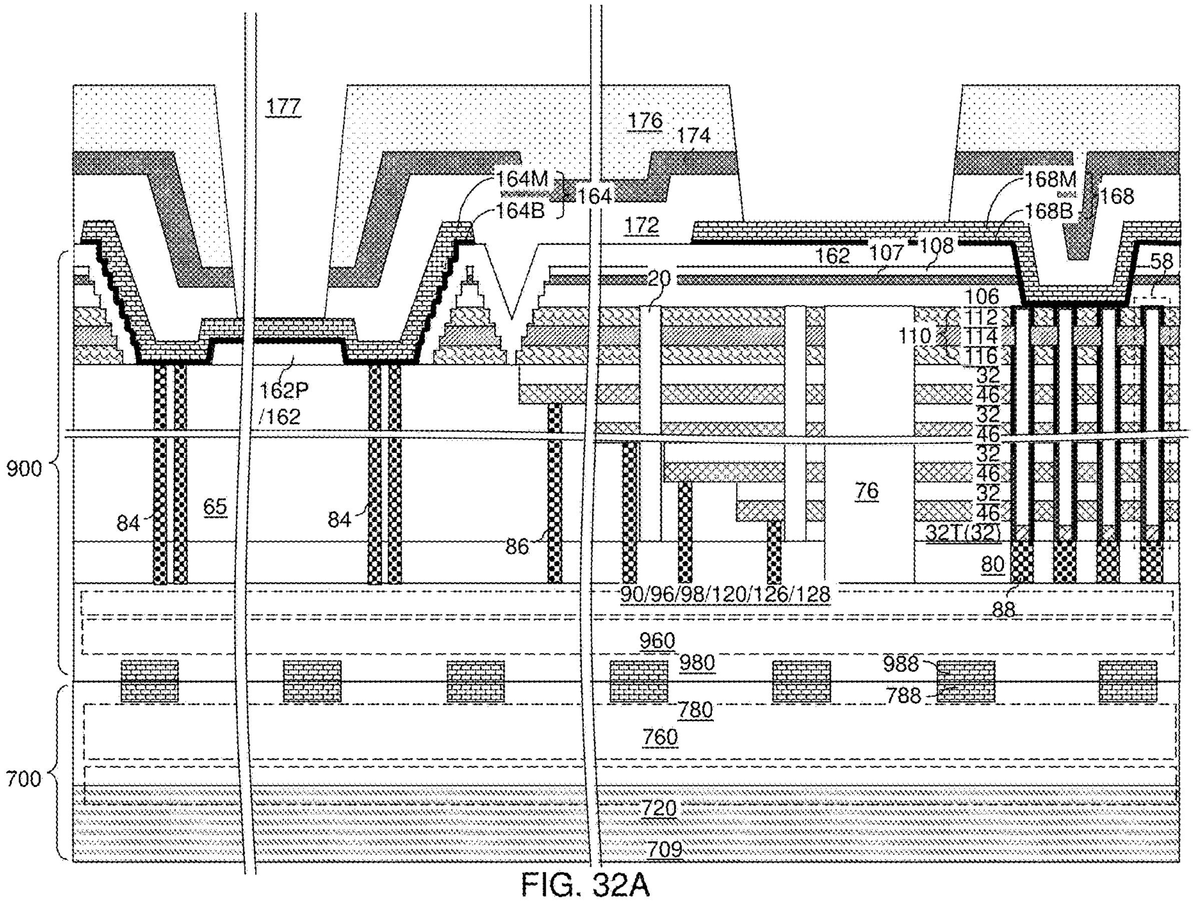
FIG. 32A is a vertical cross-sectional view of the second exemplary structure after formation of passivation dielectric layers and contact via cavities according to an embodiment of the present disclosure.
Figure 32B:
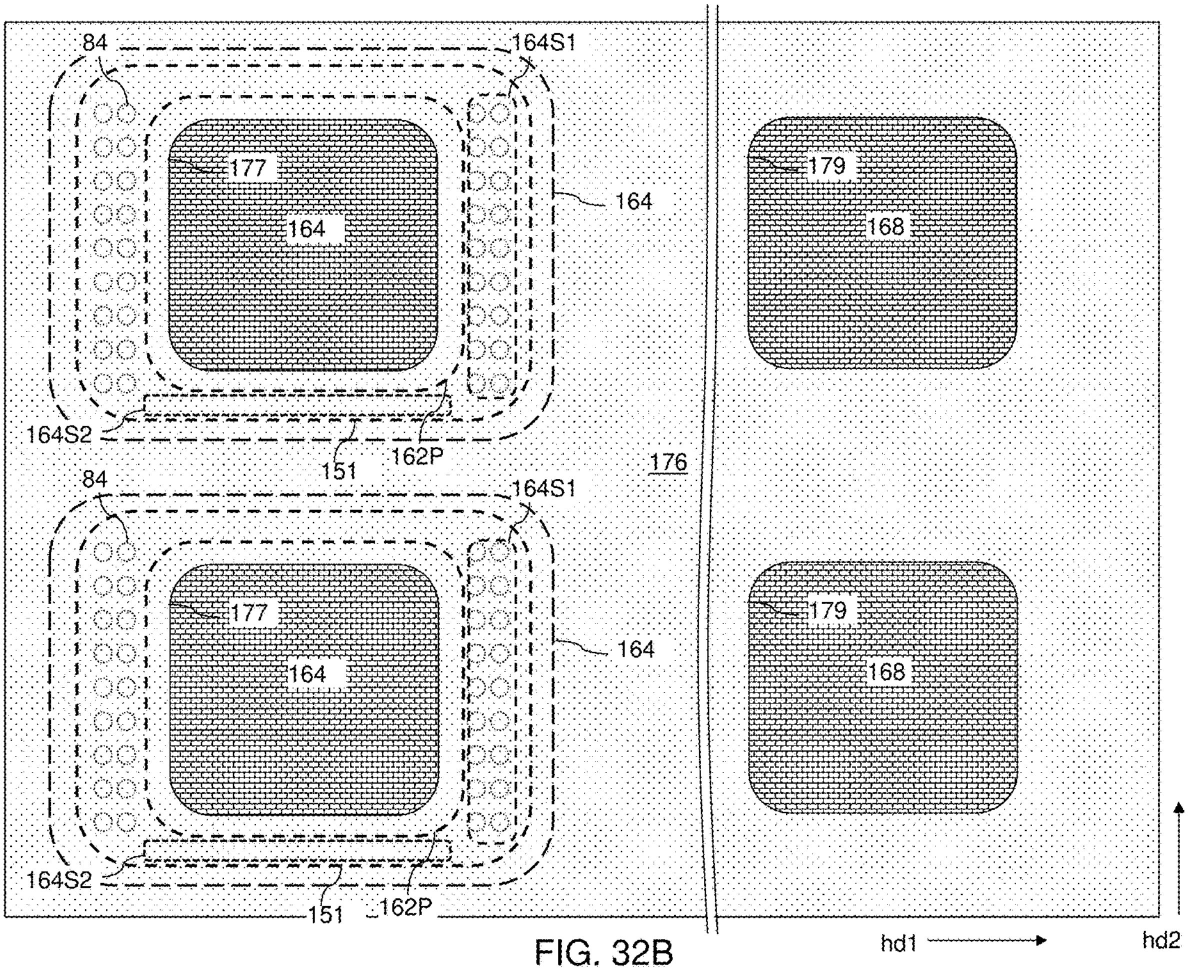
FIG. 32B is a top-down view of a first configuration of the second exemplary structure of FIG. 25A.
Figure 32C:
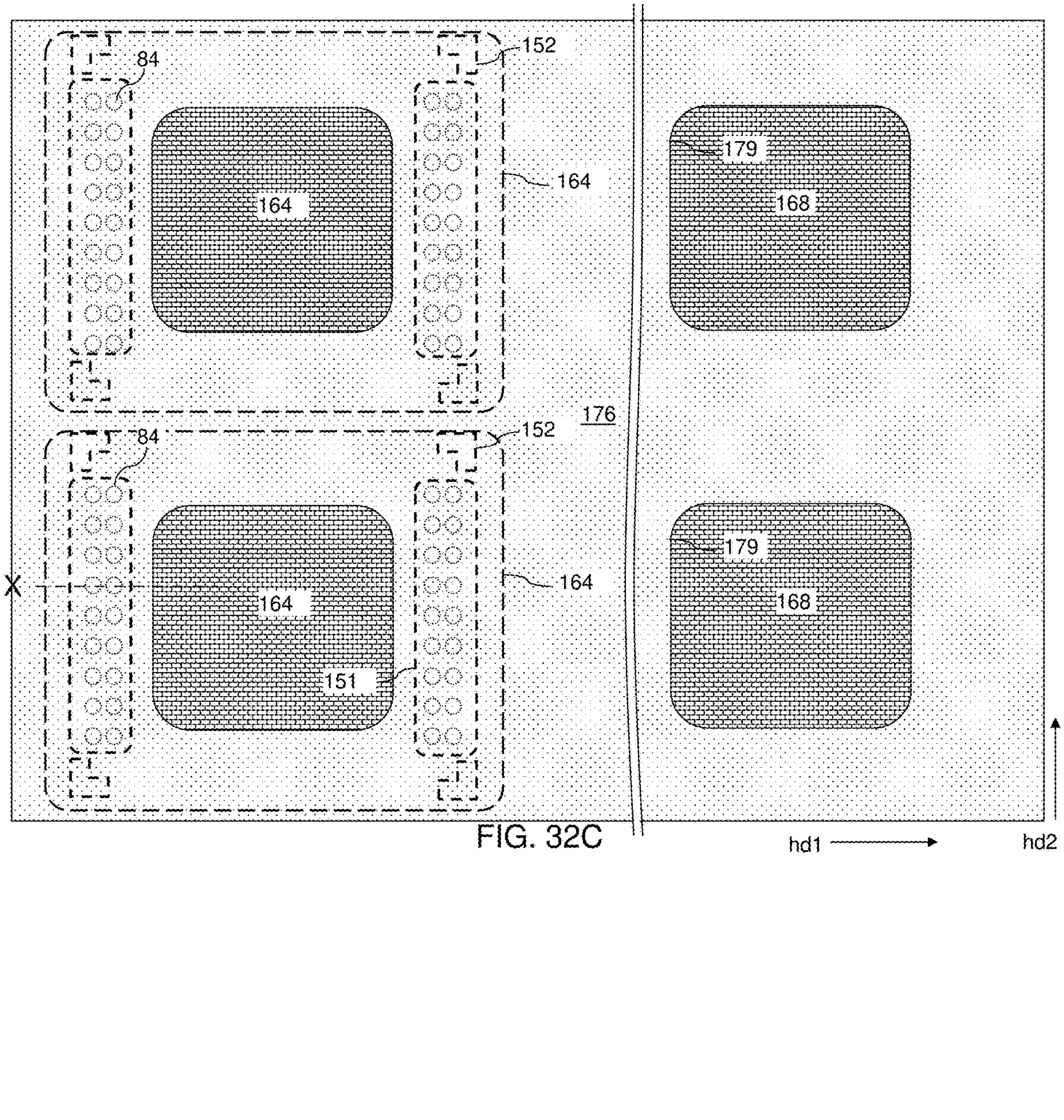
FIG. 32C is a top-down view of a second configuration of the second exemplary structure of FIG. 25A.

Referring to FIGS. 32A-32C, the processing steps described with reference to FIGS. 25A-25E can be performed to form passivation dielectric layers (172, 174, 176) and contact via cavities (177, 179). FIG. 32A is a vertical cross-sectional view of the second exemplary structure. FIG. 32B is a top-down view of the first configuration of the second exemplary structure. FIG. 32C is a top-down view of the second configuration of the second exemplary structure.

Figure 33:
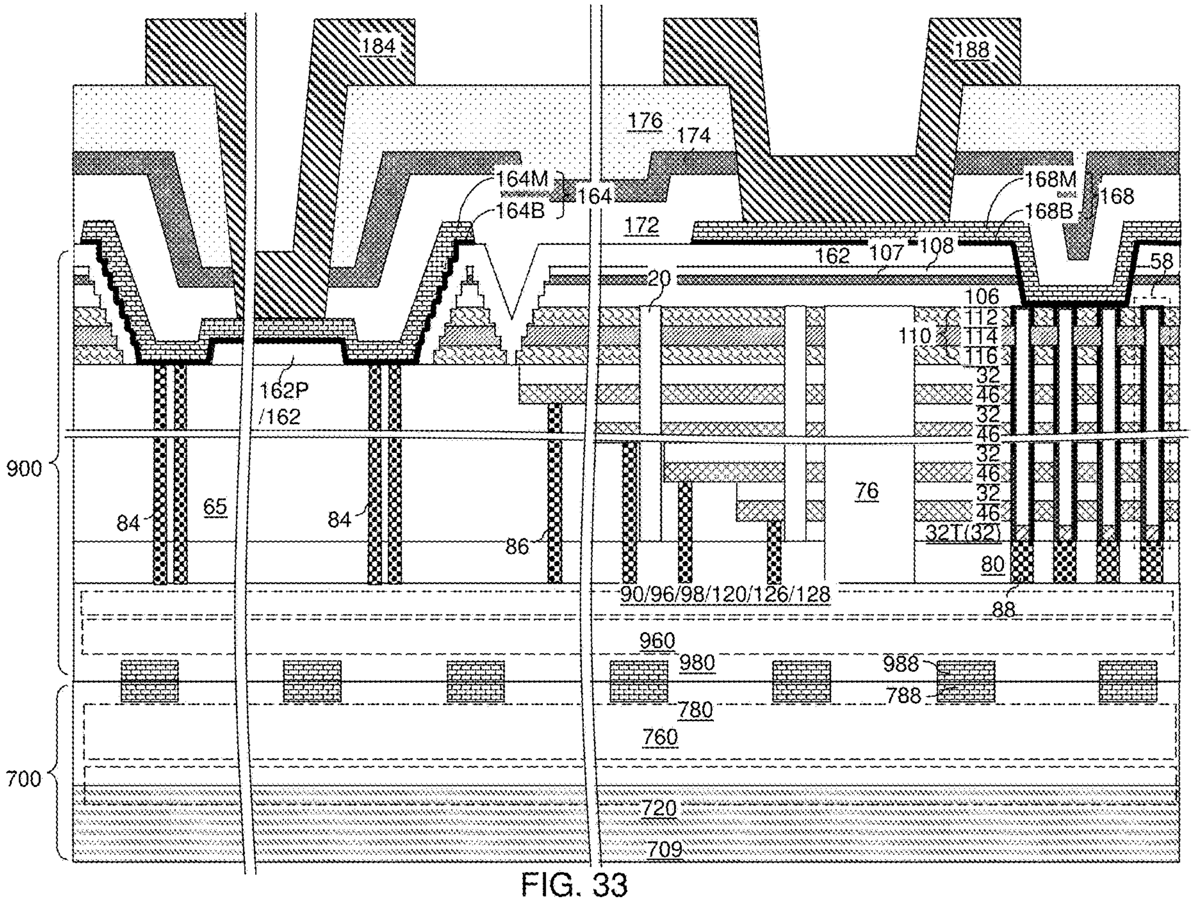
FIG. 33 is a vertical cross-sectional view of the second exemplary structure after formation of backside contact pads according to an embodiment of the present disclosure.

Referring to FIG. 33, the processing steps described with reference to FIG. 26 can be performed to form backside contact pads 184 and source contact pads 188.

Referring to all drawings and according to various embodiments of the present disclosure, a memory device comprises: an alternating stack (32, 46) of insulating layers 32 and electrically conductive layers 46 located over a first side of a source layer 110; a three-dimensional array of memory elements (e.g., memory opening fill structures 58 containing memory cells in the memory film 50) embedded in the alternating stack (32, 46); a dielectric material portion (such as a stepped dielectric material portion 65) located over the first side of the source layer 110 adjacent to the alternating stack (32, 46); connection via structures 84 vertically extending through the dielectric material portion (such as the stepped dielectric material portion 65); a backside connection pad cavity 167 vertically extending through the source layer 110; a backside isolation layer 162 comprising a first horizontally-extending portion 1621 located within the backside connection pad cavity 167 and comprising a first inner sidewall 162W1 having a first proximal edge PE1 that is in contact with a horizontal surface of the dielectric material portion (such as a stepped dielectric material portion 65) and having a first distal edge DE1 that is spaced from the dielectric material portion (such as the stepped dielectric material portion 65) by a vertical thickness of the first horizontally-extending portion 1621, a second horizontally-extending portion 1622 that is located over a second side of the source layer 110, and a connecting portion 1623 that connects the first horizontally-extending portion 1621 and the second horizontally-extending portion 1622 and comprises a second inner sidewall 162W2 having a second distal edge DE2 that is adjoined to a distal horizontal surface of the second horizontally-extending portion 1622; and a backside connection pad structure 164 comprising a proximal portion contacting end surfaces of the connection via structures 84, a distal portion located over with the second horizontally-extending portion 1622 of the backside isolation layer 162, and a connecting portion that connects the proximal portion and the distal portion, wherein a lateral distance between an inner sidewall and an outer sidewall of the connecting portion of backside connection pad structure 164 within a first horizontal plane containing the second distal edge DE2 is greater than a lateral distance between the first distal edge DE1 and the second distal edge DE2 of the backside isolation layer 162.

In one embodiment, the alternating stack (32, 46), the three-dimensional array of memory elements, the connection via structures 84, the backside isolation layer 162, and the backside connection pad structure 164 are provided in a memory die 900 which further comprises memory-side bonding pads 988; the three-dimensional memory device further comprises a logic die 700 that comprises logic-side bonding pads 788 and a peripheral circuit 720 configured to control operation of the three-dimensional array of memory elements and the logic-side bonding pads 788 are bonded to the memory-side bonding pads 988.

In one embodiment, the memory device comprises backside dielectric layers (107, 108) located over the second side of the source layer 110, wherein: a proximal horizontal surface of the second horizontally-extending portion 1622 of the backside isolation layer 162 contacts a distal horizontal surface of the backside dielectric layers (107, 108); and an outer sidewall of the connecting portion 1623 of the backside isolation layer 162 contacts sidewalls of the backside dielectric layers (107, 108). In one embodiment, the memory device comprises a source connection pad structure 168 vertically extending through the backside dielectric layers (107, 108) and the backside isolation layer 162 and contacting a horizontal surface of the source layer 110 and having a same material composition as the backside connection pad structure 164.

In one embodiment shown in FIGS. 22B and 22C, the first horizontally-extending portion 1621 of the backside isolation layer 162 comprises a moat-shaped opening 151 laterally surrounding a backside isolation plate 162P located in a center region of the backside connection pad cavity 167 and contacting a horizontal surface of the dielectric material portion 65. In one embodiment shown in FIGS. 24B and 24C, first regions 164S1 of the proximal portion of the backside connection pad structure 164 which contact the end surfaces of the connection via structures 84 are located within first strip regions S1 of the moat-shaped opening 151; and dummy second regions 164S2 of the proximal portion of the backside connection pad structure 164 which do not contact the end surfaces of the connection via structures 84 are located within second strip regions S1 of the moat-shaped opening 151. The backside connection pad structure 164 contacts an entirety of a distal horizontal surface of the backside isolation plate 162P and laterally surrounds and encloses the backside isolation plate 162P, such that the backside isolation plate 162P is laterally spaced from the backside isolation layer 162 by the backside connection pad structure 164.

In another embodiment shown in FIGS. 24D and 24E, the first horizontally-extending portion 1621 of the backside isolation layer 162 comprises a first-type opening 151 laterally surrounding a first region 164F of the proximal portion of the backside connection pad structure 164; and a second-type opening 152 laterally surrounding a dummy second region 164D of the proximal portion of the backside connection pad structure 164, wherein an entirety of a horizontal surface of the dummy second region 164D located within an area of the second-type opening 152 is in contact with a surface segment of the dielectric material portion (such as a stepped dielectric material portion 65). In this embodiment, the first horizontally-extending portion 1621 of the backside isolation layer 162 also comprises: at least one additional first-type opening 151 laterally surrounding a respective additional first region of the proximal portion of the backside connection pad structure 164, the respective additional first region contacting respective end surfaces of the additional connection via structures 84 embedded in the dielectric material portion (such as a stepped dielectric material portion 65); at least one additional second-type opening 152 laterally surrounding a respective additional dummy second region of the proximal portion of the backside connection pad structure 164, wherein an entirety of a horizontal surface of the respective additional second region located within an area of a respective one of the at least one additional second-type opening 152 is in contact with a respective additional surface segment of the dielectric material portion (such as a stepped dielectric material portion 65).

In one embodiment, the memory device comprises: at least one passivation dielectric layer (172, 174, 176) contacting a first segment of a distal surface of the backside connection pad structure 164 and contacting a distal surface of the backside isolation layer 162; and a backside contact pad vertically extending through the at least one passivation dielectric layer (172, 174, 176) and contacting a second segment of the distal surface of the backside connection pad structure 164. In one embodiment, a proximal portion of the backside connection pad structure 164 that is contacted by the backside contact pad is vertically spaced from the dielectric material portion (such as a stepped dielectric material portion 65) by a horizontally-extending portion of the backside isolation layer 162, or by a backside isolation plate 162P having a same material composition and a same thickness as the second horizontally-extending portion 1622 of the backside isolation layer 162 and is laterally spaced from the backside isolation layer 162 by s ring-shaped region of the backside connection pad structure 164 that contacts the dielectric material portion (such as a stepped dielectric material portion 65) and laterally surrounds the backside isolation plate 162P.

In one embodiment, the connecting portion of the backside connection pad structure 164 comprises a first inner sidewall segment 164W1 adjoined to the proximal portion of the backside connection pad structure and a second inner sidewall segment 164W2 adjoined to the distal portion of the backside connection pad structure. The first inner sidewall segment 164W1 has first taper angle a1 with respect to a vertical direction; and the second inner sidewall segment 164W2 has a second taper angle a2 with respect to the vertical direction that is smaller than the first taper angle a1.

In the second embodiment, the connecting portion 1623 of the backside isolation layer 162 comprises a stepped inner sidewall comprising plurality of horizontally-extending surface segments and a plurality of vertically-extending surface segments; and the connecting portion of the backside connection pad structure 164 comprises a stepped outer sidewall comprising plurality of horizontally-extending surface segments and a plurality of vertically-extending surface segments.

The various embodiments of the present disclosure provide configurations that reduces mechanical stress generated by the backside connection pad structures 164, which reduces voids and/or cracks in the passivation dielectric layers (172, 174, 176). The configurations and the geometry of the backside isolation layer 162 reduce mechanical stress around peripheral regions of the backside connection pad structures 164 through use of a greater second lateral dimension LD2 than the first lateral dimension LD1, and/or through formation of a first inner sidewall segment 164W1 having a greater taper angle relative to a second inner sidewall segment 164W2, and/or through use of second-type openings 152 or strip regions S2 of the moat-shaped openings which contain the respective dummy portions 164D or 164S2 of the backside connection pad structures 164.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A memory device, comprising:

an alternating stack of insulating layers and electrically conductive layers located over a first side of a source layer;

a three-dimensional array of memory elements embedded in the alternating stack;

a dielectric material portion located over the first side of the source layer adjacent to the alternating stack;

connection via structures vertically extending through the dielectric material portion;

a backside connection pad cavity vertically extending through the source layer;

a backside isolation layer comprising a first horizontally-extending portion located within the backside connection pad cavity, a second horizontally-extending portion, and a connecting portion that connects the first horizontally-extending portion and the second horizontally-extending portion; and a backside connection pad structure comprising first regions which are located in a first opening in the backside isolation layer and which contact the end surfaces of the connection via structures, and dummy second regions which only contact the dielectric material portion and which do not contact the end surfaces of the connection via structures.

2. The memory device of claim 1, wherein:

the alternating stack, the three-dimensional array of memory elements, the connection via structures, the backside isolation layer, and the backside connection pad structure are provided in a memory die which further comprises memory-side bonding pads;

the three-dimensional memory device further comprises a logic die that comprises logic-side bonding pads and a peripheral circuit configured to control operation of the three-dimensional array of memory elements; and the logic-side bonding pads are bonded to the memory-side bonding pads.

3. The memory device of claim 1, further comprising backside dielectric layers located over the second side of the source layer, wherein:

a proximal horizontal surface of the second horizontally-extending portion of the backside isolation layer contacts a distal horizontal surface of the backside dielectric layers; and an outer sidewall of the connecting portion of the backside isolation layer contacts sidewalls of the backside dielectric layers.

4. The memory device of claim 3, further comprising a source connection pad structure vertically extending through the backside dielectric layers and the backside isolation layer and contacting a horizontal surface of the source layer and having a same material composition as the backside connection pad structure.

5. The memory device of claim 1, wherein the first horizontally-extending portion of the backside isolation layer comprises a moat-shaped opening laterally surrounding a backside isolation plate located in a center region of the backside connection pad cavity and contacting a horizontal surface of the dielectric material portion.

6. The memory device of claim 5, wherein:

the first regions of the proximal portion of the backside connection pad structure are located within first strip regions of the moat-shaped opening; and the dummy second regions of the proximal portion of the backside connection pad structure are located within second strip regions of the moat-shaped opening.

7. The memory device of claim 5, wherein the backside connection pad structure contacts an entirety of a distal horizontal surface of the backside isolation plate and laterally surrounds and encloses the backside isolation plate, such that the backside isolation plate is laterally spaced from the backside isolation layer by the backside connection pad structure.

8. The memory device of claim 1, wherein the first horizontally-extending portion of the backside isolation layer comprises:

a first-type openings laterally surrounding the first regions of the proximal portion of the backside connection pad structure; and a second-type openings laterally surrounding the dummy second regions of the proximal portion of the backside connection pad structure.

9. The memory device of claim 8, wherein an entirety of horizontal surfaces of the dummy second regions are in contact with a surface segment of the dielectric material portion.

10. The memory device of claim 1, further comprising:

at least one passivation dielectric layer contacting a first segment of a distal surface of the backside connection pad structure and contacting a distal surface of the backside isolation layer; and a backside contact pad vertically extending through the at least one passivation dielectric layer and contacting a second segment of the distal surface of the backside connection pad structure.

11. The memory device of claim 10, wherein a proximal portion of the backside connection pad structure that is contacted by the backside contact pad is vertically spaced from the dielectric material portion by a horizontally-extending portion of the backside isolation layer.

12. The memory device of claim 10, wherein a proximal portion of the backside connection pad structure that is contacted by the backside contact pad is vertically spaced from the dielectric material portion by a backside isolation plate having a same material composition and a same thickness as the second horizontally-extending portion of the backside isolation layer and that is laterally spaced from the backside isolation layer by the first regions and the dummy second regions of the backside connection pad structure.

13. The memory device of claim 1, wherein:

the first horizontally-extending portion of the backside isolation layer comprises a first inner sidewall having a first proximal edge that is in contact with a horizontal surface of the dielectric material portion and having a first distal edge that is spaced from the dielectric material portion by a vertical thickness of the first horizontally-extending portion;

the second horizontally-extending portion of the backside isolation layer is located over a second side of the source layer;

the connecting portion of the backside isolation layer comprises a second inner sidewall having a second distal edge that is adjoined to a distal horizontal surface of the second horizontally-extending portion; and the backside connection pad structure comprises a proximal portion comprising the first regions and the dummy second regions located in the backside connection pad cavity, a distal portion located over the second horizontally-extending portion of the backside isolation layer, and a connecting portion that connects the proximal portion and the distal portion; and a lateral distance between an inner sidewall and an outer sidewall of the connecting portion of the backside connection pad structure within a first horizontal plane containing the second distal edge is greater than a lateral distance between the first distal edge and the second distal edge of the backside isolation layer.

14. The memory device of claim 13, wherein:

the connecting portion of the backside connection pad structure comprises a first inner sidewall segment adjoined to the proximal portion of the backside connection pad structure and a second inner sidewall segment adjoined to the distal portion of the backside connection pad structure;

the first inner sidewall segment has first taper angle a1 with respect to a vertical direction; and the second inner sidewall segment has a second taper angle a2 with respect to the vertical direction that is smaller than the first taper angle a1.

* * * * *